United States Patent [19]
Asai et al.

[11] Patent Number: 5,926,950
[45] Date of Patent: Jul. 27, 1999

[54] ELECTRONIC COMPONENT TRANSFERRING DEVICE AND METHOD, AND ELECTRONIC COMPONENT MOUNTING SYSTEM AND METHOD

[75] Inventors: Koichi Asai, Nagoya; Sinsuke Suhara, Kariya, both of Japan

[73] Assignee: Fuji Machine Mfg. Co., Ltd., Chiryu, Japan

[21] Appl. No.: 08/769,700

[22] Filed: Dec. 18, 1996

[30] Foreign Application Priority Data

Dec. 28, 1995 [JP] Japan ................................ 7-342430

[51] Int. Cl.$^6$ .............................................. H05K 3/30
[52] U.S. Cl. .............................. 29/832; 29/740; 29/741; 29/743; 29/DIG. 44; 29/834; 29/836; 294/64.1; 414/752
[58] Field of Search ............................ 29/740, 741, 743, 29/DIG. 44, 832, 834, 836; 324/158 R; 294/2, 64.1; 414/737, 752

[56] References Cited

U.S. PATENT DOCUMENTS

| | | | |
|---|---|---|---|
| 4,933,634 | 6/1990 | Cuzin et al. | 324/158 R |
| 5,287,616 | 2/1994 | Suzuki et al. | 29/740 |
| 5,539,977 | 7/1996 | Kano et al. | 29/740 X |
| 5,692,293 | 12/1997 | Igarashi et al. | 29/743 X |

FOREIGN PATENT DOCUMENTS

| | | |
|---|---|---|
| A-6-45787 | 2/1994 | Japan. |
| A-6-77693 | 3/1994 | Japan. |

*Primary Examiner*—Peter Vo
*Assistant Examiner*—Rick Kiltae Chang
*Attorney, Agent, or Firm*—Oliff & Berridge PLC

[57] ABSTRACT

An electronic component transferring device for transferring electronic components, including a plurality of rotary members rotatable about a common axis independently of each other, a rotary motion generating device for generating rotary motions of the rotary members about the common axis over a full 360° angular range such that each rotary member is stopped at each predetermined stop position during one full rotation thereof and such that the rotary members are stopped at each stop position at different times, and a plurality of component holder heads which are carried by the rotary members, respectively, and which hold the respective electronic components. The apparatus may be suitably used in an electronic component mounting system. Also disclosed are a method of transferring the electronic components and a method of mounting the electronic components.

52 Claims, 31 Drawing Sheets

APPARATUS ACCORDING TO THE EMBODIMENT

DIMENSIONLESS DISPLACEMENT

CONVENTIONAL APPARATUS

DIMENSIONLESS VELOCITY

DIMENSIONLESS ACCELERATION

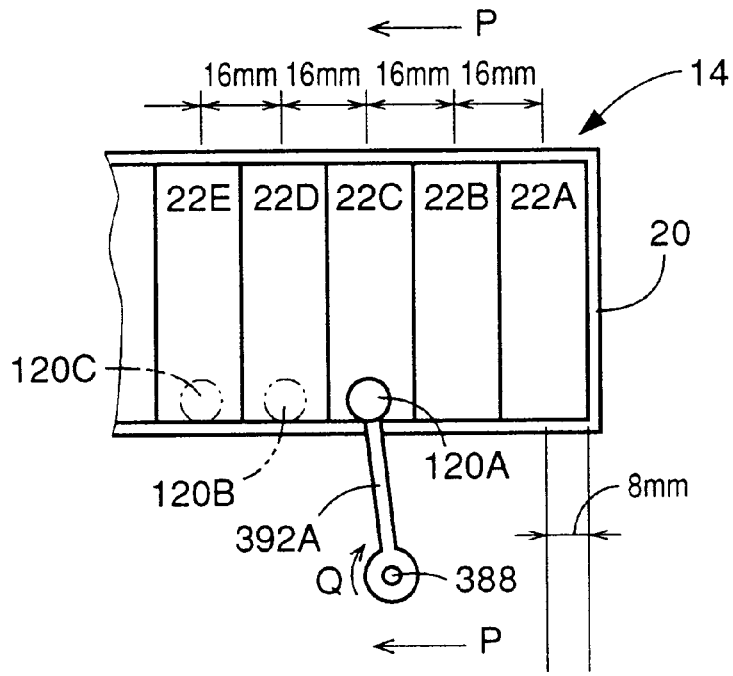
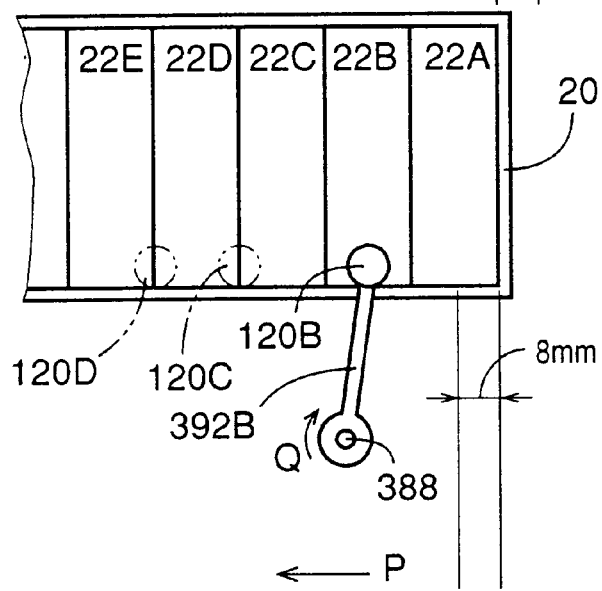
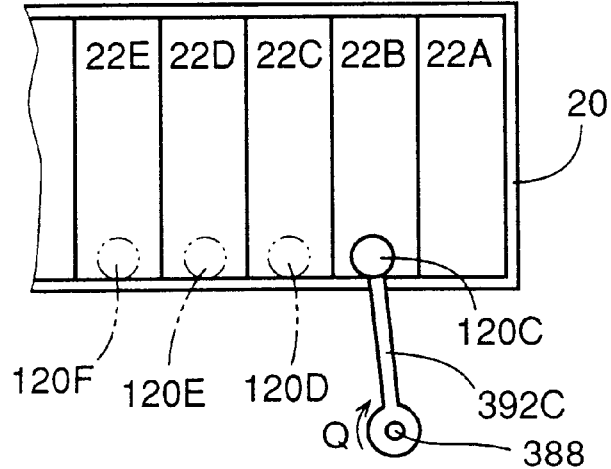

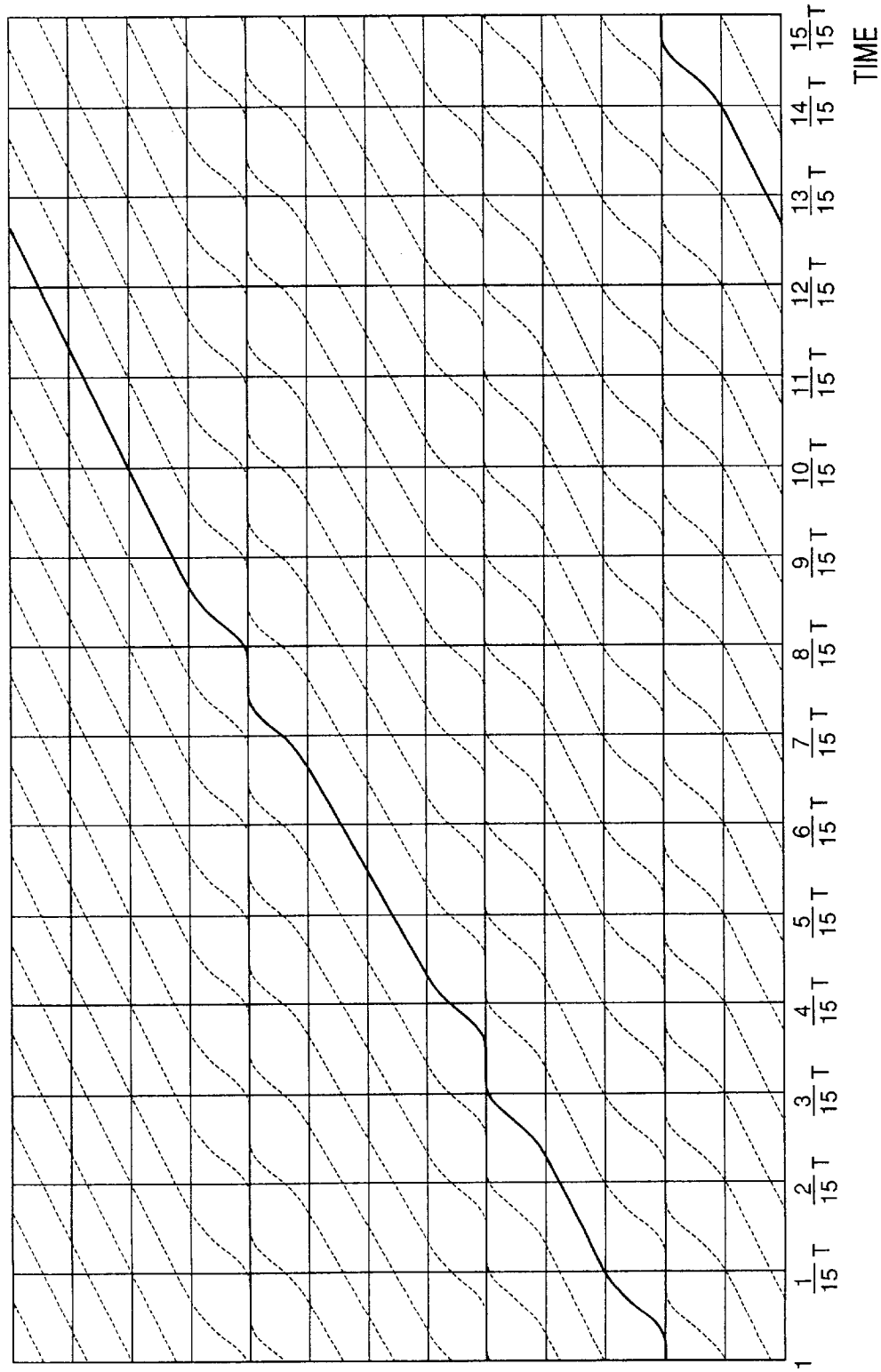

ELECTRONIC COMPONENT TRANSFERRING DEVICE AND METHOD, AND ELECTRONIC COMPONENT MOUNTING SYSTEM AND METHOD

This application is based on Japanese Patent Application No. 7-342430 filed Dec. 28, 1995, the content of which is incorporated hereinto by reference.

CROSS REFERENCE TO RELATED APPLICATIONS

Not Applicable

BACKGROUND OF THE INVENTION

1. Field of the Invention

The present invention relates to a device for successively transferring or conveying electronic components one after another, and a system which is equipped with such an electronic component transferring device and adapted to mount the electronic components one at a time on a workpiece such as a printed-circuit board.

2. Discussion of the Related Art

A device for successively transferring electronic components one after another is required, for example, in an electronic component mounting system adapted to mount the electronic components on a printed-circuit board (PC board) or other workpieces. As one type of such an electronic component transferring device, there is known a device using a rotary table which carries a plurality of component holder heads such that the heads are evenly spaced from each other at a predetermined angular interval, which corresponds to an angular pitch of intermittent rotation of the rotary table. As the rotary table is intermittently rotated, the electronic component held by each component holder head is transferred. When the rotary table is stopped, one of the heads which is located at a component receiving position receives an electronic component from a suitable component supply device, while another head placed in a component transfer position transfers an electronic component to a suitable component receiving device.

However, the known electronic component transferring device of the type described above suffers from a problem that the component holder heads are unnecessarily stopped at some angular positions, leading to a low operating efficiency of the device. Described in detail, all of the component holder heads are moved and stopped together during intermittent rotation of the rotary table. Actually, each component holder head is required to be stopped at only two angular positions, namely, at the component receiving position and the component transfer position, but the head has to be stopped at each of the predetermined angular positions which are spaced from each other at the angular spacing pitch of the component holder heads. It is also noted that a drive device for rotating the rotary table should accelerate and decelerate a relatively large initial mass consisting of the rotary table and the plurality of component holder heads carried by the rotary table. Accordingly, the drive device should have a comparatively large capacity, and tends to be expensive. Further, the device is likely to generate undesirable noises and vibrations due to acceleration and deceleration of a relatively large inertial mass as described above.

The number of the component holder heads carried by the rotary table may be made equal to the number of the stop positions at which each head is to be stopped. This arrangement is free from unnecessary stopping of the component holder heads. This arrangement, however, results in an increase in the rotary movement pitch of the component holder heads, leading to another problem that the time required for one rotary movement of each head is undesirably increased. In this respect, it is noted that the diameter of a circle described by each component holder head during rotation of the rotary table should be larger than a given lower limit, to permit the electronic component transferring device to have required size and space and achieve the intended purpose of transferring the electronic components. Consequently, a decrease in the number of the stop positions of the component holder heads inevitably results in an increase in the pitch of the rotary movement of the rotary table.

In the light of the above drawback, there are proposed improved electronic component transferring devices as disclosed in JP-A-6-77693 (published Mar. 18, 1994) and JP-A-6-45787 (published Feb. 18, 1994). In these improved devices, a plurality of component holder heads are carried by a rotary table such that the heads are evenly spaced from each other at a predetermined angular interval, as in the known device described above. Unlike the conventional device, however, the improved devices are adapted such that the rotary table is continuously rotated at a given speed, while the heads that are required to be stopped at the desired positions such as the component receiving and transfer positions are rotated about the axis of the rotary table in the direction opposite to the direction of rotation of the rotary table, at the same speed as the rotating speed of the rotary table, so that these heads are virtually stopped at the desired stop positions.

In the arrangement described above, only the component holder heads that should be stopped are stopped, while the other heads are kept rotated at a constant speed with the rotary table. Accordingly, the required capacity of the drive device for the rotary table can be reduced, leading to reduced size and cost of the drive device and reduced operating noises and vibrations of the device. In addition, the time required for each component holder head to reach the component receiving and transfer positions can be reduced. In the conventional device, the time required for each intermittent rotary movement of each head corresponding to the angular spacing pitch of the heads consists of a time required for accelerating the head from zero, a time required for decelerating the head to zero, and a time during which the head is held stopped. Therefore, the minimum required total time for each intermittent rotary movement of the head about the axis of the rotary table to the component receiving and transfer positions is inevitably long. In the electronic component transferring devices disclosed in the above-identified publications, on the other hand, each head is moved at the constant speed into an angular pitch region in which the stop position is located, and thereafter the head is decelerated to zero and is held stopped at the stop position, unless the head is required to be stopped at two successive stop positions which are adjacent angular pitch positions of the rotary table. This arrangement provides a time saving for each intermittent rotary movement, which is substantially equal to a sum of a difference between the time required for the rotary movement at a constant speed over a given angular range and the time required for the movement over the same angular range with acceleration to the above-indicated constant speed, and a half of the predetermined stop time. Accordingly, the time required for the head to reach the desired stop position is reduced.

While the rotary table used in the above improved devices has a relatively large mass, the rotary table is rotated at a constant speed, and the component holder heads which are provided on the rotary table and which are accelerated and decelerated for stopping at the desired stop positions have a relatively small mass. Therefore, the operating noises and vibrations are relatively small even when the heads are moved at relatively high acceleration and deceleration values, and the operating efficiency of the device is improved. Further, since the mass to be accelerated and decelerated is comparatively small, the inertial force at given acceleration and deceleration values is comparatively small, and the required capacity of the drive device for rotating the heads about the axis of the rotary table is accordingly small.

However, the electronic component transferring devices disclosed in the above-indicated publications suffer from some problems due to stopping of the component holder heads at the stop positions by rotating the heads about the axis of the rotary table in the direction opposite to the direction of rotation of the rotary table while the rotary table is rotated continuously. That is, the conventional arrangement disclosed in the publications suffers from difficulty to completely stop the heads at the stop positions, and difficulty to improve the accuracy of positioning of the heads at the stop positions. That is, the heads cannot be completely stopped unless the rotating speed of the heads is exactly the same as that of the rotary table. To assure high accuracy of positioning of the heads at the stop positions, it is required to accurately control the point of time at which the speed of the rotation of the head relative to the rotary table in the reverse direction has been raised to a constant level after initiation of this rotary movement of the head. However, it is difficult to accurately control this timing.

Further, suitable devices should be provided between the rotary table and the individual component holder heads, for rotating the heads about the axis of the rotary table. Since these devices are required to accurately stop the heads at the desired stop positions, the cost of manufacture of these devices is inevitably increased.

SUMMARY OF THE INVENTION

It is therefore a first object of the present invention to provide an electronic component transferring device which provides an improvement in the accuracy of stopping of the component holder heads at the desired stop position or positions and which is economical to manufacture, while enjoying the advantage of the conventional device disclosed in the above-indicated publications.

It is a second object of the invention to provide an electronic component mounting system equipped with such an electronic component transferring device.

It is a third object of the invention to provide a method of transferring electronic components, which permits improved accuracy of positioning of the electronic components at the desired stop position or positions.

It is a fourth object of the invention to provide a method of mounting electronic components, which permits improved accuracy of positioning of the electronic components at the desired stop positions including a position at which the electronic components are mounted.

The first object indicated above may be achieved according to any one of the following forms, embodiments or modes of the present invention (hereinafter referred to as "forms of the invention"):

(1) An electronic component transferring device for transferring electronic components, comprising: (a) a plurality of rotary members rotatable about a common axis independently of each other; (b) a rotary motion generating device for generating rotary motions of the rotary members about the common axis over a full 360° angular range such that each of the rotary members is stopped at each of at least one predetermined stop position during one full rotation thereof over the full 360° angular range and such that the rotary members sequentially reach each stop position at a predetermined time interval; and (c) a plurality of component holder heads which are carried by the rotary members, respectively, and which hold the respective electronic components.

In the electronic component transferring device constructed as described above according to the form (1) of this invention, the rotary members which are rotatable about the common axis are rotated independently of each other by the rotary motion generating device. Since the component holder heads are carried by the respective rotary members, the heads are rotated about the common axis independently of each other. In the present arrangement, some of the heads can be continuously rotated while the other heads are held stopped, and the required capacity of the rotary motion generating device can be made comparatively small, like the drive device for rotating the rotary table used in the conventional electronic component transferring devices disclosed in the above-identified publications. Accordingly, the cost of manufacture and the operating noise and vibration of the present electronic component transferring device are reduced, and the time interval at which the rotary members sequentially reach each predetermined stop position can be shortened.

To stop a certain component holder head at a certain stop position, the rotary motion of the corresponding rotary member is stopped by the rotary motion generating device. This arrangement permits more complete stopping of the head, and easier improvement in the positioning accuracy of the head at each stop position, than the conventional electronic transferring devices disclosed in the above-identified publications. Further, the present device does not require a rotary table, and a device disposed between the rotary table and each of the component holder heads for moving the component holder head, as provided in the conventional devices. Accordingly, the present device is further simplified in construction, and the cost of manufacture of the device is further reduced.

The present electronic component transferring device may be adapted to transfer the electronic components from a transfer start position to a transfer end position, along a circular arc having a center at the common axis of rotation of the rotary members. In this case, the transfer end position is different from the transfer start position. Alternatively, the present device may be adapted to transfer the electronic components from the transfer start position back to this transfer start position, with a full rotation about the common axis along a circle having a center at the common axis. In the latter case, the transfer start position is the transfer end position. For instance, the present device may be arranged to receive the electronic components from a component holder device, transfer the received components to a working device disposed in a transfer path of the components, and return the electronic components back to the position of the component holder device after an operation is performed on the electronic components by the working device. The operation performed by the working device may be an operation to take an image of each electronic component. In this case, the electronic components are rotated one full turn about the common axis. Alternatively, the present electronic component transferring device may be used as an electronic component transferring and mounting apparatus in an electronic component mounting system, such that the transferring and mounting apparatus is moved by a suitable feeding device between a component supply position adjacent to a component supply position and a component mounting position adjacent to a board supporting and positioning device adapted to support and position a printed-circuit board. In this case, the transferring and mounting apparatus is first located at the component supply position, and the rotary members are sequentially moved to a predetermined component receiving position so that the component holder heads receive the electronic components from the component supply device. Then, the transferring and mounting apparatus is moved by the feeding device to the component mounting position, and the rotary members are sequentially moved to the above-indicated component receiving position so that the electronic component held by the component holder head at the component receiving position is transferred to the printed-circuit board. In this arrangement, the electronic components are transferred from the component holder heads to the printed-circuit board when the rotary members are located at the component receiving position. Namely, the position of the rotary members at which the heads transfer the electronic components to the printed-circuit board is the same as the position at which the heads receive the electronic components from the component supply device. Therefore, where the heads are vertically moved up and down to receive and transfer the electronic components, only one device for vertically moving the heads is required, whereby the cost of manufacture of the apparatus is reduced.

The common axis of rotation of the rotary members may extend in the vertical direction, as described below, or may be inclined by a desired angle with respect to the vertical direction. In the latter case, rotary motions of the rotary members about the inclined common axis result in vertical movements of the component holder heads. Where the present electronic component transferring device is used as part of an electronic component mounting system in which the plane of the component supply device and the component mounting surface of the printed-circuit board are inclined, the inclination of the common axis permits the components holder heads to be moved perpendicularly to the plane of the component supply device and the component mounting surface of the board, upon receiving and mounting of the electronic components.

The component holder heads may be adapted to pick up the electronic components by vacuum suction, or hold the electronic components by a suitable gripper having a plurality of gripper jaws which are movable toward and away from each other.

(2) An electronic component transferring device according to the form (1) of the invention, wherein the rotary motion generating device includes: a plurality of cam followers provided on the plurality of rotary members, respectively; and a rotary motion generating cam device which sequentially engages the plurality of cam followers to thereby move the cam followers and rotate the rotary members about the common axis.

In the form (2) of the invention, the rotary motion generating device uses a cam mechanism including cam followers provided for the respective rotary members, and a rotary motion generating cam device which sequentially engages the cam followers. As is apparent from the following description of the other forms of the present invention, the use of the cam mechanism simplifies the construction of the present electronic component transferring device, and permits complete stopping of the component holder heads at the stop position or positions, with an improved degree of positioning accuracy. By suitably designing the cam device, it is possible to determine the rotating velocity, stop positions and stop time lengths of the rotary members, as desired. Where each rotary member is stopped at two or more stop positions for different lengths of times, the acceleration and deceleration of the rotary member before and after the relatively short stop can be reduced so that the vibration of the rotary member is accordingly reduced.

(3) An electronic component transferring device according to the form (1) of the invention, wherein the rotary motion generating device includes: a plurality of cam followers provided on the plurality of rotary members, respectively; a rotary motion generating cam device which sequentially engages the plurality of cam followers to thereby move the cam followers and rotate the rotary members about the common axis; a constant-velocity rotor rotated at a constant velocity about the common axis; and an engaging device including an engaging member which is provided on one of the constant-velocity rotor and each rotary member and which is engageable with the other of the constant-velocity rotor and each rotary member.

The above electronic component transferring device according to the form (3) of the invention includes the cam followers and rotary motion generating cam device as provided according to the form (2) of the invention, and in addition, a constant-velocity rotor rotated at a predetermined constant velocity about the common axis, and an engaging device including an engaging member which is provided on one of the rotor and each rotary member and which is engageable with the other of the rotor and rotary member.

For instance, the cam mechanism including the rotary motion generating cam device and cam followers as provided according to the form (2) of the invention is used in a portion of the rotary movement of each rotary member in which the rotary member is decelerated, stopped and accelerated. In another portion of the rotary movement in which the rotary member is rotated at a predetermined constant velocity, the constant-velocity rotor and the engaging device are used to generate a simple constant-velocity rotary motion of the rotary member. Therefore, the present electronic component transferring device according to the form (3) of the invention may be simplified in construction, while enjoying the advantage of the form (2) of the invention.

(4) An electronic component transferring device according to the form (2) or (3) of the invention, wherein the above-indicated at least one predetermined stop position consists of a plurality of predetermined stop positions, and the rotary motion generating device further includes a single drive source, the rotary motion generating cam device including at least one rotary cam rotated by the single drive source, the above-indicated at least one rotary cam being formed such that the rotary members corresponding to the plurality of predetermined stop positions are stopped at the predetermined stop positions at different times.

In the present form (4) of the invention, the rotary motion generating cam device includes at least one rotary cam rotated by a single drive source. Each rotary cam is formed or shaped such that the rotary members corresponding to the two or more stop positions are stopped at these stop positions at different times.

The rotary motion generating cam device may includes two or more rotary cams which includes at least two rotary cams which are adapted to stop each rotary member at respective two stop positions. The rotary cams may be formed such that two or more rotary members simultaneously engage the same rotary cam, while each rotary member is stopped by the respective different rotary cams at the different stop positions. In either case, the rotary cams are formed so that the two or more rotary members engaging the different rotary cams are stopped at the corresponding stop positions at different times. In this arrangement, the deceleration and acceleration of the rotary members by the respective rotary cams before and after the stopping do not occur simultaneously, whereby the total load torque of the drive source is not simply equal to a sum of the load torque values of the rotary members engaging the respective rotary cams. Accordingly, the present arrangement is effective to reduce a variation in the actual pattern of change in the rotating velocity of the rotary members from the nominal pattern, and reduce the vibration of the rotary members, making it possible to prevent deterioration of the rotating behavior of the rotary members and reduction in the accuracy of positioning of the rotary members at the stop positions, which would take place if the rotary cams were formed such that the deceleration and acceleration of the rotary members occur simultaneously.

Where working devices are provided corresponding to the predetermined stop positions, to perform respective operations on the electronic components, these operations may often take place simultaneously if the rotary plates corresponding to the stop positions are stopped at the same time. Where the working devices are operated by the rotary cams which are operated by the same drive source, it is desirable to avoid simultaneous increases of the load torque values of the rotary cams. In the present form (4) of the invention, the points of time at which the rotary plates reach the different stop positions differ from each other, so that the operations of the different working devices are performed at different times. This arrangement contributes to reduction in the vibration and noise of the electronic component transferring device. This advantage is important particularly where the same drive source is used for rotating the rotary cams and the working operations for the purpose of improving the accuracy of synchronization of the rotary movements of the rotary cams and the operations by the working devices.

The rotary cam may have a cam groove or a cam projection, and the cam follower may have a roller or other rotary member for rolling engagement with a cam groove, or a pair of rollers or other pair of rotary members which roll on the opposite surfaces of the cam projection.

(5) An electronic component transferring device according to the form (4) of the invention, wherein the above-indicated at least one rotary cam is formed so as to cause a time difference of the different times, which difference at least partially offset positive and negative values of a load torque which acts on each of the above-indicated at least one rotary cam due to deceleration and acceleration of the rotary members before and after each of the predetermined stop positions.

In the electronic component transferring device according to the form (5) of the invention, the positive and negative values of the load torque due to the deceleration and acceleration of the rotary members before and after the stopping thereof at each stop position are at least partially offset by each other, so that a variation in the load torque of the drive source is reduced, and the deterioration of the rotating behavior and vibration of the rotary cam are reduced, whereby the rotating behavior of the rotary cam and the accuracy of positioning of the rotary members are accordingly improved. In addition, the variation in the load torque of the drive source can be reduced by simply forming the rotary cam or cams so as to stop the rotary members to stop at the stop positions at different points of time. This arrangement does not require an exclusive device for smoothing the load torque of the drive device, making it possible to economically avoid the load torque variation of the drive device, while avoiding an increase in the size of the electronic component transferring device and an increase in the secondary moment of inertia of the input shaft of the rotary cam.

It is noted that the torque variation is reduced by an overall initial force caused by the acceleration and deceleration of a group of rotary members simultaneously engaging the rotary cam, which acceleration and deceleration take place before and after the stop position corresponding to the rotary cam. Therefore, the reduction in the torque variation of the group of rotary members is not influenced by a variation in the angular velocity of the input shaft of the rotary cam Further, each rotary member is stopped at two or more stop positions, but the number of the stop positions is generally smaller than the number of the rotary members. In this case, all of the rotary members are not stopped at the same time. Therefore, even if the rotary members are not stopped stopped at different times, the torque variation of the drive device due to simultaneous increase or decrease of the load torque due to the acceleration and deceleration of the rotary members before and after the stopping at the stop position is smaller, than where all the rotary members are stopped simultaneously. However, the stopping of the rotary members at different points of time at the different stop positions results in further reduction of the torque variation of the drive torque, reduction of the vibration of the device, and reduction of the required electric energy consumption by the drive device.

(6) An electronic component transferring device according to any one of the forms (2)–(5) of the invention, wherein the rotary motion generating cam device includes at least one concave globoidal cam each having an outer circumferential surface which is defined by a locus which is described by a circular arc having a center at the common axis when the circular arc is rotated about an axis which is perpendicular to the common axis and which is positioned relative to the circular arc and the common axis such that the circular arc is interposed between the axis and the common axis.

The concave globoidal cam described above has an outer circumferential surface whose cross sectional shape in a plane including the axis of rotation of the cam is a circular arc having a center at the common axis of rotation of the rotary members. For instance, the concave globoidal cam has a suitable cam groove or rib or projection formed in the outer circumferential surface. When the cam is rotated about its axis, a cam follower for each rotary member is held in engagement with the cam groove or projection during rotation of the concave globoidal cam, whereby the rotary motion of the rotary cam is generated and controlled by the engagement of the cam follower with the cam groove or projection.

(7) An electronic component transferring device according to the form (6) of the invention, wherein the above-indicated at least one concave globoidal cam consists of at least two concave globoidal cams which are disposed around the common axis such that lines of intersection of the outer circumferential surfaces of the above-indicated at least two concave globoidal cams with a plane including axes of the above-indicated at least two globoidal cams and perpendicular to the common axis cooperate to define a substantially continuous circular arc which has a center at the common axis, the above-indicated at least two concave globoidal cams having respective cam grooves formed in the outer circumferential surfaces such that the cam grooves are connected to each other, each of the cam grooves having opposite side surfaces, the rotary motion generating cam device including preventing means for preventing the cam followers from being placed in a released state at each joint of the cam grooves, in which released state the cam followers are not interposed between the two side surfaces of the cam grooves.

The cam grooves of the adjacent concave globoidal cams are connected to each other so as to form a substantially continuous cam groove. However, there exists a small amount of gap at a joint of the cam grooves of the two cams. When the cam follower passes the joint, the cam follower may be placed in a released state in which the cam follower is not interposed between two opposite side surfaces of the cam grooves. Thus, a small portion of the cam follower may be caught in the gap, and may tend to abut on the edge at the open end of the cam groove of the downstream one of the adjacent concave globoidal cams, causing a shock or vibration of the cams. Where the end portions of the the cam grooves are inclined and have a lead angle with respect to the axis of rotation, one of the opposite walls defining the inclined end portions of the cam grooves has a relatively small thickness and an accordingly low degree of strength, and is generally removed by cutting during manufacture of the cam. In this case, the cam follower is kept in the released state for a relatively long time, and has a high possibility of shock or vibration being generated when the cam follower is moved from one of the connected cam grooves to the other cam groove. In the present electronic component transferring device according to the form (7) of the invention, suitable means is provided for preventing the cam follower from being placed in the released state at the joint of the adjacent cam grooves. Namely, this preventing means permits the cam follower to be interposed between the side surfaces of the cam grooves when the cam follower is moved past the joint of the adjacent cam grooves. In other words, the preventing means is adapted to effect smooth transition of the cam follower from one of the adjacent cam grooves into the other groove, without a partial contact of the cam follower with the end face of the downstream cam, and without any shock or vibration.

(8) An electronic component transferring device according to the form (7) of the invention, wherein each of the cam grooves has a wide portion and a narrow portion which is formed in a bottom surface of the wide portion and which has a smaller width, each of the cam followers including a large-diameter roller and a small-diameter roller which engage the wide and narrow portions of the cam groove corresponding to each cam follower, the large-diameter and small-diameter rollers being rotatable coaxially with and independently of each other, the preventing means comprising the wide and narrow portions of each cam groove, and the large-diameter and small-diameter rollers of each cam follower.

As indicated above, the end portions of the cam grooves are generally inclined portions which have a lead angle with respect to the axes of rotation of the cams and which are inclined relative to the axes of rotation. A straight line connecting the points of contact of the large-diameter and small-diameter rollers with the side surfaces of the wide and narrow portions of the cam grooves is inclined with respect to a straight line connecting the points at which the wide and narrow portions are open on the end faces of the concave globoidal cams. In this arrangement, upon movement of the cam follower from one of the adjacent or connected cam grooves to the other cam groove, the large-diameter roller and the small-diameter roller reach the ends of the wide and narrow portions of the above-indicated other cam groove at different points of time. Described more particularly, the large-diameter roller first reaches the end of the wide portion of the above-indicated other cam groove. At this point of time, the small-diameter roller is still in engagement with the end portion of the narrow portion of the above-indicated one cam groove, so that the small-diameter roller is interposed between the side surfaces of the narrow portion of the above-indicated one cam groove when the large-diameter roller passes the joint of the two cam grooves. When the small-diameter roller reaches the joint, the large-diameter rollers has already been interposed between the side surfaces of the wide portion of the above-indicated other cam groove. Thus, the present arrangement prevents the cam followers from being placed in the released state when the cam follower passes the joint of the adjacent cam grooves. The instant arrangement assures smooth transition of the cam follower from one of the adjacent concave globoidal cams to the other, without a shock or vibration.

In the case where each concave globoidal cam has a cam projection while the cam follower has a pair of rollers engaging the cam projection, an arrangement similar to that described above may be employed. That is, each of these cam follower rollers may consist of a large-diameter roller and a small-diameter roller which are coaxial with each other and rotatable independently of each other, while the cam projection may have a thick wall portion and a thin wall portion. This arrangement is effective to prevent the cam follower to be released from the cam projection upon movement of the cam follower from one of the adjacent cams to the other, permitting smooth transition of the cam follower.

(9) An electronic component transferring device according to any one of the forms (6)–(8) of the invention, wherein the above-indicated at least one concave globoidal cam consists of a plurality of concave globoidal cams which are disposed symmetrically with respect to the common axis such that lines of intersection of the outer circumferential surfaces of the concave globoidal cams with a plane including axes of all of the concave globoidal cams cooperate to define a substantially continuous circle which has a center at the common axis.

In the present form (9) of the invention, the plurality of concave globoidal cams are arranged so that the rotary members are rotated by the cams along a complete circle having a center at the common axis of rotation. In this arrangement, the cam followers are successively moved from one of the adjacent concave globoidal cams to the other, and the rotary members are rotated along the circle by the rotary movements of the cam followers by the cams. The concave globoidal cams are prepared with differently formed cam grooves depending upon the specific number and location of the stop positions to perform different operations required by the user of the present device. When it is required to change the operations to be performed, this requirement can be easily met by changing the appropriate cam or cams. It is noted that the adjacent concave globoidal cam followers are required to be rotated at the same velocity at least when the cam follower is moved from one of the cams to the other. In the other instances, the adjacent cams may be rotated at different velocities, or one of the cams is held stopped while the other cam is held rotated.

(10) An electronic component transferring device according to any one of the forms (6)–(9) of the invention, wherein the above-indicated at least one concave globoidal cam consists of a plurality of concave globoidal cams each having two coaxial bevel gears at axially opposite ends thereof, the bevel gears of adjacent ones of the concave globoidal cams engaging each other.

In the transferring device according the above form (10) of the invention, the bevel gears are provided at the opposite ends of each concave globoidal cam, all of the concave globoidal cams can be rotated simultaneously in precise synchronization with each other, by driving one of the cams. The present arrangement is effective to simplify the construction of the mechanism for driving the concave globoidal cams and reduce the cost of manufacture of the electronic component transferring device.

The bevel gears" may be bevel gears which are formed as integral parts of the cams, or bevel gears which are formed separately from the cams and fixed to the cams so that the cams are rotated with the bevel gears.

(11) An electronic component transferring device according to any one of the forms (1)–(10) of the invention, further comprising: a support shaft coaxial with the common axis; and two arrays of bearings which are disposed on the support shaft such that the two arrays are spaced apart from each other in an axial direction of the support shaft, the bearings of each of the two arrays being arranged in the axial direction and corresponding to the plurality of rotary members, and wherein the rotary members are provided with respective pairs of support arms supported by respective pairs of bearings each consisting of two bearings belonging to the two arrays, respectively, all of the pairs of bearings for the plurality of rotary members having a same distance in the axial direction.

The above arrangement permits each rotary plate to be supported by the same support shaft at two positions which are spaced apart from each other by a sufficient distance in the axial direction of the support shaft. The present arrangement is therefore effective to prevent an inclination of the rotary plate relative to the support shaft, and improve the accuracy of positioning of the corresponding component holder head at each stop position, as compared with an arrangement in which each rotary plate is supported at one axial position of the support shaft.

(12) An electronic component transferring device according to any one of the forms (1)–(11) of the invention, further comprising means for holding the plurality of component holder heads on the plurality of rotary members, respectively, such that the component holder heads are given the same path of movement as the rotary members are rotated about the common axis.

The above arrangement permits all of the component holder heads to have the same movement path during rotation of the rotary members while the individual heads are supported or carried by the respective rotary members.

The second object indicated above may be achieved according to any one of the following forms, embodiments or modes of the present invention:

(13) An electronic component mounting system comprising: (a) an electronic component transferring device according to any one of claims 1–12, wherein each rotary member has at least two stop positions at which each rotary member is stopped during the one full rotation thereof about the common axis; (b) an electronic component supply device disposed at one of the above-indicated at least two stop positions, for supplying the component holder heads with the electronic components; and (c) a workpiece supporting and positioning device disposed at another of the above-indicated at least two stop positions, for supporting and positioning a workpiece on which the electronic components are mounted by the component holder heads.

In the electronic component mounting system according to the above form (13) of the invention, each component holder head is stopped at least at a component receiving position at which the electronic component supply device is disposed, and at a component mounting position at which the workpiece supporting and positioning device is disposed. The head receives the electronic component from the electronic component supply device while the head is stopped at the component receiving position. The head transfers the received electronic component to the component mounting position, and mounts the electronic component on the workpiece supported and positioned by the workpiece supporting and positioning device, while the head is stopped at the component mounting position. Thus, the reception and mounting of the electronic component are effected while the component holder head is stopped at the component receiving and mounting positions, respectively. Further, the electronic component transferring device assures improved accuracy of positioning of the head at those component receiving and mounting positions, as described above. Therefore, the present electronic component mounting system is capable of mounting the electronic components on the workpiece with improved accuracy of positioning of the electronic components. Where it is required to stop the component holder head at another stop position or two or more additional stop position, such as a position for taking an image of the electronic component to detect an error of positioning of the electronic component relative to the component holder head, the rotary motion generating device of the electronic component transferring device is arranged to provide such additional stop positions as needed.

(14) An electronic component mounting system according to the form (13) of the invention, further comprising an image taking device disposed between the electronic component supply device and the workpiece supporting and positioning device, as viewed in a direction of movement of the component holder heads, the image taking device being operated to take an image of each of the electronic components between the electronic component supply device and the workpiece supporting and positioning device.

In the electronic component mounting system according to the form (14) of the invention, an image of the electronic component is taken by the image taking device while the electronic component is transferred by the corresponding head from the electronic component supply device to the component mounting position. The image may be taken while the head and the electronic component are stopped or while they are continuously moved. In the former case, the image can be easily taken. In the latter case, the required number of the stop positions is reduced.

The first or second object may be achieved according to any one of the following forms, embodiments or modes of the present invention:

(15) An electronic component transferring device according to any one of the forms (5)–(12) of the invention, or an electronic component mounting system according to the form (13) or (14) of the invention, wherein the above-indicated at least one rotary cam is formed such that the time difference permits the positive and negative values of the load torque of each rotary cam to be offset to a maximum extent.

(16) An electronic component transferring device according to any one of the forms (5)–(12) and (15) of the invention, or an electronic component mounting system according to any one of the forms (13)–(15) of the invention, wherein the above-indicated at least one rotary cam consists of a plurality of rotary cams rotated by the single drive source, the plurality of rotary cams stopping each of the rotary members to stop at the plurality of predetermined stop positions, respectively, the rotary cams being formed such that the different times at which the rotary members are stopped at the stop positions differ from each other by a predetermined time length which is determined to at least partially offset the positive and negative values of the load torque of the plurality of rotary cams due to the deceleration and acceleration of the rotary members before and after the stop positions.

Where the rotary members are stopped at different stop positions by the different rotary cams driven by the same drive source, the load torque of one of the cams and the load torque of the other cam are at least partially offset by each other, if the rotary members are stopped at the stop positions at different times. This arrangement is effective to reduce a variation in the load torque of the drive source, and assure smooth rotation of the rotary members about the common axis.

(17) An electronic component transferring device according to any one of the forms (7), (9)–(12), (15) and (16) of the invention, or an electronic component mounting system according to any one of the forms (13)–(16) of the invention, wherein each of the cam grooves is a generally V-shaped groove having a trapezoid shape in transverse cross section, and each of the cam followers consists of a tapered roller which is tapered for engagement with the generally V-shaped groove, the preventing means comprising an arrangement that each cam groove is the generally V-shaped groove and an arrangement that each cam follower consists of the tapered roller.

(18) An electronic component transferring device according to any one of the forms (7), (9)–(12), (15) and (16) of the invention, or an electronic component mounting system according to any one of the forms (13)–(16) of the invention, wherein radially outer portions of opposite end faces of each of adjacent concave globoidal cams of the above-indicated at least two concave globoidal cams have tapered surfaces which are parallel and adjacent to each other in a plane including axes of rotation of the adjacent concave globoidal cams, the tapered surfaces having generators in the plane including the axes of rotation, which generators are inclined in the plane including the axes of rotation, at selected points of the generators, with respect to a normal line perpendicular to the common axis about which the rotary members are rotated, the preventing means comprising an arrangement that the generators are inclined with respect to the normal line.

(19) An electronic component transferring device according to any one of the forms (8)–(12), (15) and (16) of the invention, or an electronic component mounting system according to any one of the forms (13)–(16) of the invention, wherein the wide and narrow portions of each cam groove have center lines which are offset from each other by a predetermined distance.

(20) An electronic component transferring device according to any one of the forms (12) and (15)–(19) of the invention, or an electronic component mounting system according to any one of the forms (13)–(19) of the invention, wherein the means for holding the component holder heads on the rotary members, respectively, comprises: means for holding the component holder heads movably relative to the respective rotary members in a direction parallel to the common axis; a stationary cylindrical cam having a cylindrical surface whose circumference has a center at the common axis, the cylindrical surface having a cam groove whose position in the direction parallel to the common axis gradually varies; and a cam follower which is provided for each of the component holder heads and which engages the cam groove.

The stationary cylindrical cam having a cylindrical surface having a cam groove may be replaced by a stationary cylindrical cam having a cylindrical surface having a cam projection. Further, the stationary cylindrical cam may be replaced by an end cam.

(21) An electronic component transferring device according to any one of the forms (12) and (15)–(19) of the invention, or an electronic component mounting system according to any one of the forms (13)–(19) of the invention, wherein the means for holding the component holder heads on the rotary members, respectively, comprises fixing means for fixing the component holder heads to the respective rotary members such that each of the component holder heads and a corresponding one of the rotary members have a predetermined relative position in which each component holder head is rotated about the common axis when the corresponding rotary member is rotated about the common axis.

As is apparent from the following description, the means for holding the component holder heads on the rotary members is not limited to that which is adapted to vertically move the component holder heads as the rotary members are rotated about the common axis. The means for holding the component holder heads may be arranged such that the heads are normally fixed to the rotary members and rotated with the rotary members, at the same height position as the rotary members, and such that the heads are released from the rotary members at the predetermined stop positions such as the component receiving and mounting positions as provided in the electronic component mounting system, so that the heads are vertically moved by a suitable head moving device as described below, in the direction parallel to the common axis. If the electronic component supply device and the workpiece supporting and positioning device of the mounting system are adapted to be vertically moved for the component holder heads to pick up and mount the electronic components, for example, the component holder heads may be permanently fixed to the rotary members.

(22) An electronic component transferring device according to any one of the forms (1)–(12) and (15)–(21) of the invention, or an electronic component mounting system according to the forms (13)–(21) of the invention, further comprising a head moving device for moving the component holder heads carried by the rotary members, relative to the rotary members in a direction parallel to the common axis.

(23) An electronic component transferring device according to any one of the forms (1)–(12) and (15)–22), or an electronic component mounting system according to the forms (13)–(22) of the invention, wherein the common axis extends in a vertical direction, the electronic component transferring device further comprising a height position changing device for changing, in at least two steps, a height of each of the component holder heads at each of at least one of the above-indicated at least one predetermined stop position.

(24) An electronic component transferring device or an electronic component mounting system according to the form (23) of the invention, wherein the height position changing device comprises a stationary cylindrical cam having a cylindrical surface whose circumference has a center at the common axis, and a cam follower which is provided for each of the component holder heads and which engages the stationary cylindrical cam, the cylindrical surface having a cam groove whose position in a direction parallel to the common axis gradually varies, the cam groove having opposite side surfaces defining a width thereof in the direction parallel to the common axis, the cam groove having a narrow portion, a wide portion having a larger width than the narrow portion, and a width varying portion which connect the narrow and wide portions and whose width smoothly varies from a width of the narrow portion to the width of the wide portion, each rotary member being stopped at the above-indicated at least one predetermined stop position when the cam follower is in the wide portion, the height position changing device including height position changing biasing means for biasing the cam follower selectively toward one of the opposite side surfaces of the cam groove.

(25) An electronic component transferring device or an electronic component mounting system according to the form (24) of the invention, wherein the height position changing biasing means comprises an air cylinder having a cylinder housing and a piston rod which is pneumatically movable relative to the cylinder housing between a first position for biasing the cam follower toward the one of the opposite side surfaces of the cam groove, and a second position for biasing the cam follower toward the other of the opposite side surfaces.

(26) An electronic component transferring device or an electronic component mounting system according to the form (24) or (25) of the invention, further comprising a head moving device for moving the component holder heads carried by the rotary members, relative to the rotary members in the direction parallel to the common axis, and wherein at least a part of a portion of the stationary cylindrical cam which defines the wide portion of the cam groove is constituted by a movable portion which is movable in the direction parallel to the common axis relative to the other portion of the stationary cylindrical cam, the head moving device comprising the movable portion, and a device for moving the movable portion in the direction parallel to the common axis.

(27) An electronic component transferring device according to the form (22) of the invention, wherein a portion of the stationary cylindrical cam which corresponds to each of the above-indicated at least one predetermined stop position is constituted by a movable portion which is movable in the direction parallel to the common axis relative to the other portion of the stationary cylindrical cam, the head moving device comprising the movable portion, and a device for moving the movable portion in the direction parallel to the common axis.

(28) An electronic component transferring device according to the form (26) or (27) of the invention, wherein the device for moving the movable portion comprises a stroke changing device for changing a stroke of the movable portion in the direction parallel to the common axis.

(29) An electronic component transferring device according to any one of the forms (1)–(12) and (15)–(28) of the invention, or an electronic component mounting system according to any one of the forms (13)–(28) of the invention, wherein the rotary motion generating device includes a stop position changing device for changing each of at least one of the above-indicated at least one predetermined stop position by selecting one of at least two positions which are spaced from each other in a direction of rotation of the rotary members about the common axis.

(30) An electronic component transferring device or an electronic component mounting system according to the form (29) of the invention, wherein the rotary motion generating device includes at least one concave globoidal cam each having an outer circumferential surface which is defined by a locus which is described by a circular arc having a center at the common axis when the circular arc is rotated about an axis which is perpendicular to the common axis and which is positioned relative to the circular arc and the common axis such that the circular arc is interposed between the axis and the common axis, each of the above-indicated at least one concave globoidal cam having a cam groove formed in the outer circumferential surface, the rotary motion generating device further including a cam follower which engages the cam groove, the cam groove having opposite side surfaces defining a width thereof as measured in a direction of rotation of the rotary members about the common axis, the cam groove having an inclined portion having a lead angle with respect to a plane perpendicular to an axis of each concave globoidal cam, and a non-lead portion which does not have the lead angle, the inclined portion including a narrow portion, while the non-lead portion providing a wide portion having a larger width than the narrow portion, the cam groove further having a width varying portion which connects the narrow and wide portions and whose width smoothly varies from a width of the narrow portion to the width of the wide portion, and wherein the stop position changing device includes: the wide portion of the cam groove of each concave globoidal cam; a constant-velocity rotor which is rotated at a constant velocity about the common axis; stop position changing biasing means provided between the constant-velocity rotor and each of the rotary members, for biasing the cam follower toward one of the opposite side surfaces of the cam groove.

(31) An electronic component transferring device or an electronic component mounting system according to the form (30) of the invention, wherein the stop position changing biasing means comprises an air cylinder having a cylinder housing and a piston rod which is pneumatically movable relative to the cylinder housing between a first position for biasing the cam follower toward the one of the opposite side surfaces of the cam groove, and a second position for biasing the cam follower toward the other of the opposite side surfaces.

(32) An electronic component mounting system according to any one of the forms (14)–(31) of the invention, wherein the image taking device includes a high-speed camera provided with a stroboscope.

The high-speed camera with a stroboscope is arranged to irradiate the electronic component with a high-intensity light, when the electronic component passes a path of the light. A sufficiently clear image of the electronic component may be taken even during a movement of the component, if the image is taken at a sufficiently high shutter speed or with a sufficiently short light exposure time.

(33) An electronic component transferring device according to any one of the forms (14)–(31) of the invention, wherein the image taking device includes a line sensor having an array of image taking elements arranged in a radial direction of a circle which has a center at the common axis.

In the line sensor described above, the multiple image taking elements are arranged in a linear array extending in the radial direction of the common axis. The line sensor is activated at a predetermined time interval to take an image of the electronic components while the corresponding rotary member is moved at a predetermined constant velocity between the component receiving and mounting positions. As a result, successive lines of images of the component arranged in the direction of the movement of the rotary member are obtained. The overall image of the component is obtained based on these lines of images. Namely, the two-dimensional image of the component is obtained by repeated activation of the line sensor and the movement of the component holder head by the rotary member. Since the component holder head is rotated, the angle of the line sensor with respect to the component varies as the component is moved with the head, so that the two-dimensional image obtained from the line sensor should be suitably processed to compensate for this angular variation.

(34) An electronic component transferring device according to any one of the forms (3)–(12) and (15)–(31) of the invention, or an electronic component mounting system according to any one of the forms (13)–(33) of the invention, wherein the engaging member of the engaging device comprises a plurality of engaging pins provided on the constant-velocity rotor such that the engaging pins are movable in a direction parallel to the common axis, the engaging pins being engageable with the rotary members, respectively, the rotary motion generating device further including: a stationary engaging cam having a cylindrical surface whose circumference has a center at the common axis, the cylindrical surface having a cam portion whose position in a direction parallel to the common axis gradually varies; and a plurality of engaging cam followers which engage the cam groove of the stationary engaging cam and which are movable with the plurality of engaging pins, respectively, between a first position in which each of the engaging cam followers is in engagement with a corresponding one of the rotary members, and a second position in which each engaging cam follower is disengaged from the corresponding rotary member.

In the present electronic component transferring device or electronic component mounting system according to the form (34) of the invention, the engaging pins are rotated with the constant-velocity rotor, and the engaging cam followers are moved in engagement with the stationary engaging cam, so that the cam followers are vertically moved by the cam portion whose height varies in the direction parallel to the common axis, whereby the engaging pins are vertically moved for selective engagement and disengagement with and from the rotary members. When a given engaging pin is in engagement with the corresponding rotary member, this rotary member is rotated by the constant-velocity rotor at the predetermined constant velocity. Thus, the rotation of the constant-velocity rotor is utilized as part of an inexpensive device for moving the engaging pins for connecting or disconnecting the rotary members to or from the rotor.

The third object indicated above may be achieved according to the following forms, embodiments or modes of the present invention:

(35) A method of transferring electronic components, comprising: (i) holding the electronic components on respective component holder heads; and (ii) rotating a plurality of rotary members carrying the component holder heads, respectively, about a common axis over a full 360° angular range such that each of the rotary members is stopped at each of at least one predetermined stop position during one full rotation thereof over the full 360° angular range and such that the rotary members sequentially reach each stop position at a predetermined time interval, and such that at least one of the component holder heads and at least one of the electronic components which is held by the above-indicated at least one of the component holder heads are in the process of rotation about the common axis while another of the component holder heads and the electronic component held thereby are stopped at one of the above-indicated at least one predetermined stop position.

(36) A method according to the form (35) of the invention, wherein the rotating a plurality of rotary members is effected by using a plurality of cam followers provided on the plurality of rotary members, respectively, and a rotary motion generating cam device which sequentially engages the plurality of cam followers to thereby move the cam followers and rotate the rotary members about the common axis.

(37) A method according to the form (36) of the invention, wherein the rotating a plurality of rotary members comprises activating a single drive source to rotate at least one rotary cam of the rotary motion generating cam device, and stopping the plurality of rotary members such that the rotary members corresponding to a plurality of predetermined stop positions as the above-indicated at least one predetermined stop position are stopped at the predetermined stop positions at different times.

(38) A method according to the form (36) or (37) of the invention, wherein the rotary motion generating cam device includes at least one concave globoidal cam each having an outer circumferential surface which is defined by a locus which is described by a circular arc having a center at the common axis when the circular arc is rotated about an axis which is perpendicular to the common axis and which is positioned relative to the circular arc and the common axis such that the circular arc is interposed between the axis and the common axis.

(39) A method according to the form (38) of the invention, wherein the rotating a plurality of rotating members is effected by using at least two concave globoidal cams which are disposed around the common axis such that lines of intersection of the outer circumferential surfaces of the above-indicated at least two concave globoidal cams with a plane including the common axis cooperate to define a substantially continuous circular arc which has a center at the common axis, the above-indicated at least two concave globoidal cams having respective cam grooves formed in the outer circumferential surfaces such that the cam grooves are connected to each other, the method further comprising preventing the cam followers from being placed in a released state at each joint of the cam grooves, in which released state the cam followers are not interposed between opposite side surfaces of the cam grooves.

(40) A method according to any one of the forms (35)–(39) of the invention, further comprising controlling a position of each of the component holder heads in a direction parallel to the common axis as the rotary members are rotated about the common axis.

The fourth object indicated above may be achieved according to any one of the following forms, embodiments or modes of the present invention:

(41) A method of mounting electronic components on a workpiece, comprising: (i) supplying component holder heads with the electronic components, at a component supply position; (ii) holding the electronic components on the component holder heads, respectively; (iii) rotating a plurality of rotary members carrying the component holder heads, respectively, about a common axis over a full 360° angular range such that each of the rotary members is stopped at each of at least two predetermined stop positions during one full rotation thereof over the full 360° angular range and such that the rotary members sequentially reach each stop position at a predetermined time interval, and such that at least one of the component holder heads and at least one of the electronic components which is held by the above-indicated at least one of the component holder heads are in the process of rotation about the common axis while another of the component holder heads and the electronic component held thereby are stopped at one of the above-indicated at least one predetermined stop position, the above-indicated at least two predetermined stop positions including the component supply position and a component mounting position at which the electronic components are mounted by the component holder heads; (iv) supporting and positioning the workpiece such that the electronic components are mounted by the component holder heads; and (v) mounting the electronic components on the workpiece at the component mounting position.

(42) A method according to the form (41) of the invention, further comprising: obtaining an image of each of the electronic components while the corresponding component holder head is on the way from the component supply position to the component mounting position.

(43) A method according to the form (42) of the invention, wherein the obtaining an image is effected while the corresponding component holder head is continuously rotated between the component supply and mounting positions.

(44) A method according to the form (42) of the invention, wherein the obtaining an image is effected while the corresponding component holder head is stopped at an image taking position between the component supply and mounting positions.

(45) A method according to the form (37) of the invention, wherein the different times at which the rotary members are stopped at the stop positions differ from each other by a predetermined time length which is determined to at least partially offset the positive and negative values of the load torque of the plurality of rotary cams due to the deceleration and acceleration of the rotary members before and after the stop positions.

(46) A method according to the form (45) of the invention, wherein the above-indicated predetermined time length is determined such that a maximum value of the load torque of the drive source is smaller than a maximum value of the load torque due to deceleration and acceleration of each rotary member before and after each stop position.

(47) A method according to any one of the forms (35)–(46), wherein the component holder heads and the electronic components held by the component holder heads are moved in a direction parallel to the common axis while the rotary members are rotated about the common axis.

(48) A method according to any one of the forms (35)–(47), wherein at least one of the above-indicated at least one predetermined stop position is changed in at least two steps during transfer of the electronic components.

(49) A method according to any one of the forms (35)–(48), wherein a position of the component holder heads in a direction parallel to the common axis at each of at least one of the above-indicated at least one predetermined stop position is changed in at least two steps during transfer of the electronic components.

BRIEF DESCRIPTION OF THE DRAWINGS

The above and optional objects, features, advantages and technical and industrial significance of this invention will be better understood by reading the following detailed description of presently preferred embodiments of the invention, when considered in connection with the accompanying drawings, in which:

FIG. 6 is a front elevational view in cross section showing one of the component holder heads in the transferring and mounting apparatus;

FIGS. 11A-1, 11A-2 and 11A-3 are graphs showing changes in the position, rotating speed and acceleration or deceleration of the rotary plate in the present transferring and mounting apparatus, in the vicinity of a stop position of the rotary plate;

FIGS. 11B-1, 11B-2 and 11B-3 are graphs corresponding to those of FIGS. 11A, in a conventional transferring and mounting apparatus;

FIGS. 22A–22C are views for explaining a change in the component sucking position where a cartridge support is fed in a forward direction, in the apparatus of FIG. 13;

FIG. 31 is a timing chart indicating a relationship between the rotating angle of fifteen rotary plates and the time in the apparatus of FIG. 25;

DETAILED DESCRIPTION OF THE PREFERRED EMBODIMENTS

Referring first to FIGS. 1–12, there will be described an electronic component mounting system including an electronic component transferring and mounting apparatus 12 which is equipped with an electronic component transferring device constructed according to one embodiment of the present invention.

Figure 1:
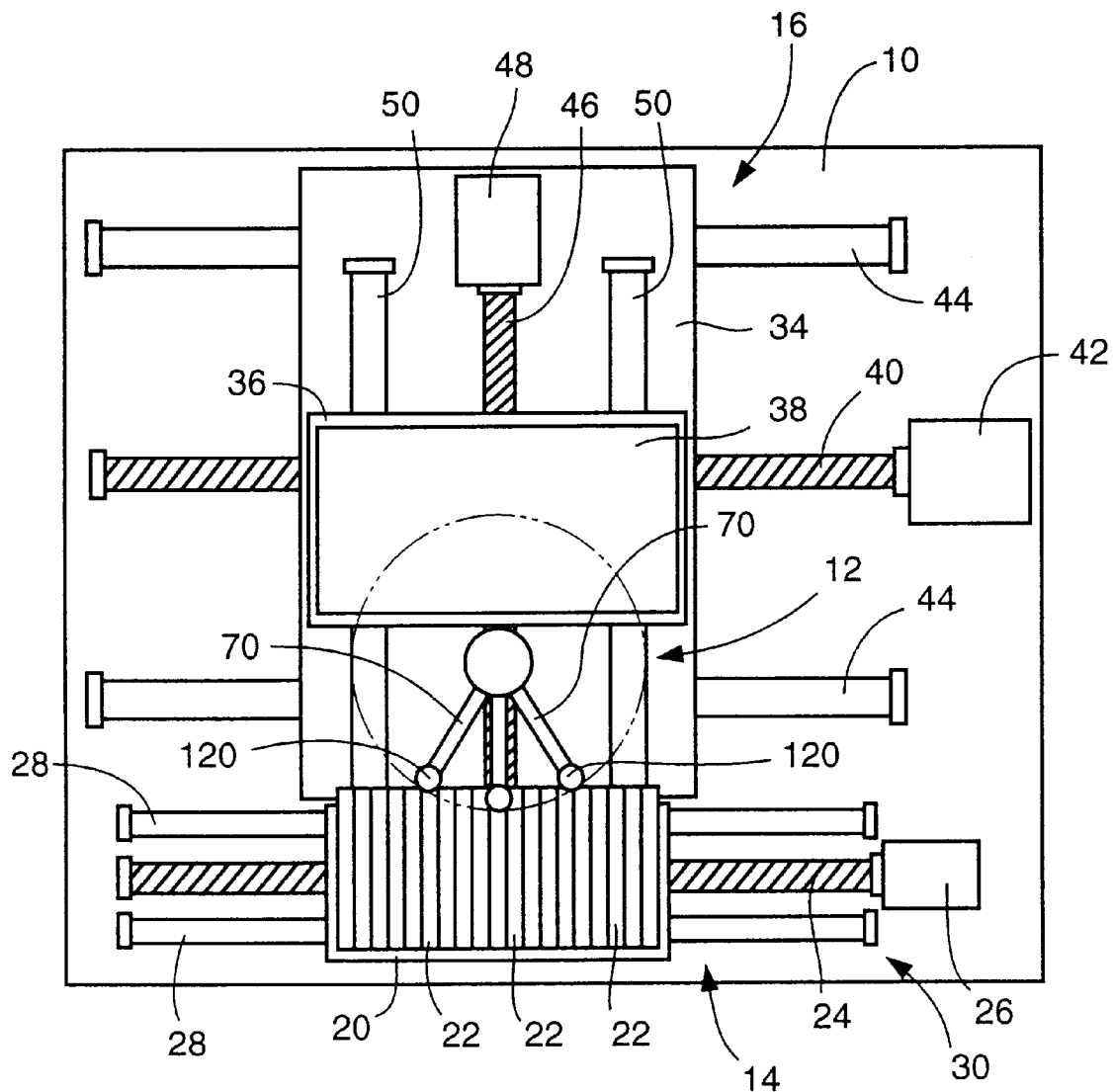
FIG. 1 is a plan view schematically showing an electronic component mounting system according to one embodiment of the present invention, including an electronic component transferring and mounting apparatus equipped with one embodiment of an electronic component transferring device of the invention.

In FIG. 1, reference numeral 10 denotes a base on which are mounted the electronic component transferring and mounting apparatus 12, an electronic component supply device 14, and a workpiece supporting and positioning device in the form of a board supporting and positioning device 16. The electronic component supply device 14 includes a cartridge support block 20 which carries a multiplicity of component supply cartridges 22 (hereinafter referred to as "cartridges 22) such that the component supply portions of the cartridges 22 are arranged along a straight line.

The cartridge support block 20 is provided with a nut (not shown) engaging a feed screw 24. When the feed screw 24 is rotated by a drive source in the form of a cartridge feed servomotor 26, the cartridge support block 20 is fed in an X-axis direction while it is guided by guide members in the form of a pair of straight guide rails 28. Thus, one of the cartridges 22 which are arranged in the X-axis direction is brought to a predetermined component supply position. The nut, feed screw 24 and cartridge feed servomotor 26 constitute a major portion of a cartridge feeding device 30 for feeding the cartridges 22 in the X-axis direction.

The board supporting and positioning device 16 is disposed at a level lower than that of the cartridges 22 of the electronic component supply device 14. This device 16 includes an X-axis table 34 movable in the X-axis direction, and a Y-axis table 36 which is mounted on the X-axis table 34 and which is movable in a Y-axis direction which is perpendicular to the X-axis direction in a horizontal plane. The Y-axis table 36 has a board holding device (not shown) mounted thereon to position a workpiece in the form of a printed-circuit board 38. The X-axis table 34 is moved in the X-axis direction while it is guided by guide members in the form of straight guide rails 44 when a feed screw 40 is rotated by a drive source in the form of an X-axis drive servomotor 42. The Y-axis table 36 is moved in the Y-axis direction while it is guided by guide members in the form of straight guide rails 50 when a feed screw 46 is rotated by a drive source in the form of a Y-axis drive servomotor 48. With the X-axis table 34 and the Y-axis table 36 being moved in the horizontal plane, the printed-circuit board 38 is positioned such that a multiplicity of component mounting portions of the board 38 are sequentially aligned with a predetermined component mounting position. The X-axis table 34 extends below the electronic component transferring and mounting apparatus 12, and a portion of the table 34 is located below the cartridges 22. The printed-circuit board 38 is loaded and unloaded onto and from the board holding device of the board supporting and positioning apparatus 16, in the X-axis direction.

The electronic component transferring and mounting apparatus 12 is disposed above the electronic component supply device 14 and the board supporting and positioning device 16. The apparatus 12 is adapted to receive the electronic components from the electronic component supply device 14 and transfer the electronic components onto the printed-circuit board 38, namely, mount the electronic components on the board 38. Thus, the apparatus 12 serves not only as an electronic component transferring device, but also as an electronic component mounting device.

Figure 2:
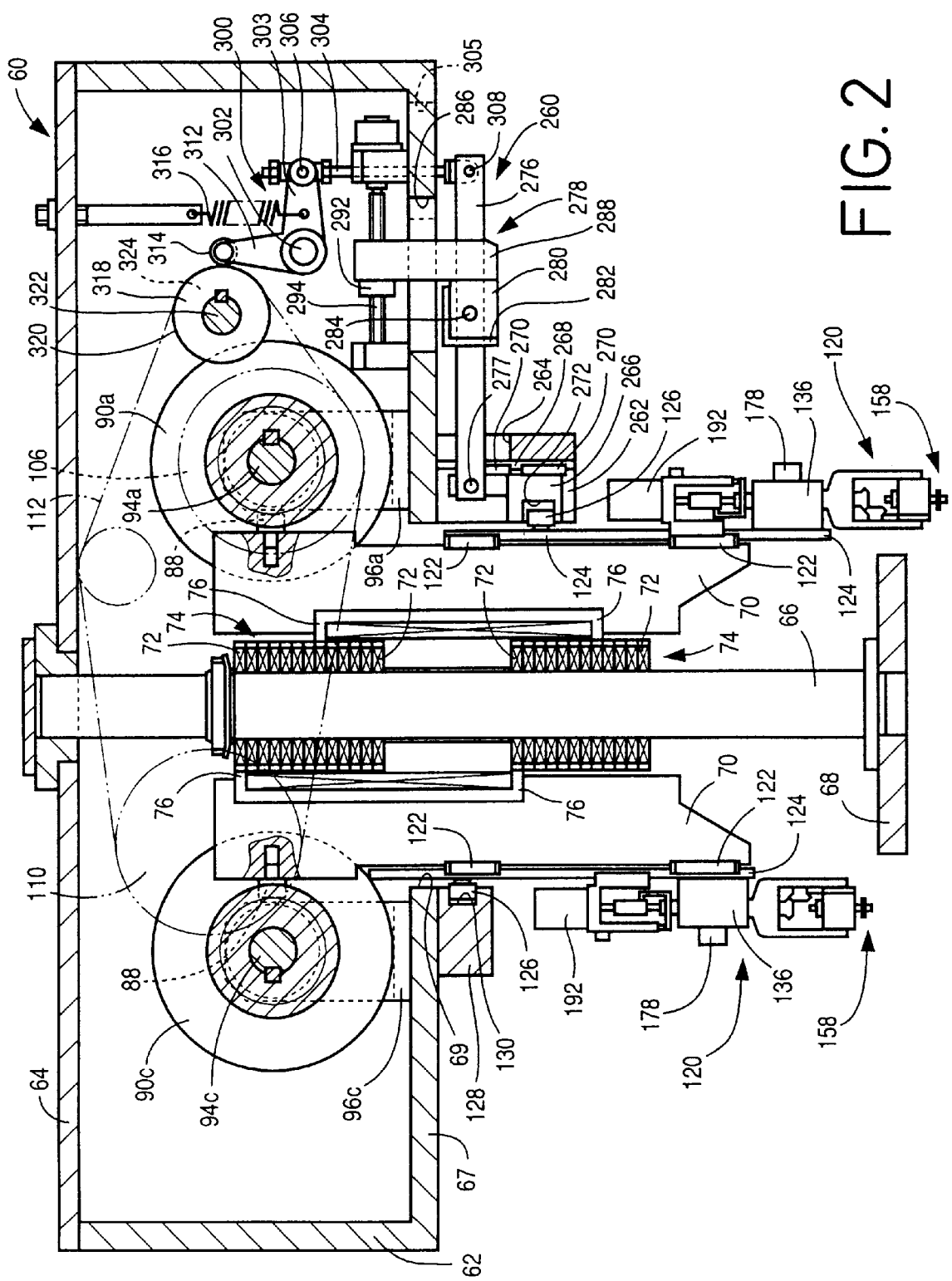
FIG. 2 is a front elevational view in cross section of the electronic component transferring and mounting apparatus of FIG. 1.

Referring to FIG. 2, the electronic component transferring and mounting apparatus 12 has a main body including a frame 60, which is supported by support members (not shown) fixed to the base 10 indicated above. That is, the frame 60 is disposed above the base 10. The frame 60 has a mounting structure 62 in the form of a box having a U-shape in cross section, and a support plate 64 which extend between and are fixed to a pair of side walls of the mounting structure 62.

Figure 3:
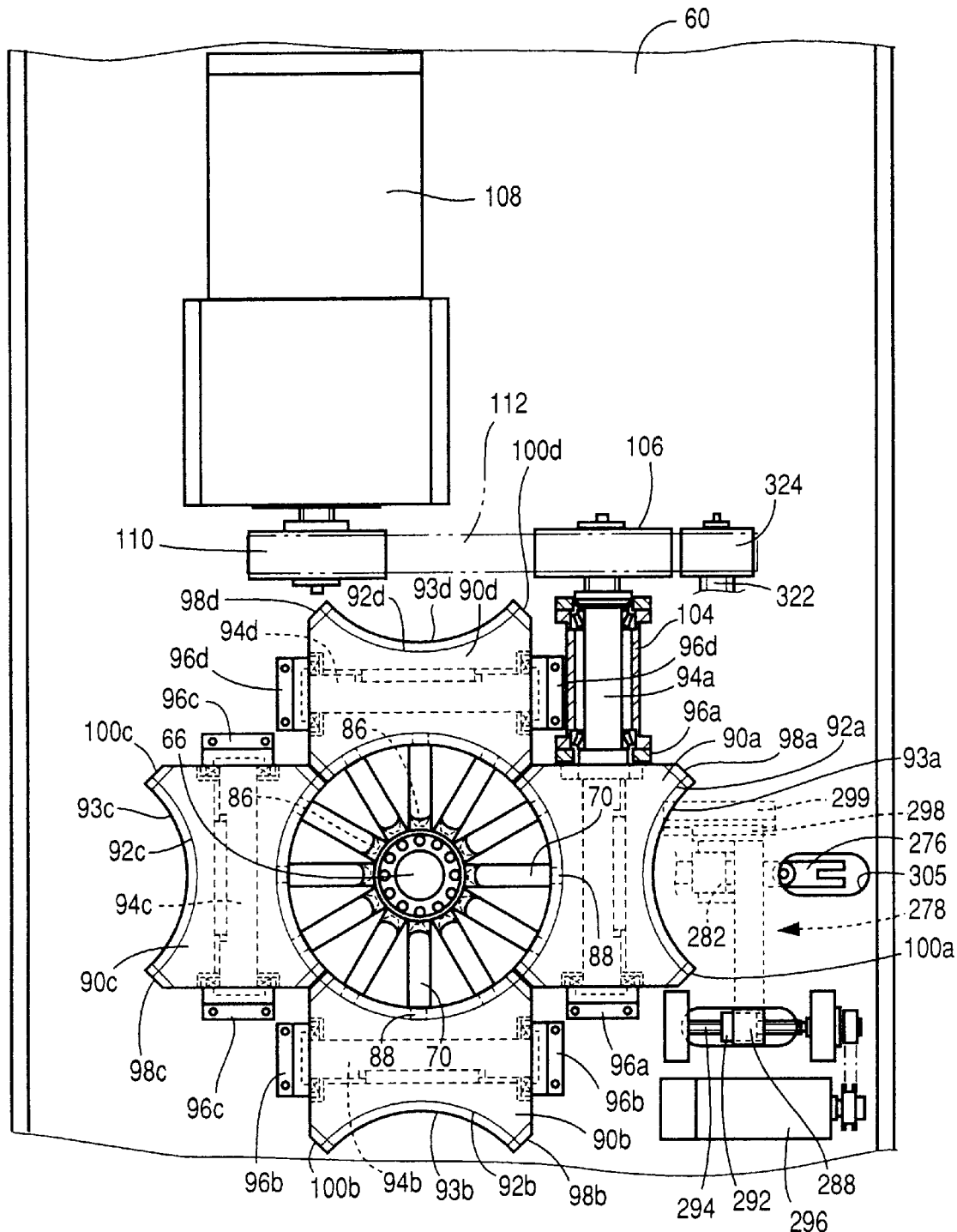
FIG. 3 is a plan view of the present electronic component transferring and mounting apparatus.

A support shaft in the form of a stationary shaft 66 having a circular cross sectional shape is fixed at its upper end by the support plate 64 of the frame 60, and extends downwards through an opening 69 formed through a bottom wall 67 of the mounting structure 62. The lower end portion of the stationary shaft 66 is located outside and below the mounting structure 62, and is fixed at its lower end by a support plate 68 secured to the base 10. As shown in FIGS. 2 and 3, twelve rotary members in the form of rotary plates 70 are fixed to respective pairs of bearings 72, such that the rotary plates 70 are rotatable about an axis of the stationary shaft 66. This axis of the stationary shaft 66 serves as a common axis about which the rotary plates 70 are rotatable.

The bearings 72 consists of two arrays 74 of bearings which are fixedly disposed on the stationary shaft 66 such that the two arrays 74 are spaced apart from each other in the axial direction of the stationary shaft 66. Each of these two arrays 74 consists of twelve bearings 72 which are arranged in the axial direction, namely, superposed on each other in a stack. The twelve rotary plates 70 have respective pairs of support arms 76 fixed thereto. Each pair of support arms 76 is fixed to and supported by the corresponding pair of bearings 72 which belong to the two arrays 74, respectively. All pairs of bearings 72 corresponding to the respective pairs of support arms 76 of the twelve rotary members 70 have the same distance therebetween in the axial direction of the stationary shaft 66.

Figure 4:
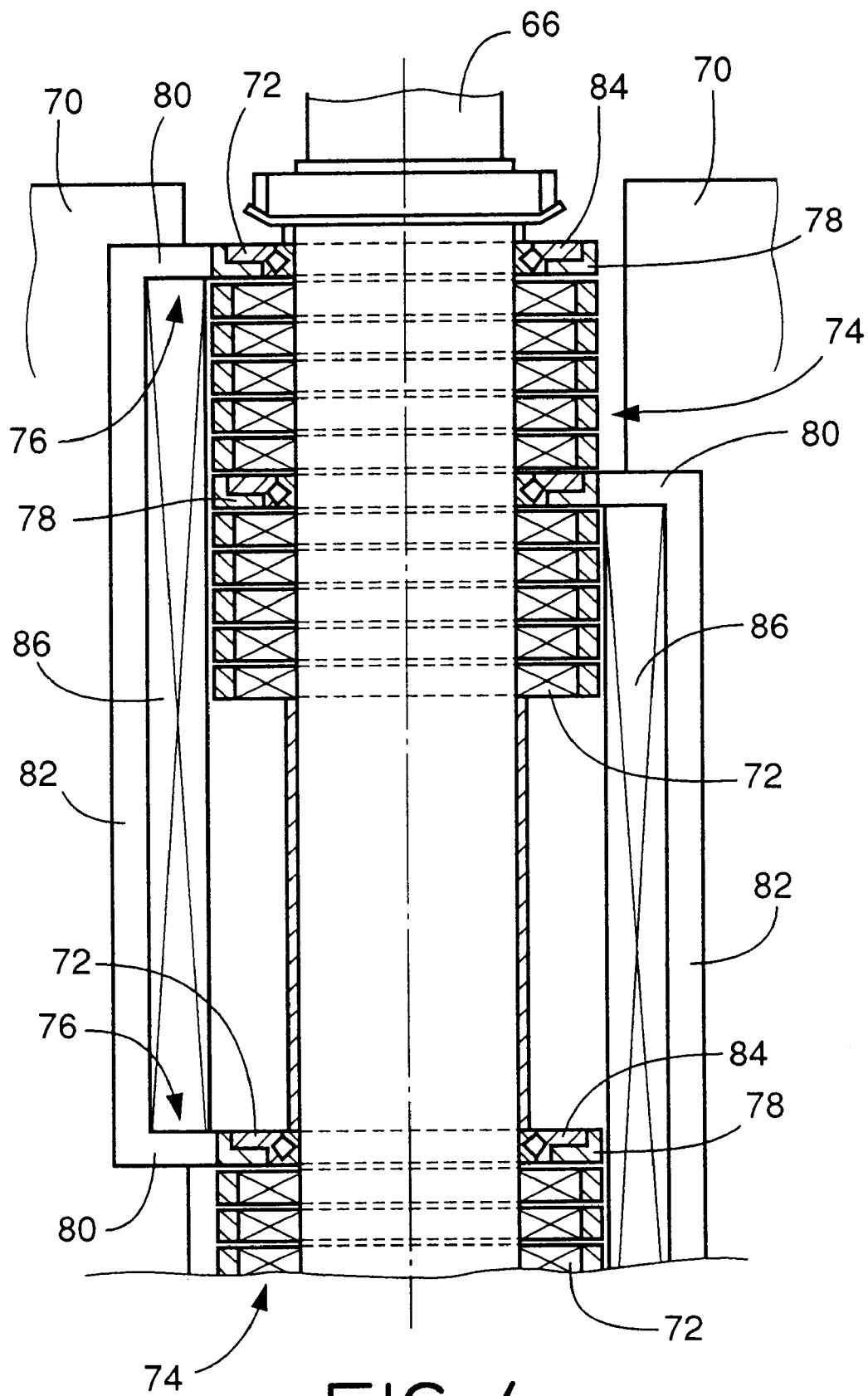
FIG. 4 is a front elevational view in cross section showing rotary plates supported by a stationary shaft in the present transferring and mounting apparatus.
Figure 5:
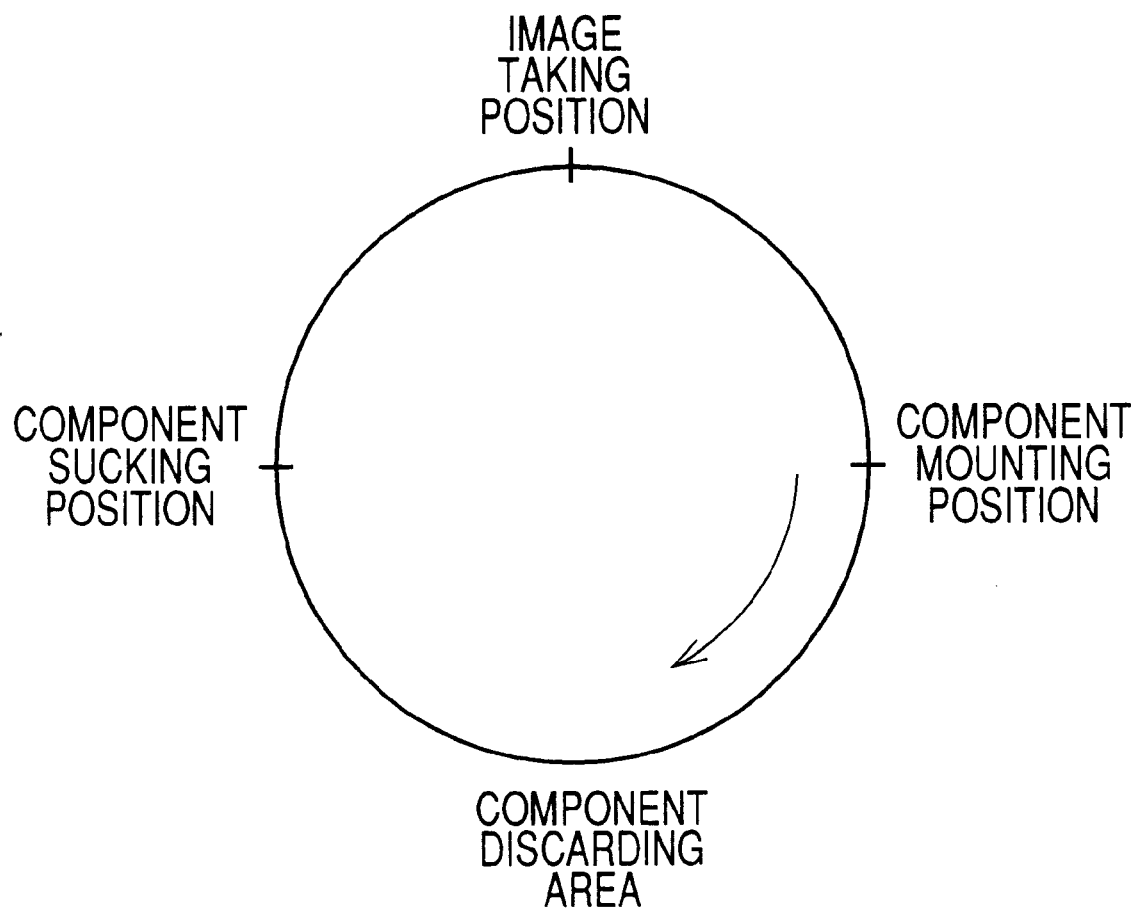
FIG. 5 is a view indicating three positions at which component holder heads are stopped in the transferring and mounting apparatus.

As shown in FIG. 4, each of the support arms 76 consists of an annular fitting 78, and a radial arm 80 which extends from a portion of the circumference of the annular fitting 78 in radial outward direction of the annular fitting 78. Each pair of support arms 76 has a connecting portion 82 which connects the two radial arms 80. The connecting portion 82 of each pair of support arms 76 and the end portions of the radial arms 80 connected to the connecting portion 82 are fixed to the corresponding rotary plate 70, while the annular fittings 78 are fitted on respective outer casings 84 of the corresponding pair of bearings 72 and are fixed to the outer casings 84 by a plurality of bolts. The twelve pairs of support arms 76 have different axial positions at which the arms 76 are fixed to the respective rotary plates 70. Accordingly, the support arms 76 do not interfere with each other, even though the rotary plates 70 have the same position with respect to the stationary shaft 66 in the axial direction of the shaft 66. In this arrangement, the twelve rotary plates 70 are rotatable about the common axis, namely, about the axis of the stationary shaft 66, such that all the rotary plates 70 maintain a predetermined position or height in the axial direction of the stationary shaft 66. The pair of radial arms 80 and the connecting portion 82 are provided with a rib 86, which has a thinned fixed end portion on the side of the stationary shaft 66, as indicated by broken lines in FIG. 3. The thickness of the thinned fixed end portion of the rib 86 decreases in a radial direction toward the stationary shaft 66, so that the fixed end portions of the adjacent ribs 86 and the adjacent radial arms 80 do not interfere with each other. Each rotary plate 70 extends downwards through the opening 69 formed through the bottom wall 67 of the frame 60, and the lower end portion of the rotary plate 70 is located below the bottom wall 67.

As shown in FIG. 2, a cam follower in the form of a cam follower roller 88 is attached to a radial end of each rotary plate 70 remote from the stationary shaft 66, such that the roller 88 is rotatable about a horizontal axis extending in the radial direction of the stationary shaft 88. As shown in FIG. 3, the rollers 88 of the twelve rotary plates 70 are held in rolling engagement in cam grooves 92a, 92b, 92c, 92d formed in four concave globoidal cams 90a, 90b, 90c, 90d which are rotatably mounted on the frame 60. In the interest of brevity and simplification, the twelve rotary plates 70 are shown in FIG. 3 as positioned relative to each other such that the rotary plates 70 are evenly or equi-angularly spaced apart from each other about the stationary shaft 66.

The four concave globoidal cams 90a, 90b, 90c, 90d have respective outer circumferential surfaces 93a, 93b, 93c, 93d. The outer circumferential surface 93 is defined by a locus which is to be described by a circular arc having a center at the axis of the stationary shaft 66 when the circular arc is rotated about an axis which is located such that the circular arc is interposed between this axis and the axis of the stationary shaft 66 and which is perpendicular to the axis of the stationary shaft 66. The axis about which the circular arc is rotated to describe the above-indicated locus defining the circumferential surface 93 is an axis of a rotary shaft 94 of the concave globoidal cam 90, which will be described. The four concave globoidal cams 90a, 90b, 90c, 90d are disposed symmetrically with respect to the axis of the stationary shaft 66, such that lines of intersection of the outer circumferential surfaces 90a, 90b, 90c, 90d of the cams 90a, 90b, 90c, 90d with a plane (horizontal plane) including the axes of the cams 90 and perpendicular to the axis of the stationary shaft 66 cooperate to define a substantially continuous circle which has a center at the axis of the stationary shaft 66. The cam grooves 92a, 92b, 92c, 92d formed in the outer circumferential surfaces 93a, 93b, 93c, 93d are substantially connected to each other.

The concave globoidal cams 90a, 90b, 90c, 90d are fixedly mounted on respective rotary shafts 94a, 94b, 94c, 94d, as shown in FIG. 3. The rotary shafts 94 are rotatably supported by respective pairs of brackets 96a, 96b, 96c, 96d fixed to the mounting structure 62 of the frame 60. The four concave globoidal cams 90a–90d have respective pairs of bevel gears 98a, 100a, 98b, 10b, 98c, 100c, 98d, 100d. The bevel gears 98, 100 of each globoidal cam 90 are formed integrally and coaxially with the cam 90, at the axially opposite ends. The bevel gears 98, 100 of the adjacent concave globoidal cams 90a–90d are held in meshing engagement with each other.

The rotary shaft 94a to which the concave globoidal cam 90a is attached has a larger axial length than the other rotary shafts 94b–94d, and is rotatably supported also by another bracket 104 fixed to the frame 60, as shown in FIG. 3. At the free end of the rotary shaft 94a, there is fixed a timing pulley 106, which is connected by a timing belt 112 to a timing pulley 110 fixed to an output shaft of a main drive source in the form of an electrically operated main drive servomotor 108. When the rotary shaft 94a is rotated by the main drive servomotor 108, the four concave globoidal cams 90 are contemporaneously rotated in synchronization with each other, with the bevel gears 98a–98d meshing with each other, so that the twelve rotary plates 70 are rotated about the stationary shaft 66 or held stationary, as described below.

In the present electronic component transferring and mounting apparatus 12, the rotary plates 70 are stopped at a component sucking station, an image taking station and a component mounting station. In these stations, there are set a component sucking position, an image taking position and a component mounting position, respectively. At the component sucking position, the apparatus 12 receives the electronic components from the electronic component supply device 14, which is located on the base 60, at a position in the vicinity of the component sucking position. A CCD (charged-coupled device) camera 114 (FIG. 9) is located on the base 10, at a position corresponding to the the image taking position, while the board supporting and positioning device 16 is located on the base 10, at a position corresponding to the component mounting position.

The concave globoidal cam 90a is located at a position corresponding to the component mounting position, and the concave globoidal cam 90c is located at a position corresponding to the component sucking position, while the concave globoidal cam 90d is located at a position corresponding to the image taking position. The cam grooves 92a, 92c, 92d of the cams 90a, 90c, 90d are formed or shaped so that the rotary plates 70 (cam follower rollers 88) are held stopped at the component sucking and mounting positions and the image taking position, and are decelerated and accelerated during movements thereof toward and from those three positions, and such that the rotary plates 70 are rotated at a predetermined constant angular velocity when the corresponding cam follower rollers 88 are moving into and from the cam grooves 92a, 92c, 92d. Each of the cam grooves 92a, 92c, 92d of the concave globoidal cams 90a, 90c, 90d has an inclined portion having a lead angle with respect to a plane perpendicular to the axis of the rotary shaft 94a, 94c, 94d, and a non-lead portion perpendicular to that axis. The inclined portion includes a curved section and a straight section. The cam groove 92b of the concave globoidal cam 90b has only a straight inclined portion having a lead angle with respect to a plane perpendicular to the axis of the rotary shaft 94b. This lead angle is determined to permit the rotary plates 70 to be rotated at the above-indicated constant angular velocity.

It is noted that a component container (not shown) is provided in a component discarding area between the component mounting and sucking stations of the apparatus 12. Described more specifically, the component container is provided along a circular arc path of component holder heads 120 carried by the rotary plates 70, and are located below the component holder heads 120, so that the component container accommodates electronic components which are discarded from the component holder heads 120 during rotation of the rotary plates 70 from the component mounting station to the component sucking station. Namely, the electronic components which have been sucked up by the component holder heads 120 are not mounted on the printed-circuit board 38 and discarded into the component container, if the components have not been adequately positioned with respect to sucking nozzles of the heads 120, that is, if the components held by the heads 120 are dislocated to such an extent that the positions of the components cannot be corrected. The components are also discarded if the kinds of the components which have been held by the heads 120 are different from those of the components that should be mounted.

Each of the twelve rotary plates 70 carries a component holder head 120, as shown in FIG. 2. Each rotary plate 70 has guide members in the form of a pair of guide blocks 122 fixed thereto such that the guide blocks 122 are spaced apart from each other in the vertical direction. A movable member in the form of a vertical slide 124 engages the guide blocks 122 such that the vertical slide 124 is vertically slidably movable. To an upper part of the vertical slide 124, there is attached a cam follower in the form of a cam follower roller 126 such that the roller 126 is rotatable about an axis extending in the radial direction of the stationary shaft 66. To a lower part of the vertical slide 124, there is attached the component holder head 120.

A stationary cylindrical cam 128 is fixed to the underside (lower surface) of the bottom wall 67 of the frame 60, in coaxial relationship with the stationary shaft 66. The cam follower roller 126 indicated above is held in rolling engagement with a cam groove 130 formed in the inner circumferential surface of the cylindrical cam 128. The cam groove 130 has a height varying portion whose height (in the axial direction of the shaft 66) gradually varies in the circumferential direction of the cam 128, and a level portion whose height is held constant in the circumferential direction. The cam groove 130 is formed so that each component holder head 120 is placed in its upper end position when the rotary plate 70 is located at the component sucking position, and is placed in its lower end position when the rotary plate 70 is located at the component mounting position, and so that the component holder head 120 is moved in a horizontal plane when the rotary plate 70 is rotated around each of the component sucking and mounting positions and the image taking position. In the present arrangement, the vertical slides 124 are moved up and down to move the component holder heads 120 in the vertical direction when the cam follower rollers 126 are moved in rolling contact with the height varying portion of the cam groove 130, with the rotary plates 70 being rotated with the cam follower rollers 126.

Figure 6A:
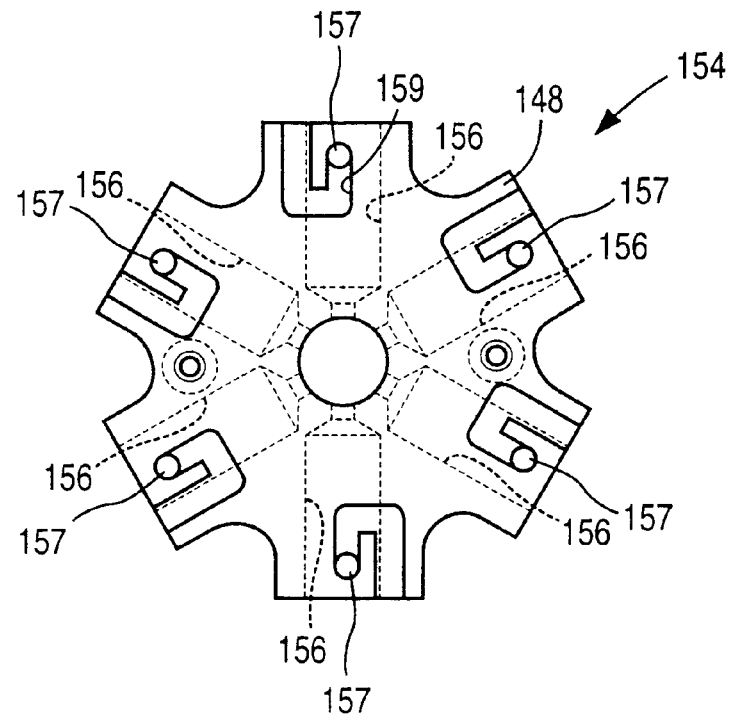
FIG. 6A is an enlarged view of a nozzle holder of the component holder head of FIG. 6.
Figure 6B:
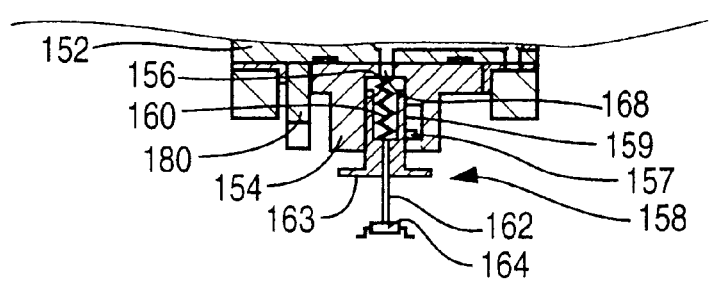
FIG. 6B is an enlarged view of a portion of the nozzle holder of FIG. 6A.

As shown in FIG. 6, a bracket 136 is fixed to the lower end portion of the vertical slide 124, and a sleeve or hollow shaft 138 is supported by the bracket 136 via bearings 140, 142 such that the sleeve 138 is rotatable relative to the bracket 136 and is axially immovable relative to the bracket 136. An inner shaft 144 is fitted in the sleeve 138 such that the inner shaft 144 is rotatable and is axially immovable relative to the sleeve 138. A holder portion 146 which is generally U-shaped in cross section is fixed to the lower end of the sleeve 138 located outside the bracket 136. The holder portion 146 has a pair of side walls 148, 150, and a support shaft 152 which is fixed at its opposite ends to the side walls 148, 150. The support shaft 152 carries a cylindrical nozzle holder 154 rotatably mounted thereon.

The nozzle holder 154 has six nozzle engaging radial holes 156 which are equi-angularly spaced from each other in the circumferential direction of the support shaft 152. The radial holes 156 accommodate respective cylindrical suction nozzles 158 such that the nozzles 158 are axially movable in the radial holes 156 and are not rotatable relative to the nozzle holder 154. The suction nozzles 158 are biased in a radially outward direction of the nozzle holder 154 by biasing means in the form of elastic members in the form of respective compression coil springs 160 accommodated in the radial holes 156. Rotation of each suction nozzle 158 in the radial hole 156 and axial movement of the suction nozzle 158 out of the radial hole 156 are prevented by engagement of a pin 157 provided on the suction nozzle 158 with the opposite ends of a corresponding groove 159 formed in the nozzle holder 154. The six suction nozzles 158 are provided for sucking up electronic components 164 of respective different sizes. The six suction nozzles 158 have respective suction tubes 162 having respective different diameters. Each of the suction nozzles 158 has a reflector plate 163. The diameter of the reflector plates 163 of the suction nozzles 158 whose suction tubes 162 have a comparatively small diameter is smaller than that of the reflector plates 163 of the suction nozzles 158 whose suction tubes 162 have a comparatively large diameter. The suction tubes 162 of the six suction nozzles 158 have the same length, so that the free ends of the suction tubes 162 lie on a circle having a center on the axis of rotation of the cylindrical nozzle holder 154.

The six suction nozzles 158 are selectively placed in an operating position by rotation of the nozzle holder 154, as described below. When a selected one of the suction nozzles 158 is in the operating position, its axis extends in the vertical direction, and the free end of its suction tube 162 is located right below the axis of the support shaft 152. The axis of the suction nozzle 158 placed in the operating position is aligned with the axis of the sleeve 138.

The suction nozzles 158 are adapted to hold the electronic component 164 by air suction. As shown in FIG. 6, passages 168, 170, 172, 174, 176, 177 are formed through the nozzle holder 154, support shaft 152, side wall 150, inner shaft 144, sleeve 138 and bracket 136, respectively. A switching device 178 is attached to the bracket 136, so that the suction nozzle 158 placed in the operating position is communicated selectively with a vacuum source (not shown) or the atmosphere by an operation of the switching device 178. The vacuum source is connected through a conduit (not shown) to a passage (not shown) formed through the stationary shaft 66, and this passage is connected through a rotary valve (not shown) to the twelve switching devices 178 through respective hoses. The rotary valve is disposed at a position of the stationary shaft 66, which is lower than the bearing arrays 74. A rotary motion of a valve drive servomotor (not shown) disposed on the support plate 68 is transmitted to the rotary valve through timing pulley and belt, so that the rotary valve is held operated at the same angular velocity as that of the constant-velocity movement of the rotary plate 70, whereby the switching device 178 is held connected to the vacuum source. When the rotary plate 70 is stopped, the switching device 178 and the rotary valve are rotated by a small angle relative to each other. This relative rotation is permitted by the elastic deformation of the hose.

Each switching device 178 has a solenoid-operated switch valve operated for selective communication of the suction nozzle 158 with the vacuum source or the atmosphere, so that the electronic component 164 is sucked up by the suction tube 158 or released therefrom. The passage 170 formed through the support shaft 152 is connected to the passage 168 which communicates with the suction nozzle 158 placed in the operating position.

A gear 180 is rotatably mounted on the support shaft 152, and is fixed to the nozzle holder 154 by a connecting member in the form of a pin 182 so that the nozzle holder 154 is rotated with the gear 180. The gear 180 meshes with a gear 186 fixed to a support shaft 184 which is rotatably attached to the side wall 148 of the holder portion 146. The gears 180, 186 have the same diameter. The gear 186 has an integrally formed bevel gear 188, while the inner shaft 144 has a bevel gear 190 integrally formed at its lower end. The bevel gears 188, 190 mesh with each other, and have the same diameter. The upper end portion of the inner shaft 144 projects upwards from the sleeve 138, and is connected through a connecting member 196 to an output shaft 194 of a nozzle rotating/selecting servomotor 192. The inner shaft 144 is axially movable and is not rotatable relative to the connecting member 196. The nozzle rotating/selecting servomotor 192 is bidirectionally operated at a suitable speed, and an angle of rotation of the output shaft 194 is detected by an encoder (not shown).

The connecting member 196 takes the form of a sleeve which engages the output shaft 194 and is connected to the output shaft 194 through a connecting member in the form of a pin 198 such that the sleeve 196 is not rotatable and axially immovable relative to the output shaft 194. The connecting member 196 has two cutouts 206 formed in diametrically opposite portions thereof. These cutouts 206 extend in the axial direction of the connecting member 196 and are open in the lower end face of the connecting member 196. The upper end portion of the inner shaft 144 is fitted in the connecting member 196 such that the inner shaft 144 is axially movable relative to the connecting member 196. The inner shaft 144 has a pin 208 extending diametrically through its upper end portion such that the opposite end portions of the pin 208 project outwardly of the inner shaft 144. These opposite end portions of the pin 208 engage the respective cutouts 206 such that the opposite end portions of the pin 206 are movable in the cutouts 206 in the axial direction of the inner shaft 144. With the pin 206 and the cutouts 206 engaging each other, a rotary motion of the nozzle rotating and selecting servomotor 192 is transmitted to the inner shaft 144 through the connecting member 196. Thus, the pin 208 and the cutouts 206 serve as a first engaging member and a second engaging member, respectively, which engage each other and cooperate to permit the connecting member 196 and the inner shaft 144 to be connected to each other such that these connecting member 196 and inner shaft 144 are axially movable relative to each other and are not rotatable relative to each other.

A drive member 202 in the form of a ring is fitted on the inner shaft 144 such that the drive member 202 is axially movable relative to the inner shaft 144. The drive member 202 includes a portion which is concentrically and fixedly fitted in the lower end of the connecting member 196 so as to close the lower open ends of the cutouts 206. The drive member 202 has a toothed peripheral portion 200 formed by six grooves, which are formed through the thickness of the drive member 202 such that the grooves are equi-angularly arranged in the circumferential direction of the drive member 202 and are open in the radially outward direction.

The vertical slide 124 carries a motor support in the form of an elevator 210 on which the nozzle rotating/selecting servomotor 192 is mounted. The elevator 210 is generally U-shaped in cross section, and includes two opposed side wall 212, 216 which partly defines the U-shape. The elevator 210 has a guide member in the form of a guide block 214 fixed to the side wall 212, and is vertically slidable on the vertical slide 124 through the guide block 214. To an outer surface of the other side wall 216, there is attached a cam follower in the form of a cam follower roller 218, which is rotatable about an axis extending in the radial direction of the stationary shaft 66. The side wall 216 has a cylindrical engaging boss 220 formed on its lower end face. The engaging boss 220 has a relatively small diameter.

The elevator 210 is biased upwards by biasing means in the form of an elastic member in the form of a compression coil spring 224 interposed between the drive member 202 and the upper end of the sleeve 138 which is located above the bracket 136. That is, the elevator 210 is biased by the spring 224 in a vertical direction away from the sleeve 138. An upward movement of the elevator 210 under the biasing action of the compression coil spring 224 is limited by abutting contact of the drive member 202 with the pin 208 fixed to the inner sleeve 144. In other words, the upper stroke end position of the elevator 210 is established by this abutting contact of the drive member 202 with the pin 208. A driven member 232 is fixed to the upper end portion of the sleeve 138. The driven member 232 includes an annular portion 234 fixedly fitted on the sleeve 138. The annular portion 234 has a radial extension which extends radially outwardly in a direction away from the vertical slide 124 and which has an engaging cutout 238.

The driven member 232 further includes an arm portion 240 extending upwards from the annular portion 234. The arm portion 240 has teeth 242 formed on an inner surface thereof facing the inner shaft 144. The teeth 242 provides part of an internal gear, which cooperates with the toothed peripheral portion 200 of the drive member 202 to constitute a claw clutch. When the elevator 210 is placed in its upper stroke end position under the upward biasing action of the compression coil spring 224, the toothed peripheral portion 200 of the drive member 202 is held in meshing engagement with the teeth 242 of the arm portion 240 of the driven member 232, such that the toothed peripheral portion 200 and the teeth 242 are movable relative to each other in the axial direction of the sleeve 138 and are not rotatable relative to each other, whereby the sleeve 138 and the inner shaft 144 are not rotatable relative to each other. In this condition, the engaging boss 220 provided on the elevator 210 is aligned with the engaging cutout 238 formed through the driven member 232, in the circumferential direction of the sleeve 138, and the engaging boss 220 is engageable with the cutout 238 when the elevator 210 is moved down. This position in which the boss 220 is engageable with the cutout 238 will be referred to as an "original circumferential position" of the sleeve 138 and the component holder head 120. In this original circumferential position, the horizontal axis of the support shaft 152 rotatably supporting the nozzle holder 154 extends in the radial direction of the stationary shaft 66 (axis of rotation of the rotary plate 70), which is parallel to the plane of the rotary plate 70.

A stationary nozzle selecting cam 248 is located in an area which is between the component discarding area and the component sucking station and in which the rotary plates 70 are rotated at the predetermined constant velocity while the component holder heads 120 are moved in a horizontal plane maintaining a constant height. The nozzle selecting cam 248 has a cam surface 250 which is elongated in the rotating direction of the rotary plates 70, along a circular arc having a center at the axis of the stationary shaft 66. The cam surface 250 consists of a downwardly inclined region, a level region, and an upwardly inclined region, which are arranged in the rotating direction of the rotary plates 70. The downwardly inclined region is inclined downwards in the rotating direction of the rotary plates 70, namely, in the direction from the upwardly inclined region toward the level region. The level region extends from the downward or lowest end of the downwardly inclined region, at the same level or height as the lowest position at the downward end of the downwardly inclined region. The upwardly inclined region extends from the downward end of the level region remote from the downwardly inclined region, and is inclined upwards in the rotating direction of the rotary plates 70, namely, in the direction from the level region toward the downwardly inclined region. As the cam follower roller 218 is moved in rolling contact with the downwardly inclined region of the cam surface 250, the elevator 210 is moved downwards. The elevator 210 is held level while the cam follower roller 218 is moved in rolling contact with the level region. As the roller 218 is moved in rolling contact with the upwardly inclined region, the elevator 210 is permitted to be moved upwards. The height of the nozzle selecting cam 248 is determined so that the downwardly inclined region of the cam surface 250 is engageable with the cam follower roller 218 when the elevator 210 is placed in its upper stoke end position. The initial portion of the downwardly inclined region is shaped to have a part-cylindrical surface, for facilitating the engagement with the roller 218. The elevator 210 is placed in its lower stroke end position while the roller 218 is in rolling contact with the level region of the cam surface 250 of the cam 248.

While a certain rotary plate 70 is moved from the image taking position toward the component mounting position, the nozzle rotating/selecting servomotor 192 is actuated in a controlled manner to correct a positioning error of the electronic component 164 held by the component holder head 120, more specifically, to remove a deviation of the angular position of the electronic component 164 about the axis of the suction tube 162. While the rotary plate 70 is located between the image taking position and the component mounting position, the sleeve 138 and the inner shaft 144 are connected to each other through engagement of the teeth 242 of the driven member 232 with the toothed peripheral portion 200 of the drive member 200, as shown in FIG. 6, so that a rotary motion of the nozzle rotating/selecting servomotor 192 is transmitted to the sleeve 138 through the connecting member 196, drive member 202 and driven member 232. A rotary motion of the sleeve 138 causes a rotary motion of the suction nozzle 158 placed in the operating position, about its axis, whereby the electronic component 164 held by suction on the end face of the suction tube 162 is rotated about the axis of the suction tube 162, by an amount suitable to remove the angular positioning error of the component 164. This amount of rotation of the component 164 is calculated on the basis of angular positioning data obtained from an output of the CCD camera 144 at the image taking position.

It is noted that the inner shaft 144 is rotated with the sleeve 138, whereby the meshing position of the two bevel gears 188, 190 remains unchanged, so that the bevel gear 188 remains stationary, and the nozzle holder 154 is prevented from being rotated about the axis of the support shaft 152, to thereby prevent changing the suction nozzle 158 placed in the operating position.

As a result of rotation of the sleeve 138, the engaging cutout 238 formed in the driven member 232 is offset from the engaging boss 220 provided on the elevator 210, in the rotating direction of the sleeve 138. After the electronic component 164 is mounted on the printed-circuit board 38 and while the rotary plate 70 is rotated toward the component discarding area, the sleeve 138 is rotated in the direction opposite to the direction of the rotation effected to remove the angular positioning error of the component 164, by the same amount as in the removal of the angular positioning error, so that the engaging cutout 238 is brought into alignment with the engaging boss 220 in the circumferential or rotating direction of the sleeve 138.

Figure 7:
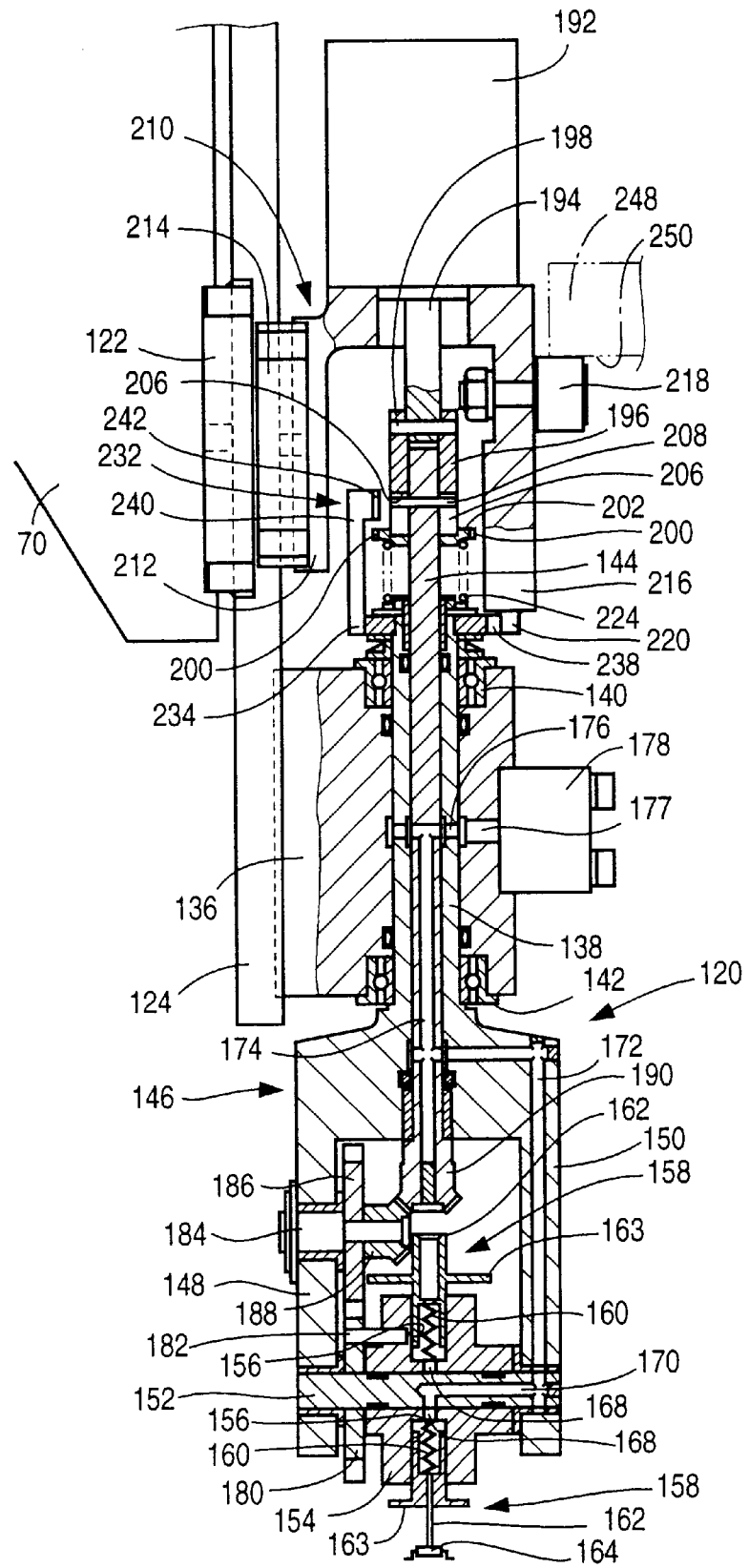
FIG. 7 is a front elevational view in cross section of the component holder head of FIG. 6 placed in an operating state in which a sleeve and an inner shaft are disconnected from each other.

While the rotary plate 70 is rotated from the component discharging area toward the component sucking station, with the component holder head 120 being moved at the constant velocity while maintaining the same height, the cam follower roller 218 is brought into engagement with the cam surface 250 of the nozzle rotating/selecting cam 248. Described in detail, the roller 218 initially contacts the downwardly inclined region of the cam surface 250, pushing down the elevator 210 against the biasing force of the compression coil spring 224. As a result, the teeth 242 of the driven member 232 is disengaged from the toothed peripheral portion 200 of the drive member 202, and the sleeve 138 is disengaged from the inner shaft 144, as shown in FIG. 7. Before the driven member 232 and the drive member 202 are completely disengaged from each other, the engaging boss 220 on the elevator 210 is moved into the engaging cutout 238 formed in the driven member 232, whereby the sleeve 138 is prevented from rotating and is held in the original circumferential position. The sleeve 138 is returned to the original circumferential position before the cam follower roller 218 is brought into contact with the cam surface 250, that is, before an operation to select the suction nozzle 158 is initiated. Consequently, the engaging boss 220 can be moved into the engaging cutout 238 to prevent rotation of the sleeve 138 when the elevator 210 is moved down by the cam follower roller 218. While the rotary plate 70 is rotated after the driven member 232 and the drive member 202 are disengaged from each other, the roller 218 is held in contact with the level region of the cam surface 250, so that the sleeve 138 and the inner shaft 144 are held disengaged from each other with the driven and drive members 232, 202 being held disengaged from each other.

When it is desired to change the suction nozzle 158 used to hold the electronic component 146, the nozzle rotating/ selecting servomotor 192 is actuated in the condition of FIG. 7. As a result, only the inner shaft 144 is rotated, and a rotary motion of the inner shaft 144 is transmitted to the nozzle holder 154 through the bevel gears 188, 190 and the gears 180, 182, so that the nozzle holder 154 is rotated about the axis of the support shaft 152 to place a desired one of the six suction nozzles 158 in the operating position. The suction nozzle 158 currently placed in the operating position can be determined by the angle of and direction of rotation of the inner shaft 144, and the kind of the suction nozzle 158 that should be used for holding the next electronic component 164 can be determined according to a component mounting program which is formulated to mount various electronic components 164 in a predetermined order on the printed-circuit board 38. The angle and direction of rotation of the servomotor 192 can be determined based on the determined kind of the suction nozzle 158 currently placed in the operating position and the determined kind of the electronic component 164 to be mounted next. Thus, the appropriate suction nozzle 158 is brought into the operating position by an operation of the servomotor 192. The direction of rotation of the servomotor 192 is determined so as to reduce the angle of rotation of the nozzle holder 154 required to select the desired suction nozzle 158.

Since the bevel gears 189, 186 have the same diameter while the gears 180, 182 have the same diameter, the nozzle holder 154 is rotated by the same angle as the inner shaft 144. The teeth of the bevel gears 188, 190 and gears 180, 186 are accurately shaped to minimize an amount of gear backlash, so that the desired suction nozzle 158 can be positioned at the operating position with high accuracy by rotation of the servomotor 192 by the determined angle.

When only the inner shaft 144 is rotated, the sleeve 138 is prevented from rotating by engagement of the engaging boss and cutout 220, 238, so that the sleeve 138 is not rotated through friction between the sleeve 138 and the inner shaft 144, that is, so that the nozzle holder 154 is rotated about the horizontal axis which extends in the radial direction of the stationary shaft 66 and which is parallel to the plane of the rotary plate 70.

During an operation to select the desired suction nozzle 158, the elevator 210 is held in its lower stroke end position with the cam follower roller 218 held in rolling contact with the level region of the cam surface 250 of the cam 248, so that the inner shaft 144 and the sleeve 138 are held disengaged from each other. After the desired suction nozzle 158 has been selected, the roller 218 is brought into contact with the upwardly inclined region of the cam surface 250. As the rotary plate 70 is further rotated, the elevator 210 is gradually elevated by the compression coil spring 224. As a result, the teeth 242 of the driven member 232 are brought into engagement with the toothed peripheral portion 200 of the drive member 202, and the engaging boss 220 is disengaged from the engaging cutout 238, whereby the sleeve 138 and the inner shaft 144 are connected to each other for simultaneous rotation, and the sleeve 138 is disengaged from the elevator 210. The teeth 242 are brought into engagement with the toothed peripheral portion 202 before the boss 220 is disengaged from the cutout 238. Since the sleeve 138 is prevented from rotating during rotation of the inner shaft 144 to select the suction nozzle 158, the teeth 242 can engage the toothed peripheral portion 200 of the drive member 202 which has been rotated during the operation to select the suction nozzle 158. Since the bevel gears 188, 190 have the same diameter and the gears 180, 186 have the same diameter, the nozzle holder 154 is rotated by the same angle as the inner shaft 144 during a nozzle selecting operation to select the suction nozzle 158. The toothed peripheral portion 200 consists of six grooves. The angular phase of the toothed peripheral portion 200 in which the teeth 200 engage the portion 200 after the nozzle selecting operation is offset from that before the nozzle selecting operation, by the angle of rotation of the nozzle holder 154 during this operation.

The selection of the desired suction nozzle 158 as described above is effected before the electronic component 164 is sucked up by the component holder head 120. When the rotary plate 70 reaches the component sucking position, the desired suction nozzle 158 for holding the next component 164 has been placed in the operating position. At this time, the head 120 is placed in the original circumferential position. When the angular position of the electronic component 164 as held by the suction nozzle 158 is corrected, the head 120 is rotated from the original circumferential position in the forward or reverse direction.

As described above, the nozzle rotating/selecting servomotor 192 provided on the component holder head 120 is used as the drive source for selecting the desired suction nozzle 158 and for removing an angular positioning error of the component 164 held by the head 120. This arrangement makes it possible to effect the above operations during rotation of the component holder head 120 about the stationary shaft 66, and allows for a relatively long time in which these operations should be completed. Accordingly, the present arrangement is effective to reduce the angular velocity upon rotation of the suction nozzle 158 about its axis, and prevent or minimize the vibration which would take place during the operations to select the suction nozzle 158 and correct the angular position of the component 164. The present arrangement is also effective to increase the maximum angle of rotation of the nozzle holder 154. Further, since the servomotor 192 is used not only as the drive source for selecting the suction nozzle 158 but also as the drive source for correcting the angular position of the component 164, these operations can both be performed during movement of the head 120 about the stationary shaft 66, whereby the electronic component transferring and mounting apparatus 12 can be simplified in construction, and manufactured with a reduced weight and at a reduced cost.

Figure 8:
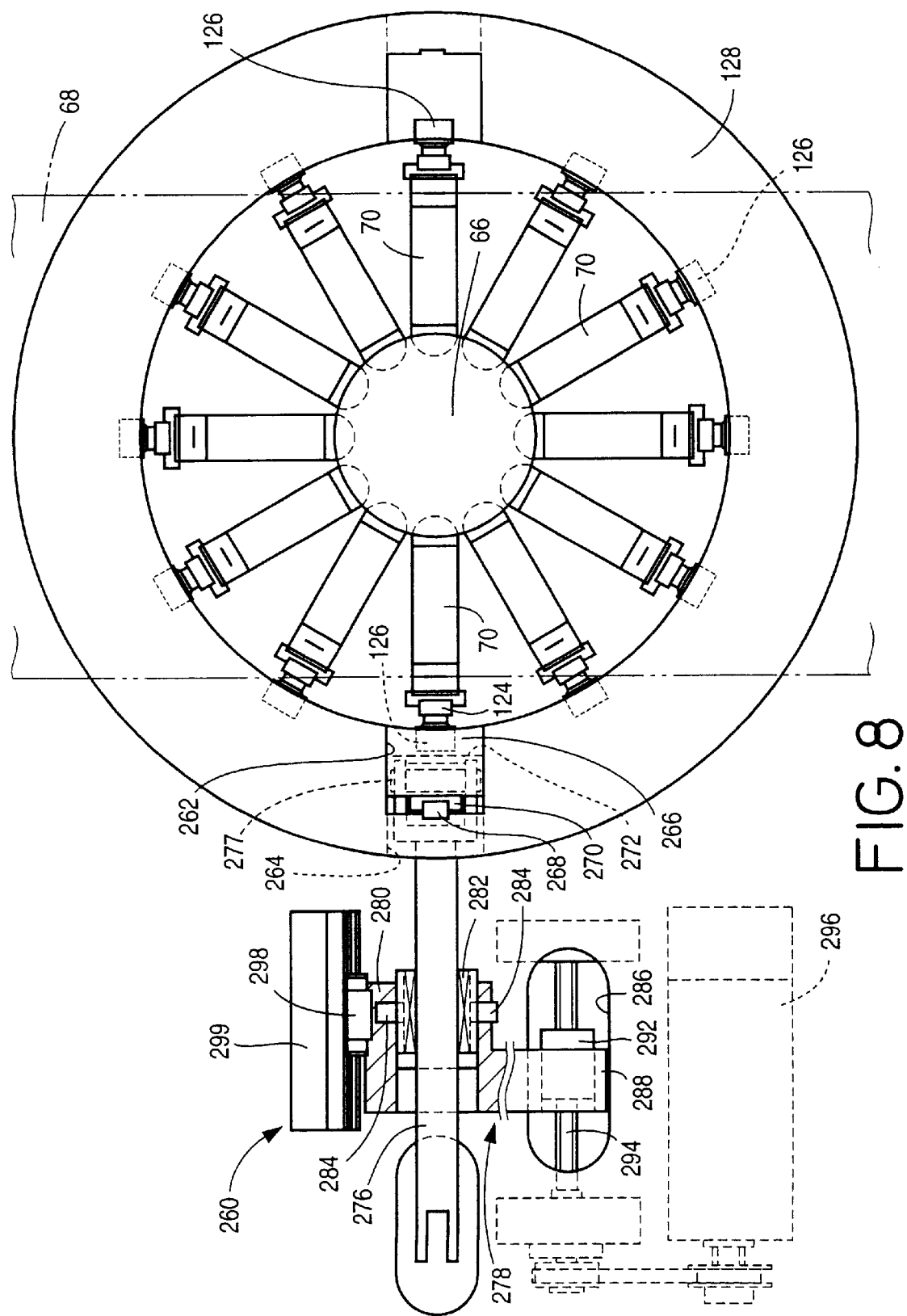
FIG. 8 is a bottom plan view showing a head elevating and lowering device and a stationary cylindrical cam in the transferring and mounting apparatus.

At two positions corresponding to the component sucking and mounting positions of the frame 60, there are disposed two head elevating and lowering devices 260 as shown in FIGS. 2 and 8. More precisely, these figures show the head elevating and lower device 260 disposed at the position corresponding to the component mounting position. FIG. 8 is a bottom plan view of the device 260 as seen from under the frame 60. Since the two head elevating and lower devices 260 have the same construction, the device 260 at the position corresponding to the component mounting position of the frame 60 will be explained.

The stationary cylindrical cam 128 has an engaging groove 262 formed at a circumferential position thereof corresponding to the component mounting position. This groove 262 is open in the inner circumferential surface and the upper and lower surfaces of the cylindrical cam 128, as shown in FIGS. 2 and 8. The cam 128 further has a radial opening 264, which is formed through an upper part of a radially outer portion of the cam 128 in the radial direction, for communication with the engaging groove 262. A vertically movable member 266 is vertically movably received in the groove 262. The cam 128 further has a guide member in the form of a straight guide rail 268 formed on the bottom wall of the groove 262 in the vertical direction (in the axial direction of the cam 128). On the other hand, a pair of guide blocks 270 is fixed to the vertically movable member 266. These guide blocks 270 slidably engage the guide rail 268.

A lower portion of the vertically movable member 266 has a circumferential dimension (as measured in the circumferential direction of the cylindrical cam 128), which is determined to provide a small clearance between the lower portion and the inner surfaces of the groove 262, for permitting the vertically movable member 266 to move vertically in the groove 262. A groove 272 is formed through this lower portion of the vertically movable member 266, such that the groove 272 is open in the inner surface of the member 266 corresponding to the inner circumferential surface of the cylindrical cam 128, and extends in a horizontal plane in a direction parallel to a tangent line at a circumferential point of the cam groove 130 corresponding to the component mounting position.

The vertically movable member 266 has an upper portion whose circumferential dimension is smaller than that of the lower portion described above. This upper portion is pivotably connected at an upper part thereof to a forked end portion of a pivotal member in the form of a lever 276 through a shaft member in the form of a pin 277. The lever 276 extends through the radial opening 264 and projects radially outwardly from the outer circumferential surface of the cam 128. The lever 276 is supported at an intermediate portion thereof by a support portion 280 of a support member 278 through a bearing 282 such that the support member 278 is moved relative to the lever 276 in the longitudinal direction of the lever 276. The bearing 282 has two support pins 284 formed on two side surfaces thereof parallel to the longitudinal direction of the lever 276, such that the support pins 284 extend perpendicularly to the longitudinal direction of the lever 276, as shown in FIG. 8. These support pins 284 function as a shaft portion which rotatably engages the support portion 280 of the support member 278, so that the lever 276 is pivotable together with the bearing 282, about the axis of the support pins 284.

As shown in FIG. 8, the support member 278 has an arm portion 288 extending horizontally from the support portion 280 into the interior of the frame 60 through an elongate hole 286 formed through the frame 60. The arm portion 288 carries a nut 292 fixed at its free end within the frame 60.

The nut 292 engages a feed screw 294, which is rotated by a drive source in the form of a head stroke adjusting servomotor 296 for moving the support member 270 in the longitudinal direction of the lever 276. A movement of the support member 278 in the longitudinal direction of the lever 276 causes a longitudinal movement of the bearing 282 and the support pins 284 relative to the lever 276, whereby the pivoting axis of the lever 276 is changed in the longitudinal direction of the lever 276, to thereby change the vertical stroke of the vertically movable member 266. Thus, the feed screw 294 and the servomotor 296 constitute a major portion of a device for changing the vertical stroke of the vertically movable member 266. A guide block 298 is fixed to the support portion 280. This guide block 298 is in sliding contact with a guide rail 299 fixed to the frame 60, so that the support member 278 is guided by the guide block 298 and the guide rail 299.

As shown in FIG. 2, a generally L-shaped lever 300 is rotatably supported by a shaft 302 fixed to the frame 60. The lever 300 has an arm 303 whose free end is pivotally connected to an upper end portion of a connecting member in the form of a rod 304 through a shaft member in the form of a pin 306. The upper end portion of the rod 304 is movable relative to the pin 306 in the axial direction of the pin 306. The rod 304 extends through an elongate hole 305 formed through the mounting structure 62, and the lower end of the rod 304 is pivotally connected through a pin 308 to an end portion of the lever 276 remote from the end portion connected to the vertically movable member 266.

The generally L-shaped lever 300 has another arm 312 which carries a cam follower roller 314 pivotally attached at its free end portion. The lever 300 is biased by biasing means in the form of an elastic member in the form of a tension coil spring 316 so that the cam follower roller 314 is held in rolling contact with a cam surface 320 of a head elevating and lowering cam 318 which is rotatably attached to the frame 60.

The head elevating and lowering cam 318 is supported by a support shaft 322 which is rotatably supported by the frame 60. As shown in FIG. 3, a timing pulley 324 is fixedly mounted on the support shaft 322, and the timing pulley 324 is connected through the timing belt 112 to the timing pulley 110 fixed to the output shaft of the main drive servomotor 108. Thus, the head elevating and lowering cam 318 is driven by the same servomotor 108 as used for driving the concave globoidal cams 90*a*–90*d*. The diameter of the timing pulley 324 is determined so that the cam 318 is rotated through 360° for a component mounting time interval equal to a time interval at which the rotary plates 70 are successively stopped at the component mounting position.

While FIG. 2 shows that the head elevating and lowering cam 318 has a cam surface 320 which has a circular shape, the cam 318 actually has a heart-like shape in cross section, so that a rotary motion of the cam 318 causes the lever 300 to be pivoted to vertically move the rod 304 for thereby pivoting the lever 276 so as to vertically move the vertically movable member 266. Since the rod 304 and the vertically movable member 266 are connected to the opposite ends of the lever 276 on the opposite sides of the support pins 284, the member 266 is moved down while the rod 304 is moved up, and vice versa. The lowermost and uppermost positions of the rod 304 are determined by the profile of the cam surface 320. Described more specifically, the lowermost position of the rod 304 is adjusted by adjusting the axial position of the rod 304 so that the groove 272 formed through the vertically movable member 266 is aligned or contiguous with the cam groove 130 in the cylindrical cam 128 in the vertical direction, so as to form a horizontal groove, and so that the lever 276 has a horizontal attitude parallel to the feed screw 294 and the guide rail 299 when the rod 304 is placed in the lowermost position. The uppermost position of the vertically movable member 266 is determined by the lowermost position of the rod 304 determined as described above. In the uppermost position of the vertically movable member 266, this member 266 cooperates with the adjacent portions of the cam groove 130 to hold the component holder head 120 at the uppermost position for a predetermined time. To mount the electronic component 164 on the printed-circuit board 38 when the rotary plate 70 is located at the component mounting position of the cylindrical cam 128, the vertically movable member 266 disposed at the position corresponding to the component mounting position is first lowered from the uppermost position to the lowermost position and then elevated back to the uppermost position. The member 266 is held at the uppermost position at the positions other than the component mounting position.

As is apparent from the above description, the lever 276 is parallel to the guide rails 299 for guiding the support member 278 when the vertically movable member 266 is placed in the uppermost position with the rod 304 moved to the lowermost position. In this condition, the support member 278 is moved as needed, in the direction parallel to the guide rails 299, to change the position of the pivoting axis of the lever 276. Thus, the operating stroke of the vertically movable member 266 can be changed by changing the lowermost position of the member 266, without changing the uppermost position of the member 266.

Figure 9:
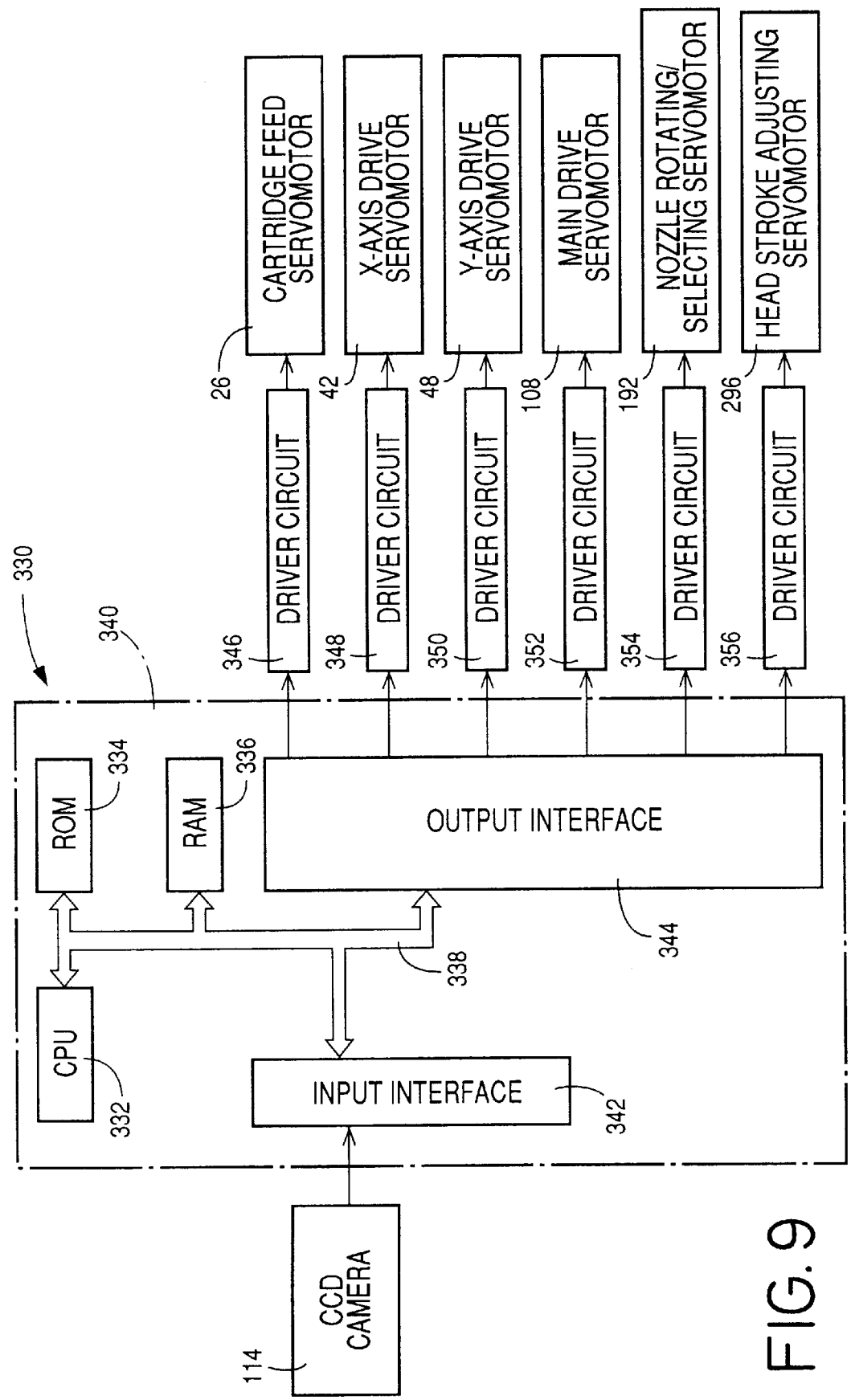
FIG. 9 is a block diagram illustrating a part of a control device for controlling the present electronic component mounting system, which part relates to the present invention.

The electronic component transferring and mounting apparatus 12 is controlled by a control device 330 illustrated in the block diagram of FIG. 9. The control device 330 is constituted principally by a computer 340 incorporating a central processing unit (CPU) 332, a read-only memory (ROM) 334, a random-access memory (RAM) 336, and a bus 338 connecting these elements 332, 334, 336. To the bus 338, there is connected an input interface 342 which receives an output of the CCD camera 114. Also connected to the bus 338 is an output interface 344 which is connected to the cartridge feed servomotor 26, X-axis drive servomotor 42, Y-axis drive servomotor 48, main drive servomotor 108, nozzle rotating/selecting servomotor 192 and head stroke adjusting servomotor 296, through respective driver circuits 346, 348, 350, 352, 354 and 356. The ROM 334 stores various control programs such as those for sucking up the electronic component 164, taking an image of the component 164 and mounting the component 164 on the printed-circuit board 38.

When the electronic components 164 are mounted on the printed-circuit board 38 in the electronic component mounting system including the transferring and mounting apparatus 12, the four concave globoidal cams 90a–90d are concurrently rotated by the main drive servomotor 108 to rotate and stop the twelve rotary plates 70 such that the acceleration, deceleration, constant-velocity movement and stopping of the rotary plates 70 are effected independently of each other. The rotary plates 70 are stopped at the component sucking position, image taking position and component mounting position, so that the electronic components 164 are sucked up by the heads 120 at the component sucking position, subjected to an image taking operation at the image taking position, and mounted on the board 38 by the heads 120 at the component mounting position.

The operation for the component holder head 120 to hold the electronic component 164 will be first explained.

When a given rotary plate 70 is rotated about the stationary shaft 66 toward the component sucking position, the cam follower roller 126 in rolling contact with the cam groove 130 is moved into the groove 272 formed through the vertically movable member 266 received in the groove 262 formed in the cylindrical cam 128. The roller 126 is moved from the cam groove 130 into the groove 272 before the rotary motion of the rotary plate 70 to the component sucking position is completed. After the cam follower roller 126 has been moved into the groove 272 and before the rotary plate 70 is stopped at the component sucking position, a downward movement of the vertically movable member 266 from the uppermost position is initiated, whereby the roller 126 is lowered as the member 266 is lowered. As a result of the downward movement of the roller 126, the vertical slide 124 is lowered, and the component holder head 120 is accordingly lowered. Thus, a movement of the head 120 about the stationary shaft 66 and a downward movement of the head 120 are effected contemporaneously.

As a result of the downward movement of the head 120, the suction tube 162 of the suction nozzle 158 is brought into contact with the upper surface of the electronic component 164, and the switching device 178 is switched to a position in which the electronic component 164 is attracted under suction to the lower end of the suction tube 162. The rotary plate 70 has been stopped at the component sucking position when the suction tube 162 is brought into contact with the electronic component 164, so that the component 158 can be attracted to the suction tube 162 with high reliability. After the component 164 is sucked up by the head 120, the vertically movable member 266 is moved up, and the cam follower roller 126 is accordingly moved up, whereby the vertical slide 124 is elevated to elevate the head 120, so that the component 164 sucked up by the suction nozzle 158 is picked up from the cartridge 22.

After the component 164 is picked up from the cartridge 22 by the head 120, the rotation of the rotary plate 70 about the stationary shaft 66 is resumed before the vertically movable member 266 has reached its uppermost position and before the groove 272 has been aligned with the cam groove 130. The roller 126 is elevated in rolling contact with the groove 272 in the member 266, and is moved from the groove 272 into the cam groove 130 of the cylindrical cam 128 immediately after the member 266 has reached the uppermost position. Thus, the head 120 is simultaneously elevated and rotated after the component 164 is sucked up from the cartridge 22.

Upon sucking of the electronic component 164, the vertical stroke of the head 120 is changed as needed if necessary, depending upon the height dimension or level of the upper surface of the electronic component 164. The upper surfaces of the electronic components 164 may have different levels depending upon the height dimensions of the components 164, where a component accommodating portion of a component holder tape in the component supply cartridge 22 is supported by a body of the cartridge 22 which is located below the component accommodating portion.

The component holder tape has a multiplicity of component accommodating recesses in which the components 164 are accommodated. These recesses are closed by an upper covering tape to prevent removal of the components 164 from the recesses. The thickness of the component holder tape increases with an increase in the height dimension of the components 164. However, the height of the tape guiding surface of the body of the cartridge 22 is constant, so that the level of the upper surface of the component 164 is raised as the height dimension of the component 164 increases.

Consequently, the vertical stroke of the component holder head 120 should be reduced with an increase in the height dimension of the electronic component 164 to be sucked up by the head 120. This adjustment of the vertical operating stroke of the head 120 is effected before the component 164 is sucked up by the suction nozzle 158. To this end, the head stroke adjusting servomotor 296 is actuated to move the support member 278 in the longitudinal direction of the lever 276, for thereby changing the position of the pivoting axis of the lever 276. For reliable attraction of the component 164 to the suction tube 162 of the suction nozzle 158, the vertical stroke of the head 120 is accurately determined on the basis of not only the distance between the lower end face of the suction tube 162 of the head 120 and the upper surface of the component 164, but also a height error of the component 164 due to a positioning error associated with the electronic component supply device 12. An excessive downward movement of the suction nozzle 158 may be accommodated or absorbed by compression of the coil spring 160 biasing the suction nozzle 158.

After the electronic component 164 has been held by the head 120, the rotary plate 70 is rotated to the image taking position, at which the rotary plate 70 is stopped so that the component 164 sucked up by the suction nozzle 158 is held stationary. In this condition, an image of the component 164 is taken by the CCD camera 114. On the basis of an output of the CCD camera 114, an angular position error, and X-axis and Y-axis position errors of the component 164 are calculated. The angular position of the component 164 is adjusted to remove the angular position error before the rotary plate 70 has reached the component mounting position. To this end, the nozzle rotating/selecting servomotor 192 is actuated to rotate the sleeve 138 and the inner shaft 144 so that the suction nozzle 158 placed in the operating position is rotated about its axis to rotate the component 164 by an angle suitable to remove the angular position error.

Before an operation to mount the electronic component 164 on the printed-circuit board 38, an image of a fiducial mark provided on the board 38 is taken to calculate X-axis and Y-axis positioning errors of the board 38 for each of the component mounting positions. When the electronic components 164 are mounted on the printed-circuit board 38, the board 38 is moved in the X-axis and Y-axis directions, so that the locations at which the electronic components 164 are mounted are right under the component holder head 120 located at the component mounting position. On the basis of the calculated positioning errors of the board 38 and the X-axis and Y-axis position errors of the component 164, the distances of movement of the board 38 in the X-axis and Y-axis directions are adjusted to mount the component 164 at the nominal X-axis and Y-axis positions on the board 38.

When the rotary plate 70 is rotated toward the component mounting position, the cam follower roller 126 is moved from the cam groove 130 of the cylindrical cam 128 into the groove 272 in the vertically movable member 266 at the component mounting position. After the roller 126 has entered the groove 272 and before the rotary plate 70 has reached the component mounting position, a downward movement of the vertically movable member 266 is initiated to lower the component holder head 120 while the head 120 is rotated toward the component mounting position. The rotary plate 70 has been stopped at the component mounting position before the component 164 is mounted on the printed-circuit board 38. Namely, the head 120 is further lowered to mount the component 164 at the predetermined point on the board 38 after the rotary plate 70 has reached the component mounting position.

The vertical operating stroke of the head 120 is changed depending upon the height dimension of the component 164 when the component 164 is mounted on the board 38. The stroke of the head 120 is reduced as the height dimension of the component 164 increases. Precisely, the stroke of the head 120 should accommodate positioning errors such as dimensional and positioning errors in the manufacture of the board supporting and positioning device 16, for example, so that the electronic components 164 can be accurately mounted on the board 38. After the component 164 has been placed at the predetermined point on the board 38, the switching device 178 is switched to a position to stop the application of a vacuum pressure to the suction nozzle 158, whereby the component 164 is released from the suction nozzle 158. After the component 164 is mounted on the board 38, the vertically movable member 266 is elevated to elevate the head 120. In this case, too, the rotation of the rotary plate 70 is resumed before the member 266 has reached the uppermost position, so that the roller 127 is elevated while it is moved in rolling contact with the groove 272. Immediately after the vertically movable member 266 has reached the uppermost position, the roller 126 is moved into the cam groove 120, and the rotary plate 70 is rotated toward the component sucking position.

While the rotary plate 70 is rotated from the component mounting position toward the component sucking position, the sleeve 138 is rotated in the direction opposite to the direction in which the sleeve 138 was rotated to correct the angular position of the component 164 before mounting thereof on the board 38. The amount of rotation of the sleeve 138 at this time is the same as that for correcting the angular position of the component 164, so that the sleeve 138 and the head 120 are returned to their original circumferential position.

In the event of some error at the component sucking position, the vertical stroke of the vertically movable member 266 at the component mounting position is reduced to a smallest value to avoid drawbacks described below. Such component sucking error may be a failure of the suction nozzle 158 to pick up the component 164, an erroneous operation of picking up of the wrong component 164, or an excessively large error of the angular position of the sucked component 164 that cannot be removed. In such event, the vertical stroke of the head 120 is reduced to a smallest value to prevent abutting contact of the suction nozzle 162 of the suction nozzle 158 (without the component 164 being attracted thereto) or the wrong component 164 with the printed-circuit board 38 when the head 120 is lowered to the lowermost position at the component mounting position. In this case, the switching device 178 is not switched at the component mounting position, and the vacuum pressure is kept applied to the suction nozzle 158, so that the component 164 is carried by the head 120 to the component discarding area. In the component discarding area, the switching device 178 is actuated to stop of the application of the vacuum pressure to the suction nozzle 158, for discarding the component 164 into the component container. Where the suction nozzle 158 fails to pick up the electronic component 164, this failure may be detected on the basis of the image taken at the image taking position. In this case, the switching device 178 is actuated to stop the application of the vacuum pressure to the suction nozzle 158.

When the rotary plate 70 is further rotated, the cam follower roller 218 provided on the elevator 210 is brought into engagement with the cam surface 250 of the nozzle selecting cam 248, so that the sleeve 138 is disconnected from the inner shaft 144. If the kind of the suction nozzle 156 is changed, the nozzle rotating/selecting servomotor 192 is operated to rotate the nozzle holder 154 so that the suction nozzle 156 to be used next is brought into the operating position.

Figure 10:
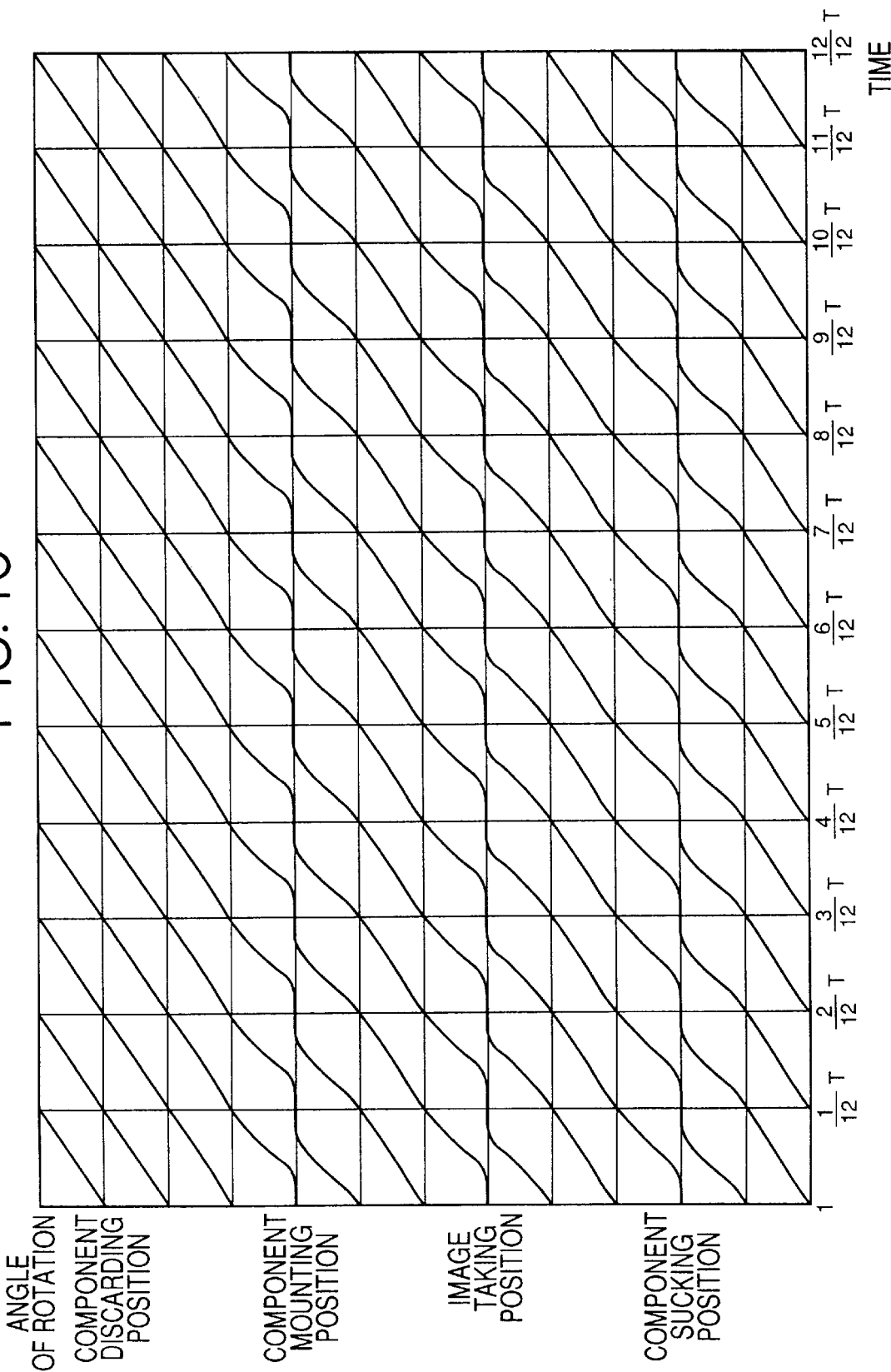
FIG. 10 is a timing chart indicating a relationship between the rotating angle of the twelve rotary plates and the time in the transferring and mounting apparatus.

As described above, there are three stop positions at which the rotary plate 70 is stopped. Between the component sucking position and the image taking position, and between the image taking position and the component mounting position, the rotary plate 70 is rotated through 90°, with acceleration, constant-velocity movement and deceleration. Between the component mounting and sucking positions, the rotary plate 70 is rotated through 180° at a constant velocity. The timing chart of FIG. 10 shows a relationship between the time and the angle of rotation of each of the twelve rotary plates 70. In FIG. 10, "T" represents the time required for each rotary plate 70 to be rotated through 360°, and this time is taken along the abscissa, with a graduation unit being equal to T/12 in view of the twelve rotary plates 70. On the other hand, the angle of rotation of the rotary plate 70 is taken along the ordinate, with a graduation unit being equal to an angular spacing pitch of the twelve rotary plates 70 or heads 120. The time-angle relationship of each rotary plate 70 is expressed by a line having a straight portion, an upwardly curved or convex portion and a downwardly curved or concave portion. The straight portion indicates the constant-velocity movement of the rotary plate 70. The convex portion indicates the deceleration of the rotary plate 70, while the concave portion indicates the acceleration of the rotary plate 70. It will be understood from the timing chart of FIG. 10 that the individual rotary plates 70 are rotated independently of each other so that the nine rotary plates 70 can be rotated about the stationary shaft 66 while the three rotary plates 70 are held stopped at the component sucking, image taking and component mounting positions, for the corresponding heads 120 to pick up and mount the components 164, and for the CCD camera 114 to take an image of the component 164.

The present electronic component transferring and mounting apparatus 12 having the twelve component holder heads 12 has only three stop positions, so that the required acceleration and deceleration values of the heads 120 can be reduced, as compared with those in the conventional component transferring device in which a plurality of component holder heads are carried by an intermittently rotated rotary table. Suppose the conventional rotary table carries twelve heads arranged along a circle whose diameter is the same as that of the circle along which the heads 120 are rotated, and suppose the time required for one full rotation of the conventional rotary table is the same as the time T in the present apparatus 12, the required acceleration and deceleration values of the heads 120 in the present apparatus 12 are smaller than those in the conventional apparatus using the conventional rotary table. The reason for this will be described below.

Figures 1, 11A:
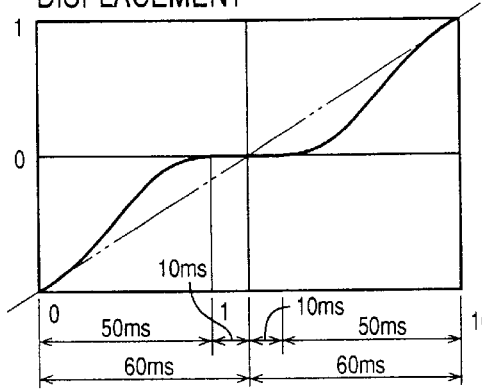
Figures 1, 11B:
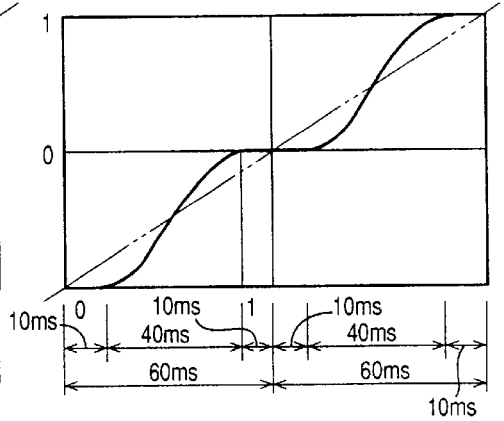
Figures 2, 11A:
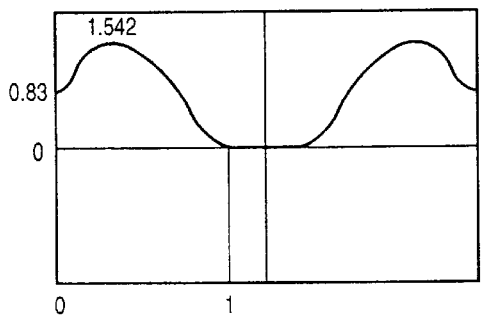
Figures 2, 11B:
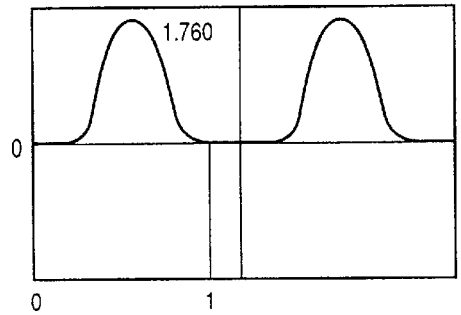
Figures 3, 11A:
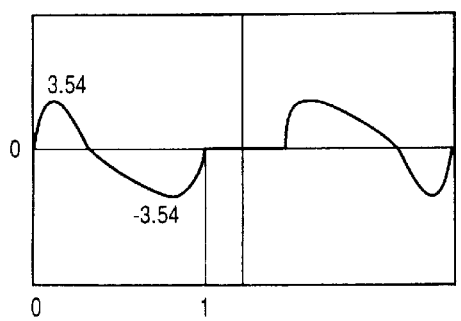
Figures 3, 11B:
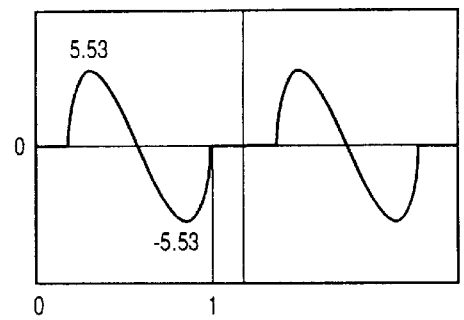

Each of FIGS. 11A-1 through 11A-3 shows four adjacent blocks of FIG. 10 according to the present embodiment, wherein a stop position of the component holder head 120 is indicated in the vicinity of an intersection of two mutually perpendicular partition lines of the blocks. Each of FIGS. 11B-1 through 11B-3 shows the corresponding four adjacent blocks according to the conventional apparatus. Two-dot chain lines (inclined straight lines) in FIGS. 11A-1 and 11B-1 indicate a continuous movement of the component holder head 120 as indicated in the other four adjacent blocks of FIG. 10 which do not include a stop position. When the head 120 in the present apparatus 12 is stopped at the stop position at the end of a rotary movement thereof corresponding to the angular spacing pitch of the rotary plates 70 or heads 120, the head 120 is initially moved at a constant velocity which is represented by the gradient or angle of inclination of the inclined straight two-dot chain line in FIG. 11A-1. Then, the head 120 is accelerated as indicated by an initial portion of a solid line in FIG. 11A-1 which initial portion is located above the two-dot chain line. By this acceleration, the amount of angular displacement of the head 120 is larger than that by the constant-velocity movement represented by the two-dot chain lines. Finally, the head 120 is decelerated and eventually stopped at the stop position. Thus, the acceleration is effected to compensate for a sum of a time corresponding to a difference between the average velocity during the deceleration period and the constant velocity represented by the two-dot chain lines, and a time during which the head 120 is held stopped as represented by a horizontal portion of the solid lines. When a rotary motion of the head 120 is resumed after stopping at the stop position, the sequence of events (acceleration, constant-velocity movement and deceleration) is reversed with respect to the sequence where the head 120 is stopped.

In the conventional apparatus in which the component holder heads are carried by the intermittently rotated rotary table, each head should be stopped at all of the stop positions. During a movement of the head corresponding to the angular spacing pitch, therefore, the head is initially accelerated from the zero velocity, and is then decelerated to the zero velocity to be stopped at each stop position, as indicated by a solid line in the lower left block in FIG. 11B-1. To complete the movement of the head corresponding to the angular spacing pitch within the same time as in the present apparatus 12, the maximum velocity of the head in the conventional apparatus as indicated in FIG. 11B-2 should be higher than that of the head 120 in the present apparatus 12 as indicated in FIG. 11A-2. Accordingly, the acceleration and deceleration values of the head in the conventional apparatus as indicated in FIG. 11B-3 should be higher than those of the head 120 as indicated in FIG. 11A-3. Thus, the required condition of movement of the head 120 in the present electronic component transferring and mounting apparatus 12 is more moderate than that in the conventional apparatus. Accordingly, the present apparatus 12 is required to have a comparatively low degree of structural rigidity, and the required capacity of the main drive servomotor 108 for rotating the rotary plates 70 can be significantly reduced, provided the component transferring efficiency of the present apparatus 12 is the same as that of the conventional apparatus. Therefore, the cost of manufacture of the present apparatus 12 can be reduced, or the accuracy of positioning of the heads 120 at the stop positions can be improved.

Conversely, the operating efficiency of the present apparatus 12 can be improved by reducing the time of movements of the heads 120 corresponding to the angular spacing pitch of the heads 120 or rotary plates 70, namely, by reducing the time interval at which the successive rotary plates 70 sequentially reach a given stop position.

In the conventional apparatus in which the rotary table carrying the heads is intermittently rotated stopping at each stop position, each head should be accelerated from zero and decelerated to zero each time the head is moved between the adjacent stop positions at which the head is held stopped for a given time, as described above. Suppose the time required for the movement corresponding to the angular spacing pitch is 60 ms and the stop time is 20 ms, the time of the movement by acceleration and deceleration is 40 ms.

Therefore, the average velocity of the head should be increased as compared with that in the present apparatus 12.

Figure 12:
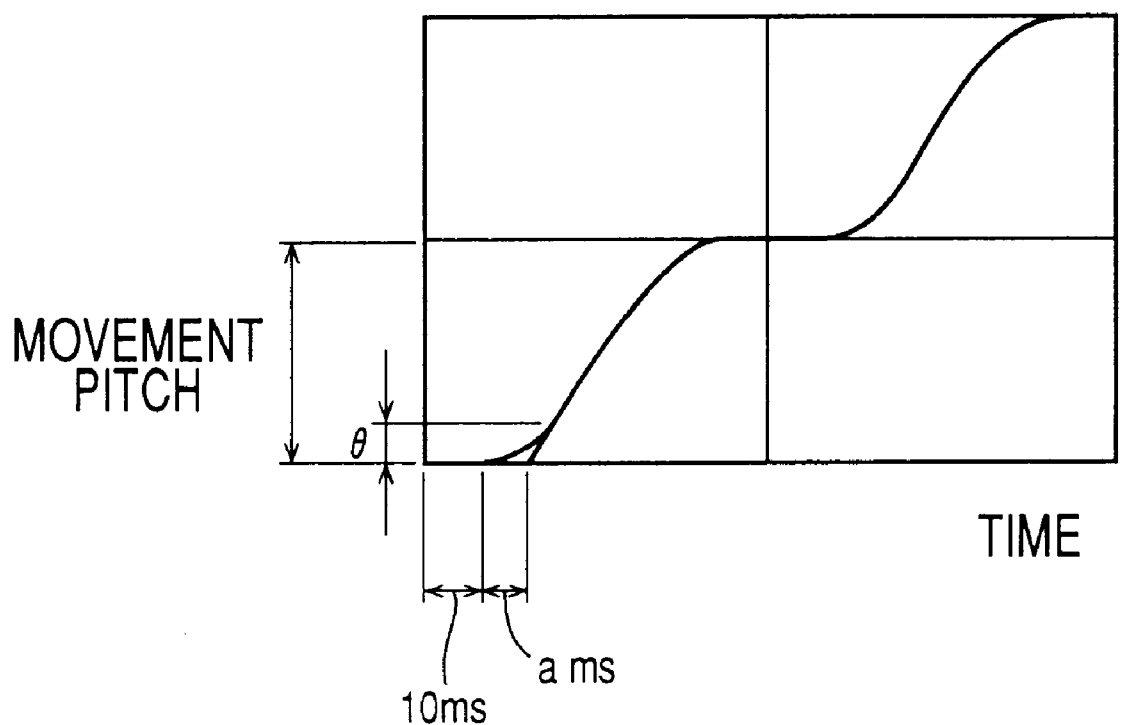
FIG. 12 is a graph for explaining reduction in the time required for one pitch of rotary movement of the rotary plate to the stop position in the present transferring and mounting apparatus.

In the present apparatus 12, the stop positions are provided at every two or five angular spacing positions which are evenly spaced from each other about the stationary shaft 66. Each head 120 is moved at a constant velocity into a given angular spacing region between the non-stop position and the stop position, and is decelerated to be stopped at the stop position. Therefore, a comparatively longer time of 50 ms is allowed for the actual movement. Accordingly, the overall time corresponding to the angular spacing pitch can be reduced by a time which is substantially equal to a sum of a half (10 ms) of the stop time (20 ms) and a difference between the time required for the accelerating movement by an angle $\theta$ and the time required for the constant-velocity movement by the same angle, as indicated in FIG. 12. Consequently, the required time of movement of the head 120 corresponding to the angular spacing pitch can be reduced by a time corresponding to the above-indicated sum, and the component mounting efficiency can be accordingly increased. For instance, the conventionally required time of 90 ms corresponding to the angular spacing pitch can be reduced to as short as 60 ms in the present electronic component transferring and mounting apparatus 12.

The present apparatus 12 is further advantageous in that the twelve component holder heads 120 are held by the respective rotary plates 70, and are rotated independently of each other, whereby the mass that should be accelerated and decelerated can be reduced, making it possible to prevent an increase in the vibration and noise even if the acceleration and deceleration values of the mass (head 120) are increased. This results in a further decrease in the required time of movement of the head 120 corresponding to the angular spacing pitch.

In the conventional apparatus in which the rotary table carrying a plurality of component holder heads is intermittently rotated, the rotary table is generally provided with a plurality of cam follower rollers corresponding to the heads, and these rollers are sequentially brought into engagement with a roller gear cam, so that the rotary table is intermittently rotated. This arrangement requires a comparatively high degree of accuracy in the spacing pitch of the cam follower rollers, to prevent the rollers from exerting an excessive force on the surface of the cam, which may reduce the life expectancy of the rollers and cause vibration and noise. In the present apparatus 12, on the other hand, the individual rotary plates 70 has respective cam follower rollers 88 which engage the cam grooves 92 of the concave globoidal cams 90 for rotating the rotary plates 70. In this arrangement, the twelve cam follower rollers 88 engage the concave globoidal cams 90, independently of each other and without influencing each other, excessive forces will not act on the rollers 88 engaging the cams 90, whereby the life expectancy of the rollers is improved while the vibration and noise are reduced.

Referring next to FIGS. 13–24, there is shown an electronic component mounting system equipped with an electronic transferring and mounting apparatus according to another embodiment of this invention. In the present system, the electronic component transferring and mounting apparatus generally indicated at 380 in FIG. 13 uses two concave globoidal cams and a constant-velocity rotor for rotating twelve rotary members such that each rotary member is stopped at a component sucking position and a component mounting position, but is not stopped at an image taking position. The present apparatus is adapted such that two positions are available for each of the component sucking and mounting positions, and such that the height position of the component holder head upon a downward movement thereof at the component sucking and mounting positions and the height position of the electronic component at the image taking position can be changed in two steps. In the other aspects of the apparatus according to the present second embodiment, the present apparatus 380 is identical with the apparatus 12 of the first embodiment. The same reference numerals as used in the first embodiment will be used to identify the functionally corresponding elements, and redundant description of these elements of the present apparatus will not be provided.

Figure 13:
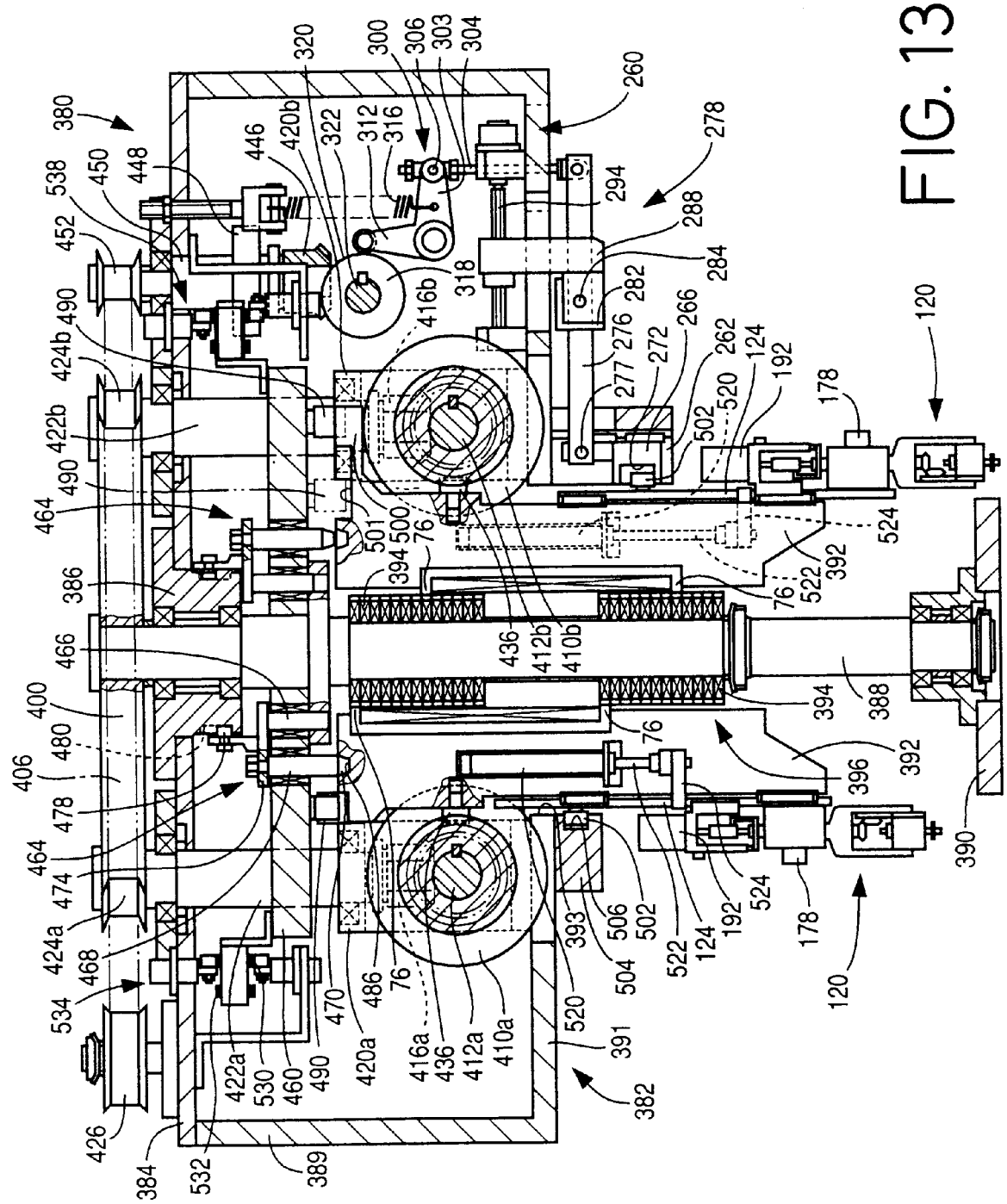
FIG. 13 is a front elevational view in cross section of an electronic component transferring and mounting apparatus in an electronic component mounting system constructed according to another embodiment of this invention.

The electronic component transferring and mounting apparatus 380 has a frame 382 including a support plate 384 to which an engaging cam 386 is fixed, as shown in FIG. 13. A support shaft in the form of a main shaft 388 is rotatably supported at its upper end portion by the engaging cam 386. The main shaft 388 extends downwards through an opening 393 formed through a bottom wall 391 of a mounting structure 389 of the frame 382, such that the lower end of the main shaft 388 is located outside and below the frame 382. The main shaft 388 is rotatably supported at its lower end portion by a support plate 390 secured to the base 10. Thus, the main shaft 388 is supported rotatably about a vertically extending axis thereof. On this main shaft 388, there are rotatably supported a plurality of rotary members in the form of twelve rotary plates 392 through respective twelve pairs of bearings 394. The rotary plates 392 are rotatable about a common axis, which is the axis of the main shaft 388.

The bearings 394 are identical with the bearings 72 in the first embodiment, and are arranged in two arrays 396 which are spaced apart from each other in the axial direction of the main shaft 388. Each array 396 consists of twelve bearings 394. The vacuum source is connected through a conduit (not shown) to a passage (not shown) formed through the main shaft 388, and this passage is connected through to the switching device 178. Since the main shaft 388 is rotated, the above-indicated conduit and the passage in the main shaft 388 are connected by a valve which permits communication between the conduit and the passage even while the main shaft 388 is rotated. The passage in the main shaft 388 is connected to the twelve switching devices 178 through respective hoses. A small angle of relative rotation of the switching device 178 and the rotary plate 392 is permitted by elastic deformation of the hose.

Figure 21:
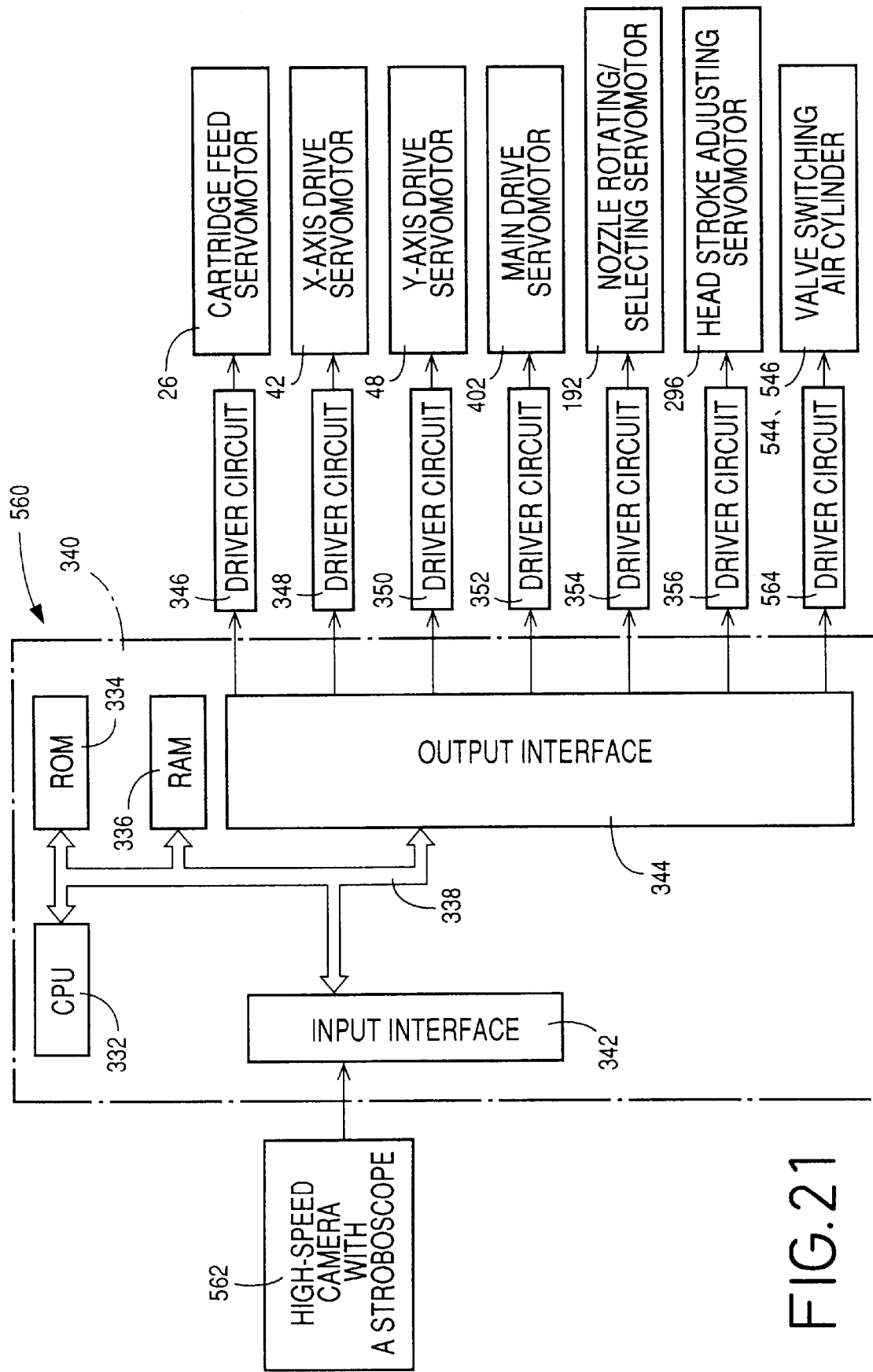
FIG. 21 is a block diagram showing a part of a control device for controlling the electronic component mounting system including the transferring and mounting apparatus of FIG. 13, which part relates to the present invention.

The upper end portion of the main shaft 388 projects upwards from the engaging cam 386, and has a timing pulley 400 fixed thereto. The timing pulley 40 is connected through a timing belt 406 (FIG. 14) to a timing pulley 404 which is fixed to an output shaft of a drive source in the form of a main drive servomotor 402 (FIG. 21). The timing pulley 40 is rotated at a predetermined constant speed by the servomotor 402.

Figure 14:
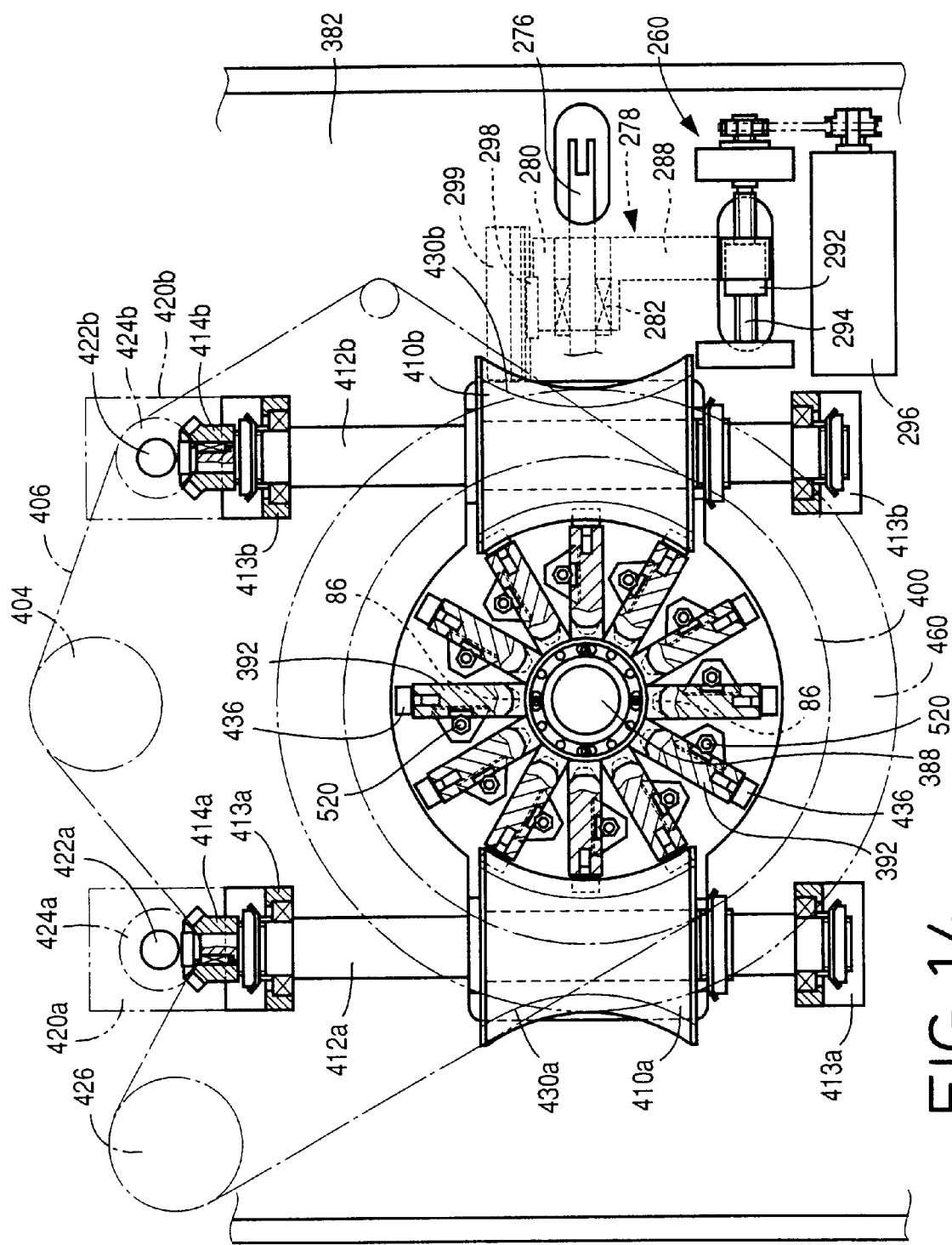
FIG. 14 is a plan view partly in cross section showing the transferring and mounting apparatus of FIG. 13, taken at a vertical position in which cam follower rollers of rotary plates engage concave globoidal cams.

Two concave globoidal cams 410*a*, 410*b* are disposed at respective positions of the frame 382 corresponding to the component sucking and mounting positions. As shown in FIGS. 13 and 14, these concave globoidal cams 410*a*, 410*b* are disposed symmetrically with each other with respect to the axis of the main shaft 388 such that axes of the cams 410 lie in a horizontal plane and are parallel to each other. The cams 410*a*, 410*b* are fixedly mounted on respective rotary shafts 412*a*, 412*b*, which are rotatably supported by respective pairs of brackets 413*a*, 413*b*. As shown in FIG. 14, each rotary shaft 412*a*, 412*b* has a bevel gear 414*a*, 414*b* fixed thereto at one end thereof. The bevel gears 414*a*, 414*b* mesh with respective bevel gears 416*a*, 416*b* (FIG. 13) which are rotatable about vertical axes. These bevel gears 414*a*, 414*b*, 416*a*, 416*b* have the same diameter.

As shown in FIG. 13, brackets 420a, 420b are fixed to the mounting structure 389 of the frame 382, and rotary shafts 422a, 422b are supported by the support plate 384 of the frame 382 and the brackets 420a, 420b such that the rotary shafts 422 are rotatable about vertical axes. The bevel gears 416a, 416b are fixedly mounted on the rotary shafts 422a, 422b, respectively. The upper end portions of the rotary shafts 422a, 422b project upwards from the support plate 384, and have respective timing pulleys 424a, 424b fixed thereto. These timing pulleys 424 are held in rolling contact with the timing belt 406, which is provided for transmitting a rotary motion of the main drive servomotor 402 to the main shaft 388 as described above. The timing belt 406 is also engaged with an idler timing pulley 426. In the present arrangement, the rotary shafts 422a, 422b are rotated by the main drive servomotor 402, so that the bevel gears 416a, 416b, 414a, 414b are rotated to rotate the concave globoidal cams 410a, 410b simultaneously in synchronization with each other.

The concave globoidal cams 410a, 410b have respective cam grooves 430a, 430b, which are formed to rotate the rotary plates 392 at the velocities described below. The cam grooves 430a, 430b are engageable with cam follower rollers 436 fixed to the respective rotary plates 392. Immediately after these rollers 436 have entered the cam grooves 430a, 430b, the rotary plates 392 are rotated at the same velocity as the main shaft 388. Then, the rotary plates 392 are accelerated for an increased rotary movement distance per unit time, and are then decelerated to be stopped at the component sucking or mounting position. During an operation to pick up or mount the electronic component at the sucking or mounting position, the appropriate rotary plate 392 is held stopped. After the operation, the rotary plate 392 is accelerated, and is then decelerated so that the velocity of the rotary plate 392 upon movement of the roller 436 away from the cam groove 430a, 430b is made equal to the velocity of the main shaft 388 and so that the angular interval of this rotary plate 392 with respect to the adjacent rotary plate 392 located downstream in the rotating direction is 30°.

Figure 15:
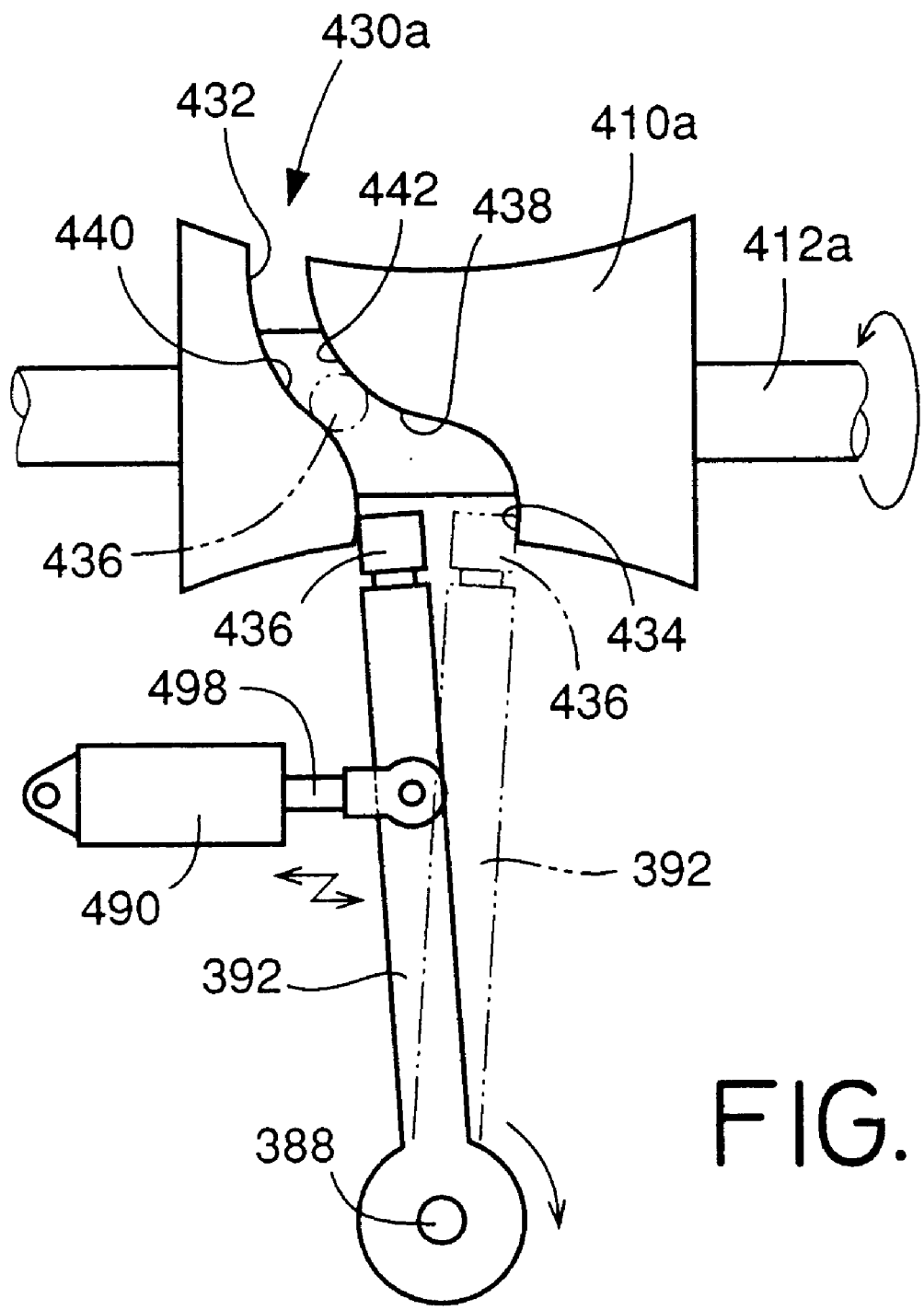
FIG. 15 is a view schematically showing a cam groove in one of the concave globoidal cams of FIG. 14, and the corresponding cam follower roller which is selectively brought into engagement with two side surfaces of a non-lead portion of the cam groove.
Figure 16:
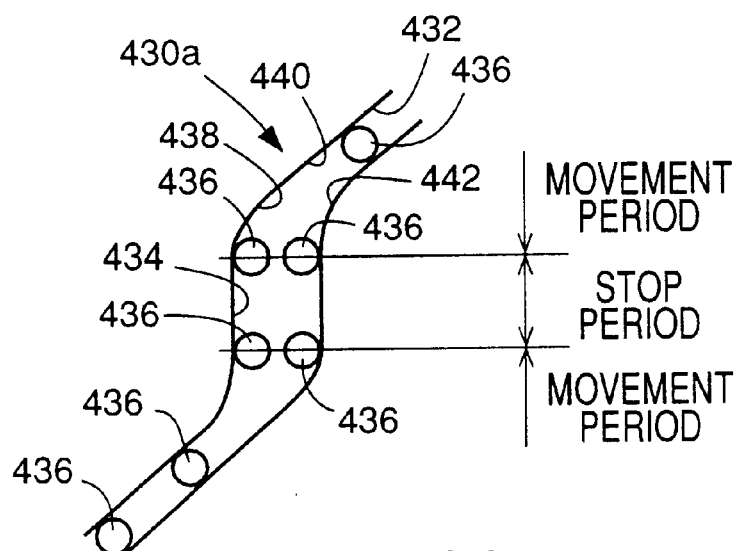
FIG. 16 is a view showing the cam groove of FIG. 15 in a developed state.

The cam groove 430a of the concave globoidal cam 410a is shown in FIGS. 15 and 16, by way of example. The cam groove 430a has an inclined portion 432 having a lead angle with respect to a plane perpendicular to the axis of rotation of the concave globoidal cam 410a, and a non-lead portion 434 which does not have such a lead angle and which is perpendicular to the axis of rotation. The inclined portion 432 has a comparatively small axial width as measured in the axial direction of the cam 410a, so that the cam follower roller 436 engages this narrow inclined portion 432 with a small amount of clearance to the side surfaces of the narrow inclined portion 432 in the diametric direction of the roller 436. The non-lead portion 434 has a larger axial width than the inclined narrow portion 432, so that this wide non-lead portion 434 permits the roller 436 to move in the axial direction. The cam groove 430a also has an intermediate width varying portion 438 between the narrow inclined portion 432 and the wide non-lead portion 434. The axial width of the width varying portion 438 gradually increases in the direction from the narrow inclined portion 432 toward the wide non-lead portion 434.

When the cam follower cam 436 is in engagement with the wide non-lead portion 434, the rotary plate 392 is held stopped. Since the axial width of the non-lead portion 434 is larger than the diameter of the roller 436, two positions, namely, first and second positions, are available as the actual stop position of the rotary plate 392. In the first position, the roller 436 is in contact with an upstream side surface 440 of the non-lead portion 434, as indicated in solid line in FIG. 15. In the second position, the roller 436 is in contact with a downstream side surface 442 of the non-lead portion 434. The side surfaces 440, 442 are located on the upstream and downstream sides, respectively, as viewed in the rotating direction of the rotary plate 392. One of the first and second positions is selected as the actual stop position (component sucking or mounting position). The concave globoidal cams 410a, 410b are disposed at the positions of the frame 382 corresponding to the component sucking and mounting positions, which are spaced apart from each other by 180°. The axial dimension of the non-lead portion 434 is determined so that the distance between the first and second positions in the X-axis direction is equal to 8 mm. The first and second positions selectively established as the component sucking position will be referred to as first and second sucking positions, while the first and second positions selectively established as the component mounting position will be referred to as first and second mounting positions.

The cam grooves 430a, 430b of the concave globoidal cams 410a, 410b are formed such that the rotary plate 392 is rotated at the same velocity as the main shaft 388 after the cam follower roller 436 is disengaged from the cams 410a, 410b, and the angular interval of this rotary plate 392 with respect to the next downstream rotary plate 392 is 30° when the roller 436 is disengaged from the cams 410, irrespective of whether the rotary plate 392 is stopped at the first or second component sucking or mounting position.

In the present electronic component transferring and mounting apparatus 380, the two head elevating and lowering devices 260 described above with respect to the first embodiment are disposed at the positions of the frame 382 corresponding to the component sucking and mounting positions. In FIGS. 13 and 14, only the device 260 corresponding to the component mounting position is shown. In the present apparatus 380, however, a hypoid gear (not shown) is fixedly and concentrically mounted on the support shaft 322 of the head elevating and lowering cam 318 of the head elevating and lowering device 260. This hypoid gear meshes with a hypoid gear 446 (FIG. 13) rotatably attached to the frame 382. These hypoid gears have the same diameter. The hypoid gear 446 is fixedly mounted on a rotary shaft 450 which is supported by the support plate 384 of the frame 382 and a bracket 448 fixed to the mounting structure 389 of the frame 382. The rotary shaft 450, which is rotatable about a vertical axis thereof, has a timing pulley 452 fixed to its upper end portion projecting upwards from the support plate 384. The timing pulley 452 is held in rolling contact with the above-indicated timing belt 406, so that a rotary motion of the main drive servomotor 402 is transmitted to the head elevating and lowering cam 318 through the hypoid gear 446, whereby the cam 318 is rotated.

Thus, the drive source in the form of the main drive servomotor 402 is commonly used for the main shaft 388, two concave globoidal cams 410a, 410b and head elevating and lowering cam 318. The diameter of the timing pulley 452 for rotating the cam 318 is determined so that the timing pulley 452 and the cam 318 are rotated through 360° during rotation of the main shaft 388 through 30°. The diameter of the timing pulleys 410a, 410b is determined so that these pulleys 410 are rotated through 180° during rotation of the main shaft 388 through 30°. Thus, the cam 318 is rotated one full turn within a time corresponding to the angular spacing pitch of the rotary plates 392, namely, each time the rotary plates 392 sequentially reach the component mounting position.

As shown in FIGS. 13 and 14, a constant-velocity rotary disc 460 is fixedly and concentrically mounted on a portion of the main shaft 388 between the engaging cam 386 and the upper array 396 of the bearings 394 to which the rotary plates 392 are fixed. The main shaft 388 and the constant-velocity rotary disc 460 cooperate to constitute a constant-velocity rotor. The constant-velocity rotary disc 460 is rotated at a predetermined constant velocity together with the main shaft 388. The rotary disc 460 carries engaging members in the form of twelve engaging pins 468 fixed thereto. These pins 468, which constitute an engaging device 464, are equi-angularly spaced from each other about the axis of the rotary disc 460.

The constant-velocity rotary discs 460 further carries guide members in the form of twelve guide pins 466. These guide pins 466 engage the rotary discs 460 such that the pins 466 are movable relative to the rotary discs 460 in the axial direction of the rotary discs 460. The engaging pins 468 are located radially outwardly of the guide pins 466, and engage the constant-velocity rotary disc 460 such that the pins 468 are movable relative to the rotary disc 460 in the axial direction of the disc 460. The lower portion of each engaging pin 468 projects downwards from the rotary disc 460, and has a tapered lower end 470 whose diameter decreases in the downward direction. The guide pin 466 and the corresponding engaging pin 468 are connected to each other at their upper ends by a connecting plate 474, so that the guide pins 466 guides the corresponding engaging pin 468 in the axial direction, and prevents rotation of the engaging pins 468.

To the upper surface of the connecting plate 474, there is attached a cam follower roller 478 such that the roller 478 is rotatable about an axis which extends in the radial direction of the main shaft 388. The roller 478 is held in engagement with a cam groove 480 formed in the engaging cam 386 described above. The cam 386 has a cylindrical outer circumferential surface coaxial with the main shaft 388, and the cam groove 480 is formed and open in the outer circumferential surface of the cam 386. The cam groove 480 has a height-varying portion and a non-lead portion. The height-varying portion is a portion whose height position in the axial direction of the main shaft 388 gradually varies, and the non-lead portion is a portion whose height position is unchanged. When the constant-velocity rotary disc 460 is rotated with the main shaft 388, the cam follower roller 478 is rotated with the rotary disc 460 about the axis of the main shaft 388, and at the same time is elevated and lowered or held at a predetermined level. As a result, the engaging pins 468 are similarly rotated and vertically moved.

The twelve rotary plates 392 have respective engaging recesses 486 open in their upper end faces. Each of these engaging recesses 486 has a tapered surface whose taper angle corresponds to the taper angle of the tapered end of the corresponding engaging pin 468. The engaging pins 468 are engaged with and disengaged from the respective recesses 486 when the pins 468 are moved up and down. With the engaging pin 468 engaging the recess 486 of a given rotary plate 392, this rotary plate 392 is rotated at a predetermined velocity by the constant-velocity rotary disc 460.

The cam groove 480 of the cam 386 is shaped so that the following events will take place for a given rotary plate 392 when the main shaft 388 is rotated.

The engaging pin 468 corresponding to the rotary plate 392 in question is disengaged or released from the engaging recess 486 (namely, the pin 468 is moved upwards), after the cam follower roller 436 has been moved into the cam groove 430a, 430b and while the rotary plate 392 is rotated by the concave globoidal cam 410a, 410b at the same constant velocity as the constant-velocity rotary disc 460. Then, the engaging pin 468 is held released from the recess 486 until the pin 468 is again brought into engagement with the recess 468, so that the pin 468 does not disturb a rotary motion of the rotary plate 392 by the concave globoidal cam 410a, 410b. The engaging pin 468 is engaged with the recess 486 (namely, the pin 468 is moved downwards), before the roller 436 has been moved out of the cam groove 430a, 430b and while the rotary plate 392 is rotated at the same velocity as the constant-velocity rotary disc 460. The pin 468 is held engaged with the recess 486 to cause the rotary plate 392 to be rotated by the constant-velocity rotary plate 460 until the roller 346 is again brought into engagement with the cam groove 430a, 430b to cause the rotary plate 392 to be rotated by the concave globoidal cam 410a, 410b. Since the engaging pin 468 has the tapered end 470, the pin 468 can be smoothly brought into engagement with the engaging recess 486.

The rotary plate 392 is rotated by the concave globoidal cams 410a, 410b, in the vicinities of the component sucking and mounting positions, and is rotated at the predetermined constant velocity by the constant-velocity rotary disc 460, between the component sucking and mounting positions. The rotary plate 392 can be stopped by the concave globoidal cams 410a, 410b, at the component sucking and mounting positions with high positioning accuracy. The image taking position at which the image of the electronic component is taken is located between the component sucking and mounting positions, and a high-speed camera 562 with a stroboscope (FIG. 21) is provided at a position of the base 10 corresponding to the vicinity of the image taking position. The rotary plate 392 is rotated at the constant velocity by the constant-velocity rotary disc 460, between the component sucking and mounting positions, without stopping at the image taking position. The image of the electronic component 164 is taken by the high-speed camera 562 when the component 164 passes a position right above the camera 562.

Figure 18:
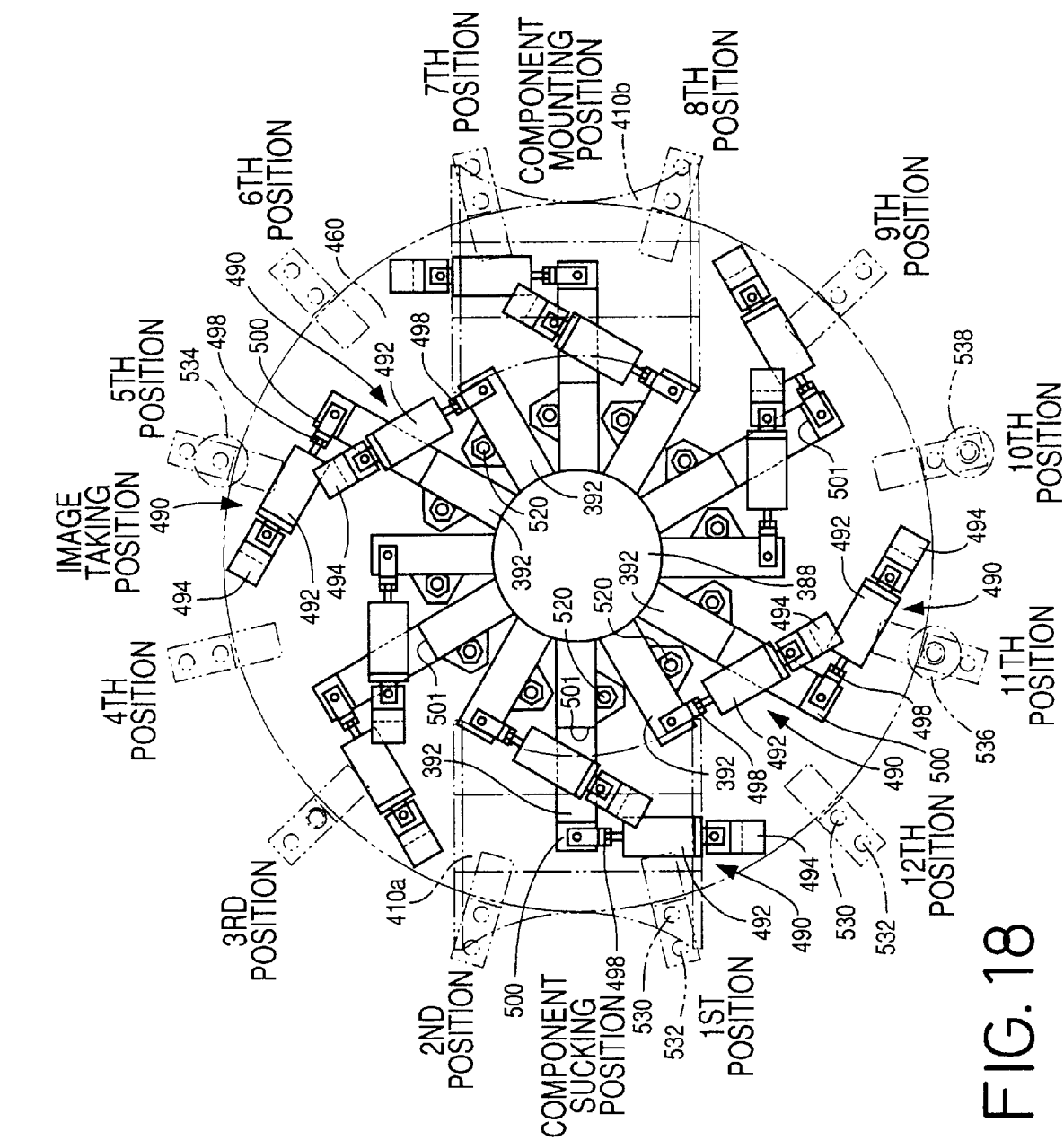
FIG. 18 is a plan view showing a portion of the apparatus of FIG. 13 in which there are provided stop position changing air cylinders, stop position changing valves, height position changing valves, first and second valve switching devices for the stop position changing valves, and valve switching devices for the height position changing valves.

Between the twelve rotary plates 392 and the constant-velocity rotary disc 460, there are provided twelve stop position changing air cylinders 490 for changing the stop position of the rotary plate 392, as shown in FIGS. 13 and 18. Each air cylinder 490 has a cylinder housing 492 which is connected by a pin to a bracket 494 fixed to the constant-velocity rotary disc 460, such that the cylinder housing 492 is rotatable about an axis which extends in the axial direction of the rotary disc 460. The air cylinder 490 further has a piston rod 498 which is connected by a pin to the rotary plate 392 such that the piston rod 498 is rotatable about an axis which also extends in the axial direction of the rotary disc 460.

The twelve stop position changing air cylinders 490 are connected to the constant-velocity rotary disc 460 such that the connections of the adjacent two air cylinders 490 to the rotary disc 460 are located at different radial positions (i.e., at relatively outer and inner positions) of the rotary disc 460, in order to prevent an interference of the adjacent air cylinders 490. To this end, the every two rotary plates 392 have respective radial extensions 500 radially outwardly extending from the upper ends thereof, as shown in FIGS. 13 and 18. The radial extensions 500 have respective cutouts 501 formed in their upper surfaces, as shown in FIGS. 13 and 18, to avoid interferences of those radial extensions 500 with the air cylinders 490 connected to the rotary plates 392 not provided with the radial extensions 500. The bracket 494 for supporting the air cylinder 490 connected to the rotary plate 392 not provided with the radial extension 500 is located above or horizontally spaced apart from the cylinder housing 492 of the air cylinder 490 connected to the adjacent rotary plate 392, so that the bracket 494 does not interfere with that cylinder housing 492.

Each stop position changing air cylinder 490 is a double-acting cylinder having two air chambers. By controlling flows of compressed air into and from these two air chambers, the corresponding rotary plate 392 is pivoted by the air cylinder 490 about the axis of the main shaft 388, so that the cam follower roller 436 is selectively moved to the first and second sucking or mounting positions in which the roller 436 is forced against the upstream and downstream side surfaces 440, 442 of the cam groove 430a, 430b, respectively, as indicated by solid and two-dot chain lines in FIG. 15.

In the present electronic component transferring and mounting apparatus 380, too, a stationary cylindrical cam 504 is fixed to the underside of the frame 382, and cam follower rollers 502 are held in rolling engagement with a cam groove 506 formed in the cylindrical cam 504. Like the rollers 126 provided in the apparatus 12 according to the first embodiment, each of the rollers 502 is fixed to the vertical slide 124 which is vertically movably supported by the rotary plate 392. As described above with respect to the apparatus 12, the component holder head 120 is attached to the vertical slide 124. In the present apparatus 380, the circumferential dimension (as measured in the rotating direction of the rotary plate 392) of the vertically movable member 266 of the head elevating and lower device 260 disposed at the position corresponding to the component sucking position is determined so that the cam follower roller 502 is located in the groove 272 when the rotary plate 392 is stopped at the first or second sucking position, namely, irrespective of whether the rotary plate 392 is located at the first or second sucking position. The circumferential dimension of the vertically movable member 266 of the head elevating and lowering device 260 disposed at the position corresponding to the component mounting position is similarly determined.

Figure 17:
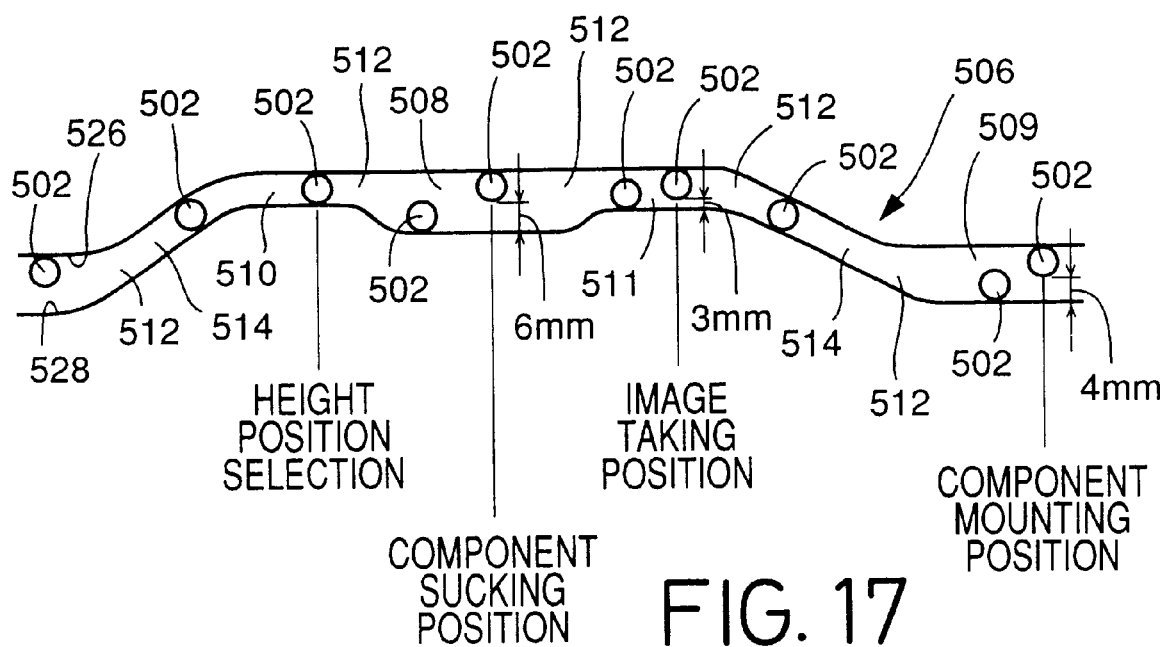
FIG. 17 is a view showing a cam groove in a stationary cylindrical cam used in the electronic component transferring and mounting apparatus of FIG. 13.

As schematically illustrated in FIG. 17, the cam groove 506 has a first wide portion 508, a second wide portion 509 and a third wide portion 511, which have respective constant heights or whose levels do not vary in the circumferential direction of the cylindrical cam 504. The first wide portion 508 corresponds to the component sucking position and its vicinity. The second wide portion 509 corresponds to the component mounting position and its vicinity. The third wide portion 511 corresponds to the image taking position and its vicinity. The width or vertical dimension of the first wide portion 508 as measured in the axial direction of the main shaft 388 is equal to a diameter of the cam follower roller 502 plus 6 mm, so that the roller 502 is permitted to be moved in the first wide portion 508 in the vertical direction. The width or vertical dimension of the second wide portion 509 is equal to the diameter of the roller 502 plus 4 mm, while the width or vertical dimension of the third wide portion 511 is equal to the diameter of the roller 502 plus 3 mm. These second and third wide portions 509, 511 also permit the roller 502 to move therein in the vertical direction. The cam groove 506 further has a first narrow portion 510 which has a constant height and which is located upstream of the component sucking position as viewed in the rotating direction of the rotary plates 392. The width or vertical dimension of this first narrow portion 510 is determined such that the roller 502 is in rolling engagement with the first narrow portion 510 with substantially no clearance therebetween in the vertical direction. The cam groove 506 also has a second narrow portion 514 whose height or level varies in the circumferential direction. The cam groove 506 has width varying portions 512 which connect the portions having different widths. The width of these varying portions 512 gradually varies to smoothly connect the adjacent portions of the groove 506.

The width or vertical dimension of the first wide portion 508 is equal to the vertical dimension (as measured in the axial direction of the main shaft 388) of the groove 272 formed in the vertically movable member 266 of the head elevating and lowering device 260 disposed at the position corresponding to the component sucking position. The width or vertical dimension of the second wide portion 509 is equal to the vertical dimension of the groove 262 of the vertically movable member 266 of the head elevating and lowering device 260 disposed at the position corresponding to the component mounting position. A significance of the difference between the vertical dimensions of the first and second wide portions 508, 509 will be described.

As shown in FIG. 13, each of the twelve rotary plates 392 is provided with a height position changing air cylinder 520 attached thereto so as to extend in the vertical direction. The air cylinder 520 has a piston rod 522 which has an engaging member 524 fixed thereto. The engaging member 524 is fixed to the vertical slide 124 which carries the component holder head 120. The height position changing air cylinder 520 is a double-acting cylinder whose piston rod 522 is adapted to vertically move the vertical slide 124 and the cam follower roller 502 fixed thereto, so that the roller 502 can be selectively brought into pressing contact with an upper side surface 526 and a lower side surface 528 (FIG. 17). When the vertical slide 124 is vertically moved by the stationary cylindrical cam 504 and the cam follower roller 502, the direction of movement of the vertical slide 124 may be reversed with respect to the direction in which the cam follower roller 502 is biased by the height position changing air cylinder 520. In this case, the vertical movement of the vertical slide 124 may be permitted by compression of the air in one of the two air chambers of the air cylinder 520 which is connected to the air source. However, it is desirable that the vertical movement of the vertical slide 124 is permitted by permitting a discharge flow of the air from the air chamber connected to the air source. This latter arrangement prevents a variation in the air pressure in that air chamber, making it possible to force the roller 502 onto the side surface of the cam groove 506 with a constant force.

When the cam follower roller 502 is in pressing contact with the upper side surface 526, the component holder head 120 has a larger height at the first or second sucking position or first or second mounting position, than when the roller 502 is in pressing contact with the lower side surface 528. Thus, the height position changing air cylinder 520 permits the height position of the head 120 (in the axial direction of the main shaft 388) to be changed in two steps when the head 120 is stopped at the component sucking and mounting positions. Further, the air cylinder 520 permits the height position of the head 120 to be changed in two steps when the head 120 passes the image taking position. Thus, there are available two height positions of the head 120 at each of the first and second sucking positions (in the component sucking station), first and second mounting positions (in the component mounting station), and image taking position (in the image taking station).

Figure 19:
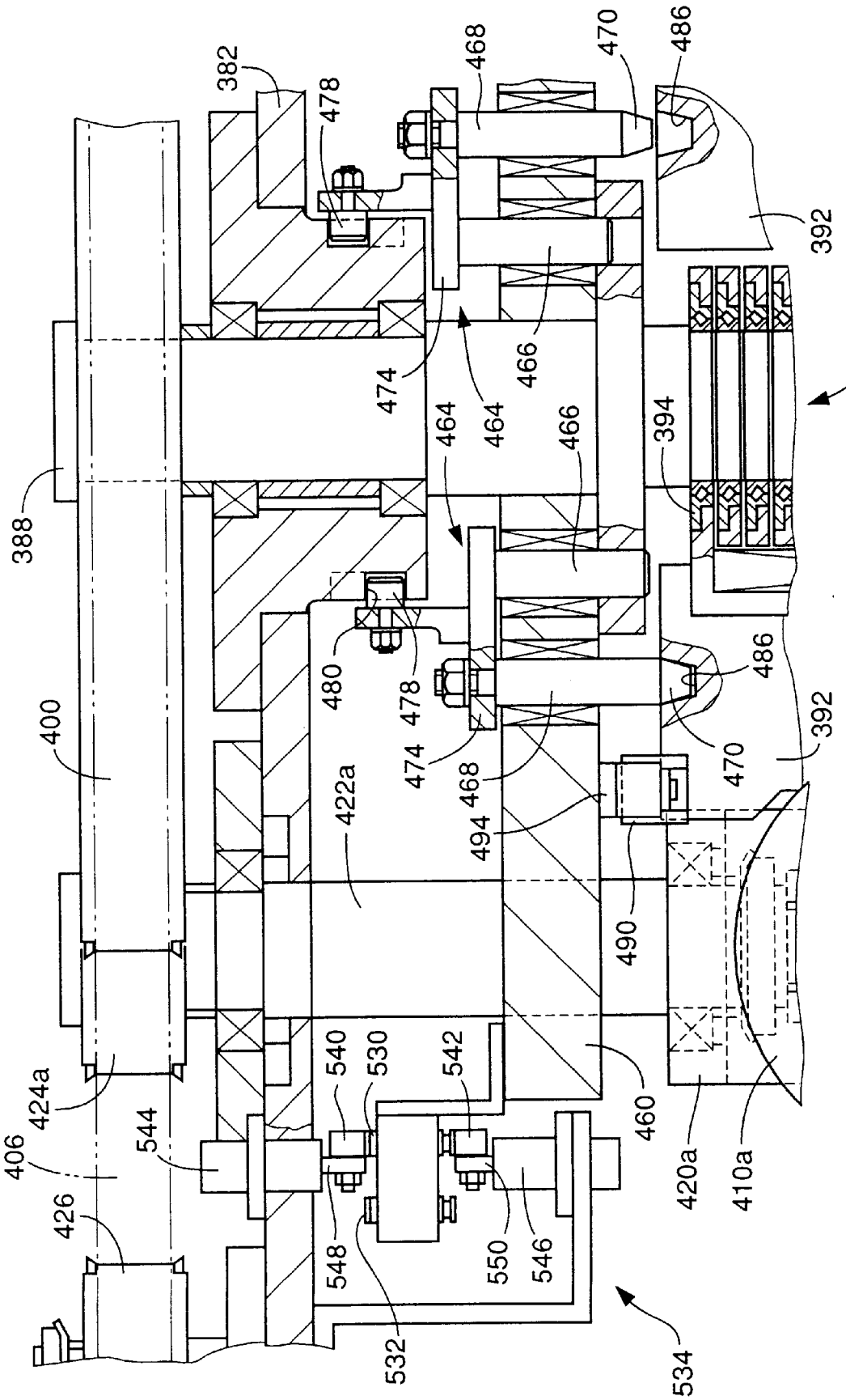
FIG. 19 is a front elevational view showing the stop position changing valve, height position changing valve, first stop position changing valve switching device, and their vicinities in the apparatus of FIG. 13.
Figure 20:
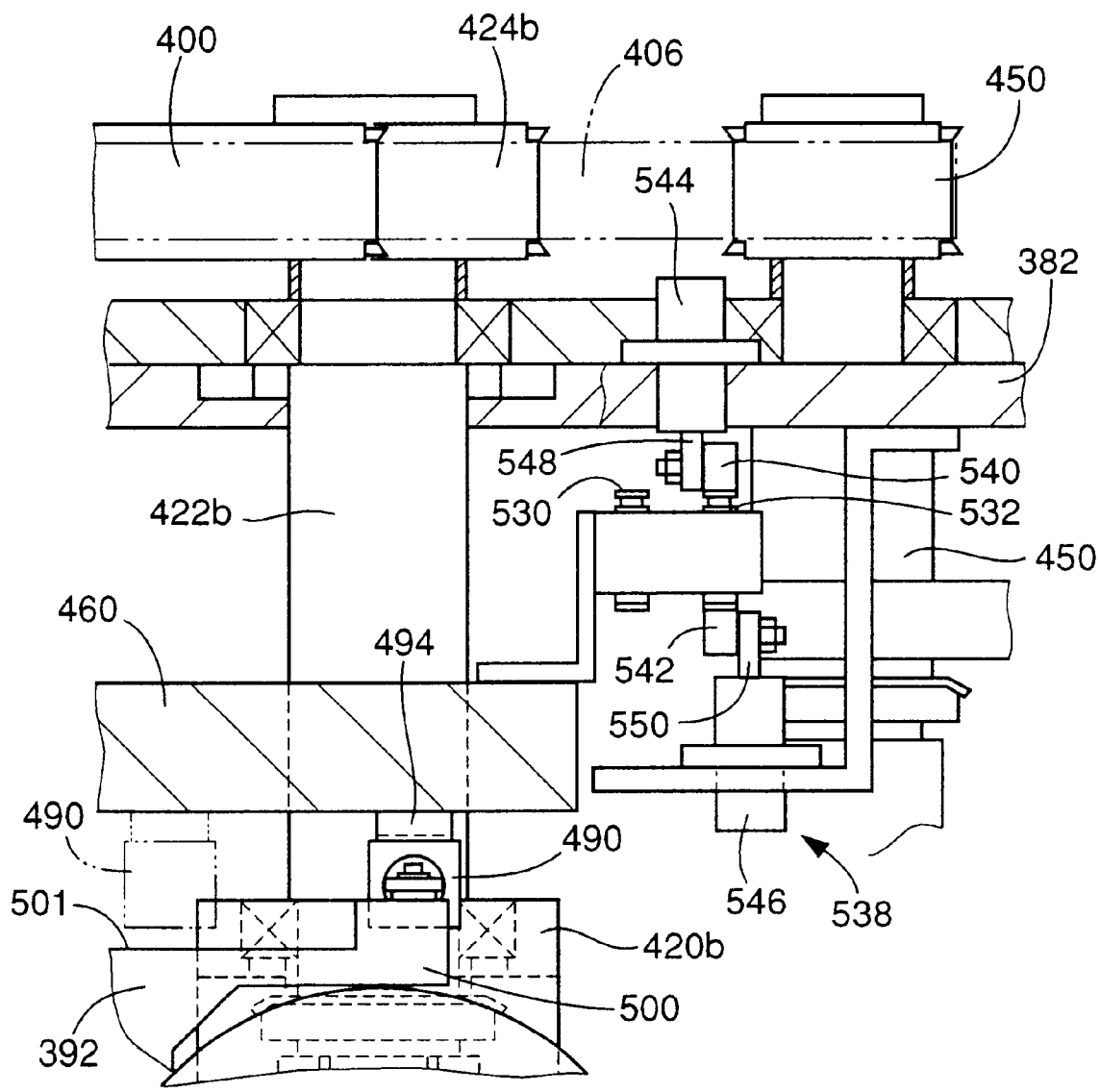
FIG. 20 is a front elevational view in cross section showing the stop position changing valve, height position changing valve, height position changing switching device and their vicinities in the present apparatus.

Flows of compressed air into and from the stop position changing air cylinders 490 and the height position changing air cylinders 520 are controlled by twelve stop position changing valves 530 and twelve height position changing valves 532, as shown in FIGS. 13 and 19. These valves 530, 532 are attached to the constant-velocity rotary disc 460 such that the twelve pairs of these valves 530, 532 corresponding to the twelve rotary plates 392 are equi-angularly spaced from each other in the circumferential direction of the rotary disc 460. Each of these valves 530, 532 includes a switching member in the form of a spool which is moved between two operating positions for mechanically controlling the supply and discharge flows of the compressed air into the appropriate cylinder 490, 520. The stop position changing valve 530 and the height position changing valve 530 of each pair are spaced apart from each other in the radial direction of the rotary disc 460, as shown in FIG. 19. The stop position changing valves 530 are controlled by first and second valve switching devices 534, 536, while the height position changing valves 532 are controlled by a third valve switching valve 538, as shown in FIGS. 18–20.

Referring to FIG. 18, there are shown twelve angular positions which are equi-angularly spaced from each other at an angular interval of 30° in the clockwise direction about the main shaft 388. Suppose the stop and height changing valves 530, 532 corresponding to the rotary plate 392 located at the component sucking position are located at the first angular position, the valves 530, 532 corresponding to the rotary plate 392 located at the component mounting position are located at the seventh angular position, and the valves 530, 532 corresponding to the rotary plate 392 at the image taking position for taking an image of the corresponding electronic component are located at the fourth angular position.

As shown in FIG. 18, the first and second valve switching devices 534, 536 for the stop position changing valves 530 are located at the fifth and eleventh angular positions, respectively, while the third valve switching device 538 for the height position changing valves 532 is located at the tenth angular position.

The three valve switching devices 534, 536, 538 have the same construction. The first valve switching device 534 for the stop position changing valves 530 will be described by way of example, by reference to FIG. 19. The first valve switching device 534 has two actuating members in the form of engaging rollers 540, 542 disposed such that these rollers 540, 542 are located above and below the spool of each stop position changing valve 530 when the valve 530 is located at the fifth angular position (FIG. 18). The first valve switching device 534 further has a drive device in the form of two valve switching air cylinders 544, 546 fixed to the frame 382. The air cylinders 544, 546 have respective piston rods 548, 550. The rollers 540, 542 are fixed to the free ends of the piston rods 548, 550 such that the rollers 540, 542 are rotatable about horizontal axes extending in the radial direction of the main shaft 388. The air cylinders 544, 546 are single-acting cylinders whose pistons rods 548, 550 are spring-biased so that the rollers 540, 542 are normally held in their positions in which the rollers 540, 542 are spaced apart from the end faces of the spool of the stop position changing valve 530. Like the first valve switching device 534, the second valve switching device 536 located at the eleventh angular position is disposed at a position aligned with the stop position changing valves 530 in the radial direction of the main shaft 388, and the third valve switching device 538 located at the tenth angular position is disposed at a position aligned with the height position changing valves 532 in the radial direction of the main shaft 388.

The compressed air is supplied from the air source through a conduit (not shown) to a passage formed through the main shaft 388. This passage is connected to the stop position changing valves 530 and the height position changing valves 532 through the constant-velocity rotary disc 460. Each stop position changing valve 530 is connected to the stop position changing air cylinder 490 through a hose (not shown), while each height position changing valve 532 is connected to the height position changing air cylinder 520 through a hose (not shown). Since the main shaft 388 is rotated, the above-indicated conduit and passage in the main shaft 388 are connected to each other by a rotary joint.

The present electronic component mounting system including the electronic component transferring and mounting apparatus 380 is controlled by a control device 560 illustrated in the block diagram of FIG. 21. This control device 560 is principally constituted by the computer 340 as used in the control device 330 in the first embodiment. The high-speed camera 562 is connected to the input interface 342 of the computer 340. To the output interface 344 of the computer 340, there are connected the driver circuit 352 for the main drive servomotor 402, and a driver circuit 564 for controlling the valve switching air cylinders 544, 546 of the first, second and third valve switching devices 534, 536, 538. The ROM 334 of the computer 340 stores various control programs including programs for controlling operations for the component holder heads 120 to hold the electronic components and mount them on the printed-circuit board 38, programs for selecting the first or second sucking position and the first or second mounting position, and programs for selecting the height positions of the heads 120 at the component sucking and mounting position and image taking position.

When the present electronic component mounting system is operated to mount the electronic components on the printed-circuit board 38, the main drive servomotor 402 is activated to rotate the constant-velocity rotary disc 460 and the concave globoidal cams 410*a*, 410*b*, so that the twelve rotary plates 392 are rotated independently of each other, namely, accelerated, decelerated, moved at a predetermined constant velocity or stopped, depending upon their positions in their circular path. Each rotary plate 392 is rotated by the constant-velocity rotary disc 460 at the constant velocity while the engaging pin 468 of the corresponding engaging device 464 is held in engagement with the engaging recess 486 of the rotary plate 392 in question. The rotary plate 392 is rotated by the concave globoidal cams 410*a*, 410*b* while the corresponding cam follower roller 436 is held in engagement with the cam grooves 434*a*, 434*b* of the cams 410*a*, 410*b* and while the roller 436 is located at positions other than the component sucking and mounting positions. The rotary plate 392 is stopped at the component sucking and mounting positions so that the electronic component 164 is picked up by the corresponding component holder head 120 and mounted on the printed-circuit board 38.

When the rotary plate 392 is passing the image taking station, the rotary plate 392 is rotated by the constant-velocity rotary disc 460 at the constant velocity with the pin 468 in engagement with the recess 486. The image of the electronic component 164 held by the head 120 is taken by the high-speed camera 562 when the rotary plate 392 passes the image taking position during its rotary movement at the constant velocity. Since the high-speed camera 562 is provided with a stroboscope, the image of the electronic component 164 can be taken with a sufficiently high quality without having to stop the electronic component 164. The X-axis and Y-axis and angular position errors of the electronic component 164 are calculated on the basis of the output of the high-speed camera 562, and the angular position of the electronic component 164 is adjusted to remove the angular positioning error by rotating the suction nozzle 158 about its axis while the head 120 is moved from the image taking position to the component mounting position.

As the two rotary plates 392 which are 180° spaced from each other about the axis of the main shaft 388 are rotated toward the component sucking and mounting positions, the corresponding cam follower rollers 502 are moved from the cam groove 506 of the stationary cylindrical cam 504 into the grooves 272 of the vertically movable members 266 of the two head elevating and lowering devices 260 disposed at the positions corresponding to the sucking and mounting positions. With the devices 260 operated to elevate the vertically movable members 266, the corresponding two component holder heads 120 are vertically moved so that the electronic component 164 is picked up by one of these two heads 120 while the electronic component 164 held by the other head 120 is transferred to the printed-circuit board 38, as described above with respect to the first embodiment. In portions of these component pickup and mounting operations, the rotation and vertical movement of the heads 120 are contemporaneously effected, as also described above. In the present electronic component transferring and mounting apparatus 380, however, one of the first and second sucking positions is selected as the component sucking position, and one of the first and second mounting positions is selected as the component mounting position, so that the height positions of the heads 120 at the component sucking and mounting positions and the image taking position are changed according to the selected sucking and mounting positions.

An operation to pick up the electronic component 164 will be first described. Before the apparatus 380 is started, the multiplicity of cartridges 22 are arranged on the cartridge support block 20, in the order in which the electronic components are mounted on the printed-circuit board 38.

Usually, the successive component holder heads 120 successively receive a plurality of electronic components from one of the cartridges 22, and the following successive component holder heads 120 receive a plurality of electronic components from the next cartridges 22. Thus, the successive heads 120 receive the electronic components from the successive cartridges 22 as the cartridge support block 20 is intermittently fed to sequentially bring the successive cartridges 22 at the predetermined component supply position at which the predetermined number of electronic components are supplied from this cartridge 22 to the corresponding number of successive heads 120. When the predetermined number of electronic components have been supplied from one cartridge 22, the cartridge support block 20 is fed by a predetermined distance. At this time, the component sucking position is changed from one of the first and second sucking positions to the other position, for the reason explained below.

For example, the cartridges 22 are arranged on the cartridge support block 20 at a spacing pitch of 16 mm, and the cartridge support block 20 is intermittently fed at a feed pitch of 8 mm, as indicated in FIG. 22A. When the cartridge 22 placed in the predetermined component supply position is changed from one cartridge to another, the cartridge support block 20 must be fed by a distance equal to the feed pitch multiplied by two.

If the operation to pick up the electronic component at the component sucking position is initiated only after the new cartridge 22 has been moved to the component supply position by two intermittent feeding movements of the cartridge support block 20 by a distance of 16 mm equal to the spacing pitch of the cartridges 22, the required operation time corresponding to the angular spacing pitch of the heads 12 is inevitably increased with a result of lowering of the component mounting efficiency of the apparatus 380.

If the electronic components are supplied from the cartridges 22 while the cartridge support block 20 is intermittently fed in a forward direction indicated by arrow P in FIG. 22 (which is opposite to the direction of rotation of the rotary plates 392 indicated by arrow Q), the rotary plates 392 are normally stopped at the first sucking position of FIG. 22A. In this first sucking position, the cam follower roller 436 is in pressing contact with the upstream side surface 44 of the non-lead portion 434 of the cam groove 430a of the concave globoidal cam 410a. The position in the electronic component supply device 14 right below the head 120 stopped at the first sucking position will be referred to as "first component supply position".

After the last one of the predetermined number of electronic components is picked up from the cartridge 22C by the head 120A, as indicated in FIG. 22A, the cartridge support block 20 is fed in the forward direction P by a distance of 8 mm, and the rotary plate 392 carrying the next head 120B for picking up the first one of the predetermined number of electronic components from the next cartridge 22B is stopped at the second sucking position as indicated in FIG. 22B. As described above, the first and second sucking positions are spaced apart from each other by a distance of 8 mm in the X-axis direction, that is, in the feeding direction of the cartridge support block 20. Consequently, the cartridge 22B and the rotary plate 392B are moved relative to each other by a distance of 16 mm. Therefore, the head 120B does not have to wait for the completion of the 16 mm movement of the cartridge 22B before the head 120B starts picking up the first one of the predetermined number of electronic components from the cartridge 22B. The position of the electronic component supply device 14 right below the head 120 stopped at the second sucking position will be referred to as "second component supply position".

When the rotary plate 392 is stopped at the second sucking position, the cam follower roller 436 is moved by the stop position changing air cylinder 490 to be forced against the downstream side surface 442 of the cam groove 430a, as indicated by two-dot chain line in FIG. 15. To this end, the stop position changing valve 530 corresponding to the rotary plate 392 to be stopped at the second sucking position is switched by the second valve switching device 536 to stop the rotary plate 392 at the second sucking position, when the above-indicated stop position changing valve 530 has reached the eleventh angular position shown in FIG. 18. However, this switching operation of the valve 530 by the switching device 536 is effected only where the valve 530 has been held in the position corresponding to the first sucking position before the corresponding rotary plate 392 has reached the eleventh angular position.

The concave globoidal cams 410a, 410b and the main shaft 388 are driven by the main drive servomotor 402 such that the angles of rotation of the cams 410 and main shaft 388 are proportional to the angle of rotation of the servomotor 402. Accordingly, the positions of the twelve rotary plates 392 about the main shaft 388 can be determined on the basis of the amount of rotation of the servomotor 402. Therefore, the rotary plate 392 which has reached the eleventh angular position can be identified. Further, the electronic component that is to be picked up by the head 120 carried by that rotary plate 392, and the first or second sucking position that should be selected for that rotary plate 392 can be determined from the component sucking and mounting control programs. Accordingly, the stop position changing valves 530 of the rotary plates 392 can be suitably controlled when the rotary plates 392 have reached the eleventh angular position, so that the rotary plates 392 can be suitably stopped at the first or second sucking position depending upon the electronic component to be picked up from one of the cartridges 22.

The air chamber of each valve switching single-acting air cylinder 544, 546 is kept open to the atmosphere except when the stop position changing valve 530 is switched. Therefore, the piston rods 548, 550 of these air cylinders 544, 546 are normally kept by the biasing springs in the positions to hold the rollers 540, 542 in their non-operating positions in which the spool of the valve 30 is not operated even when the valve 30 has reached the eleventh angular position. When the valve 530 is switched, one of the two valve switching air cylinders 544, 546 is actuated to move the corresponding one of the rollers 540, 542 to the operating position, whereby the spool of the valve 530 is moved for actuating the air cylinder 490. The spool of the stop position changing valve 530 moved with the constant-velocity rotary disc 460 is brought into contact with one of the two rollers 540, 542 which is now placed in the operating position, so that the spool is pushed by contact with the circumferential surface of that roller 540, 542. Thus, the valve 530 is switched to actuate the air cylinder 490 for biasing the rotary plate 392 so as to cause the cam follower roller 436 to be forced against the upstream side surface 440 or downstream side surface 442 of the cam groove 430a of the concave globoidal cam 410a, whereby the rotary plate 392 is stopped at the first or second sucking position. The roller 540, 542 which has been moved to the operating position is returned to the non-operating position if the component sucking position is not changed for the next rotary plate 392 which reaches the eleventh angular position. If the component sucking position is changed for the next rotary plate 392, the roller 540, 542 is held in the operating position.

The valve switching air cylinders 544, 546 of the second valve switching device 536 at the eleventh angular position are provided to switch the stop position changing valves 530 while the rotary plates 392 are rotated about the main shaft 388. Since the air cylinders 544, 546 are provided with the rollers 540, 542 for contact with the spools of the valves 530, the valves 530 can be smoothly switched without disturbing the rotary movement of the rotary plates 392. The same advantage is offered by the valve switching air cylinders 544, 546 of the first valve switching device 534 (for switching the stop position changing valves 530 at the fifth angular position) and the third valve switching device 538 (for switching the height position changing valves 532 at the tenth angular position). Since the rollers 540, 542 are normally held in their non-operating positions, these rollers do not move into the path of the spools and operate the valves 530, except when valves 530 should be switched. In other words, neither the roller 540 nor the roller 542 lies on a movement path of the spools of the valves 530 when the air chambers of the air cylinders 544, 546 are held open to the atmosphere.

The switching of the stop position changing valve 530 is initiated at the eleventh angular position, which is spaced from the component sucking position in the direction opposite to the rotating direction of the rotary plates 392, by an angular distance equal to the angular spacing pitch multiplied by two. Immediately after the valve 530 has been switched to the position corresponding to the second sucking position, for example, the corresponding rotary plate 392 is rotated with the constant-velocity rotary disc 460 with the engaging pin 468 still kept in the engaging recess 486. In this condition, the rotary plate 392 is not pivoted by the stop position changing air cylinder 490. After the pin 468 is disengaged from the recess 486, the cam follower roller 436 is moved into the cam groove 430a of the concave globoidal cam 410a and is moved in pressing contact with the downstream side surface 442 of the cam groove 430a under the biasing force of the air cylinder 490, and the rotary plate 392 is stopped at the second sucking position. Although the width of the non-lead portion 434 of the cam groove 430a is larger than the diameter of the roller 436, the roller 436 will not be oscillated within the width of the non-lead portion 434, since the roller 436 is forced against the downstream side surface 442 by the air cylinder 490 through the rotary plate 392. Accordingly, the rotary plate 392 can be stopped at the second sucking position with high positioning accuracy, permitting the component holder head 120 to pick up the electronic component 164 with high reliability. This advantage is also enjoyed when the rotary plate 392 is stopped at the second sucking position, and at the first and second mounting positions, permitting the electronic component 164 to be mounted on the printed-circuit board 38 with high positioning accuracy.

After the first one of the predetermined number of the electronic components is picked up from the cartridge 22B by the head 120B, the cartridge support block 20 is further fed by a distance of 8 mm in the forward direction from the position of FIG. 22B, so that the head 120C can pick up the second one of the predetermined number of the electronic components from the cartridge 22B, at the first sucking position, as indicated in FIG. 22C.

Figure 23A:
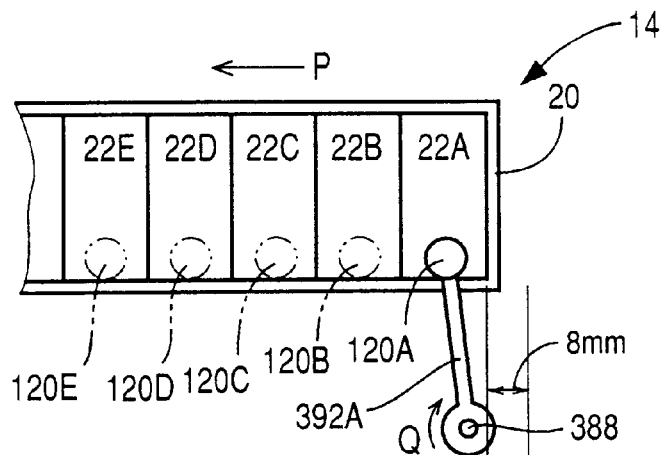
FIGS. 23A–23D are views for explaining a change in the component sucking position where the cartridge support is fed in a reverse direction, in the apparatus of FIG. 13.

The electronic component supply device 14 is adapted to change the direction of feeding of the cartridge support block 20 when all of the predetermined number of the electronic components have been picked up from the most upstream cartridge 22A as seen in the forward feeding direction P as indicated in FIG. 23A, namely, when all of the electronic components to be mounted on the printed-circuit board 38 have been picked up from the cartridges 22. That is, the cartridge support block 20 is intermittently moved in a reverse direction as indicated by arrow R in FIG. 23B, namely, in the rotating direction Q of the rotary plates 392, so that the electronic components are successively picked up by the heads 120, to be mounted on the next printed-circuit board 38 in the order which is reversed to that in the case where the cartridge support block 20 is intermittently fed in the forward direction P.

Figure 23B:
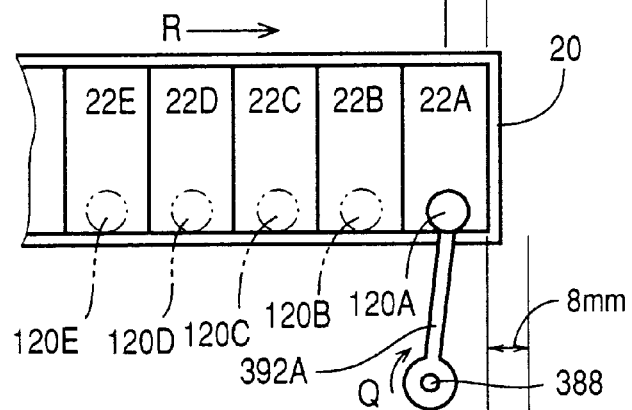
Figure 23C:
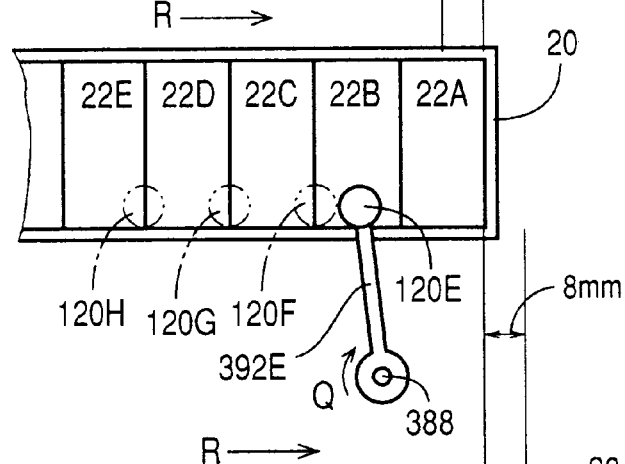

In this case where the cartridge support block 20 is fed in the reverse direction R, the electronic components are first supplied from the cartridge 22A, and the heads 120 are normally stopped at the second sucking position. Initially, the block 20 is fed in the reverse direction R by a distance of 8 mm, and the first one of the predetermined number of electronic components is picked up from the cartridge 22A by the appropriate head 120, for example, by the head 120A, when the rotary plate 392 carries the head 120A is stopped at the second sucking position, as shown in FIG. 23B.

Figure 23D:
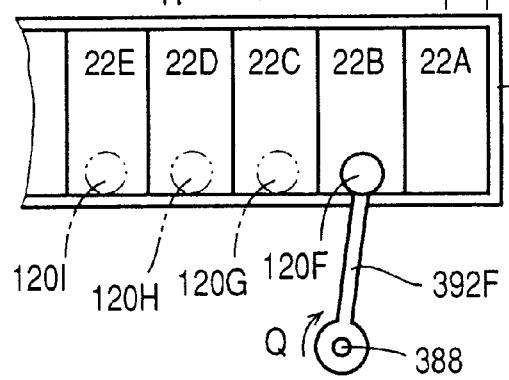
Figure 24:
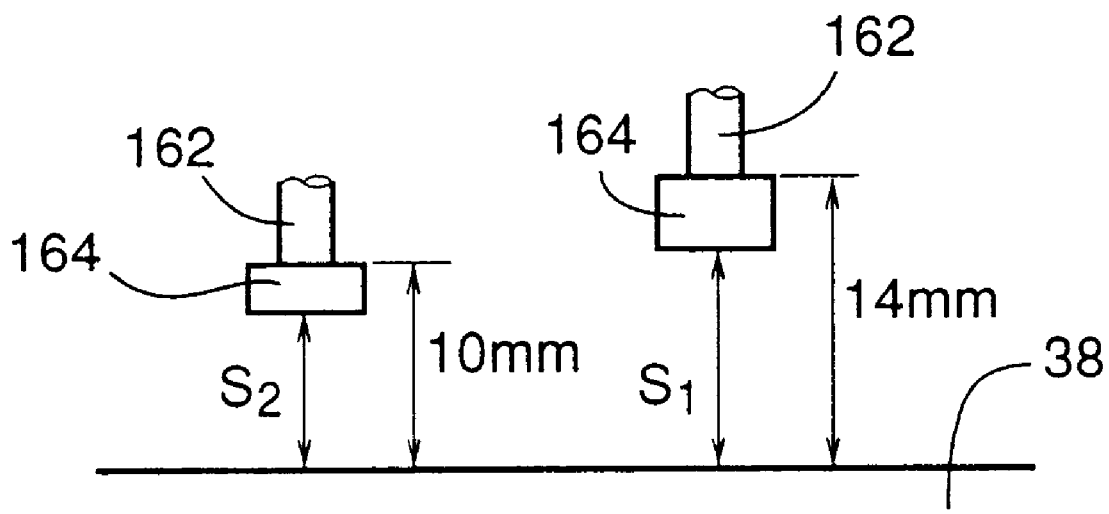
FIG. 24 is a view for explaining changes in the height position of the component holder head and the vertical head stroke in the apparatus of FIG. 13.

When all of the predetermined number of the electronic components have been picked up from the cartridge 22A, the cartridge support block 20 is fed by a distance of 8 mm in the reverse direction R, and the rotary plate 392 (e.g., plate 392E) carrying the head 120 (e.g., 120E) for picking up the first electronic component from the cartridge 22B is stopped at the first sucking position, so that the electronic component is picked up by the head 120E at the first sucking position. In this case, therefore, the cartridge 22B is moved relative to the head 120E by a distance of 16 mm. The stop position changing valve 530 corresponding to the rotary plate 392E is switched by the valve switching device 536 to stop the rotary plate 120E at the first sucking position, when the above-indicated valve 530 has reached the eleventh angular position. This switching operation of the valve 530 by the valve switching device 536 is effected only where the valve 530 has been held in the position corresponding to the second sucking position before the valve 530 has reached the eleventh angular position. After the first one of the predetermined number of the electronic components has been picked up from the cartridge 22B by the head 120E, the block 20 is further fed by a distance of 8 mm in the reverse direction R, as indicated in FIG. 23D, so that the head 120F for picking up the second electronic component from the cartridge 22B may pick up this electronic component at the second sucking position.

Thus, the stop position of the rotary plates 392 at the component sucking position is suitably changed from the first sucking position to the second sucking position or vice versa, when the cartridge 22 from which the electronic components are picked up by the head 120 is changed from one to another. This arrangement is effective to reduce the required distance of feeding movement of the cartridges 22, permitting a decrease in the time required for the suction nozzles 158 to reach the component sucking position, without increasing the acceleration and deceleration values of the cartridge support block 20 upon changing of the cartridges 22, whereby the components 164 can be picked up and mounted with improved efficiency. Further, since the cartridges 22 can be fed with reduced vibration, the electronic components 164 contained in the component holder tapes are prevented from taking a vertical posture rather than a horizontal posture in which the components are normally picked up. In addition, the present arrangement is effective to reduce the required output of the cartridge feed servomotor 26, and the required strength of the floor or support structure on which the electronic component mounting system is installed.

After the electronic component is picked up by the head 120 at the component sucking position, the head 120 is rotated toward the component mounting position through the image taking position. When the electronic component passes the image taking position during movement of the rotary plate 392 with the constant-velocity rotary disc 460 at a predetermined constant velocity, an image of the electronic component is taken by the high-speed camera 562 with a stroboscope. Thus, the image of the electronic component is taken without having to stop the electronic component at the image taking position. The image taking position in the horizontal direction is fixed irrespective of the selection of the first or second sucking position, since the image is taken while the rotary plate 392 is rotated by the constant-velocity rotary disc 460 rather than the concave globoidal cam 410.

As described above, the first and second mounting positions are selectively available as the component mounting position at which each rotary plate 392 is stopped for mounting the electronic component 164 on the printed-circuit board 38. After one electronic component 164 is mounted, one of the first and second mounting positions is selected so that the selected mounting position reduces the required distance of movement of the printed-circuit board 38 in the X-axis direction for positioning the board 38 such that the location at which the next electronic component 164 is mounted is right below the component holder 120 carrying the next electronic component 164. Based on the selected first or second mounting position, the distance of movement of the board 38 is determined. This arrangement makes it possible to reduce the required distance of movement of the printed-circuit board 38 in the X-axis direction, and shorten the required time of movement of the suction nozzle 158 corresponding to the angular spacing pitch of the heads 120, without increasing the acceleration and deceleration values of the board 38. Since the required acceleration and deceleration values of the board 38 can be reduced, otherwise possible dislocation of the electronic components 164 mounted on the board 38 can be avoided, and the required outputs of the X-axis and Y-axis drive servomotors 42, 48 can be reduced.

The kind of the electronic component 164 held by the head 120 of each rotary plate 392, the location at which the electronic component is to be mounted, and the first or second sucking position selected for the rotary head 392 are known from the component mounting program. If the first or second mounting position that should be selected for mounting the electronic component 164 at the above-indicated location is the same as the selected first or second sucking position, the stop position changing valve 530 corresponding to the rotary plate 392 in question is not switched by the first valve switching device 534. If the selected first or second mounting position is different from the selected first or second sucking position, the valve 530 is switched by the first valve switching device 534 when the valve 530 passes the fifth angular position of FIG. 18, so that the rotary plate 392 is stopped at the selected first or second mounting position.

If the first or second mounting position selected for a given rotary plate 392 is different from the first or second sucking position that should be selected for the same rotary plate 392 to pick up the next electronic component 164, the stop position changing valve 530 is switched by the second valve switching device 536 when the valve 530 passes the eleventh angular position of FIG. 18, so that the rotary plate 392 can be stopped at the selected first or second sucking position.

There will next be described the manner of changing the height position of the component mounting heads 120 at the component sucking and mounting positions and the image taking position.

The present electronic component transferring and mounting apparatus 380 is provided with one height changing valve switching device in the form of the third valve switching device 538 which is disposed at the tenth angular position of FIG. 18 as described above. In other words, the height position of each head 120 can be changed at one angular position during one full rotation of the rotary plate 392 about the main shaft 388. Therefore, if the height position is changed to the higher level at the component mounting position, for example, this higher height position or level is maintained at the component sucking and image taking positions, or vice versa.

The height of the head 120 at the component mounting position is determined or selected in the following manner:

When the electronic component 164 is mounted on the printed-circuit board 38, the head 120 carrying the electronic component 164 is moved with the vertical slide 124 with an initial downward movement and the following horizontal movement in the vicinity of the component mounting position, with the cam follower roller 502 being guided by the cam groove 506 of the stationary cylindrical cam 504, as indicated in FIG. 17. The height position of the head 120 during the horizontal movement should be determined so as to prevent an interference of the electronic component 164 held by the head 120 with the electronic components 164 already mounded on the printed-circuit board 38. The possibility of this interference decreases with a decrease in the height of the electronic component 164 held by the head 120, and therefore the height position of the head 120 can be reduced as the height of the electronic component 164 carried by the head decreases. If the height position of the head 120 at the component mounting position is fixed at a relatively low level corresponding to an electronic component 164 having a relatively small height, another electronic component 164 having a relatively large height may interfere with the already mounted electronic components 164. If the height position of the head 120 is fixed at a relatively high level corresponding to an electronic component having a relatively large height, the vertical stroke of the head 120 required upon mounting of an electronic component having a relatively small height is undesirably increased. Therefore, the height position of the head 120 at the component mounting position is changed in two steps (high and low height positions) depending upon the height of the electronic component to be mounted.

The present electronic component mounting system is adapted to deal with the electronic components 164 whose heights range from 0 mm to 6 mm. The electronic components 164 whose heights are 2 mm or smaller will be referred to as "thin components", while the electronic components 164 whose heights range from 2 mm to 6 mm will be referred to as "thick components". Where a thick component 164 having the largest height of 6 mm has been already mounted on the board 38 and another thick component having the largest height of 6 mm is to be mounted on the board 38, the distance between the end face of the suction tube 162 of the suction nozzle 158 and the upper surface of the board 38 should be at least 14 mm if an interference of the thick components is avoided by providing a clearance of at least 2 mm between the upper surface of the thick component already mounted on the board 38 and the lower surface of the thick component head by the head 120.

Where a thin component 164 having the largest height of 2 mm and a highest possibility of interference with the already mounted thick component having the largest thickness of 6 mm is to be mounted on the board 38, the distance between the end face of the suction tube 162 and the upper surface of the board 38 should be at least 10 mm if the interference is avoided by providing the same clearance of 2 mm between the thin and thick components. Hence, the required height difference of the head 120 in the above two cases is 4 mm.

In the light of the above analysis, the width or vertical dimension of the second wide portion 509 of the cam groove 506 is determined to be equal to a sum of the diameter of the cam follower roller 502 and 4 mm, so that the head 120 may be stopped at different heights at the component mounting position, namely, so that the distance between the suction tube 162 and the upper surface of the board 38 is 14 mm upon mounting of the thick components, and is 10 mm upon mounting of the thin components.

It is noted that the end faces or suction surfaces of the suction tubes 162 of all suction nozzles are located on a circle having a center at the axis of the support shaft 152, and that the suction nozzles 158 for different kinds of the electronic components have the same vertical operating stroke for sucking and mounting operations.

At the component sucking position, the difference between the high and low height positions of the heads 120 is 6 mm. As previously explained, the cartridges 22 of the electronic component supply device 14 of the present mounting system are adapted such that the electronic components 164 are accommodated in component holder tapes whose component accommodating recesses are covered by a top covering tape. Each component holder tape has opposite support portions which define the width of the tape and which extend in the longitudinal direction of the tape. The component holder tape further has a component accommodating portion which is supported by the support portions and which has a multiplicity of component accommodating recesses whose bottom walls take the form of bosses extending downwards between the support portions. The electronic components 164 are accommodated in the respective recesses. This component holder tape is referred to as "embossed type" holder tape. The support portions of the component holder tape are supported by the body of the cartridge 22. The component accommodating recesses have different depths depending upon the heights of the electronic components 164 accommodated therein. However, the support portion of the cartridge body supporting the support portions of the component holder tape has a constant height over the entire length of the tape, and the upper open ends of all the recesses have the same height, namely, the upper surfaces of the electronic components 164 accommodated in the recesses have the same height.

When the electronic component 164 is picked up by the head 120, the suction tube 162 is first lowered into abutting contact with the upper surface of the electronic component 164, and is then elevated with the electronic component held thereon under suction, so that the entirety of the electronic component is moved up out of the component accommodating recess. The level to which the electronic component is elevated by the head 120 at the component sucking position is determined so as to avoid an interference of the electronic component with any members surrounding the cartridge 22, such as a cover member covering the component holder tape, which interference may occur when the rotary plate 392 is rotated toward the image taking position. The above-indicated level differs depending upon the specific cartridge 22 from which the electronic component 164 is picked up. The difference of the above level from the level of the upper surface of the component holder tape is 2 mm for the cartridges 22 accommodating the thin components (whose height is 0–2 mm), and is 4 mm for the cartridges 22 accommodating the thick components (whose height is 2–6 mm). When the thin component is picked up, therefore, the distance between the suction tube 162 and the upper surface of the component holder tape is a sum of the above-indicated 2 mm and the largest height of 2 mm of the thin components, that is, 4 mm. When the thick component is picked up, the above distance is a sum of the above-indicated 4 mm and the largest height of 6 mm of the thick components, that is, 10 mm. Thus, the difference between these distances is 6 mm. Accordingly, the width or vertical dimension of the first wide portion 508 of the cam groove 506 of the stationary cylindrical cam 504 is made equal to a sum of the diameter of the roller 502 and 6 mm, so that the head 120 may be stopped at different heights at the component sucking position, namely, so that the distance between the end face of the suction tube 162 and the upper surface of the component holder tape is 10 mm upon sucking of the thick components, and is 4 mm upon sucking of the thin components.

If the difference of 6 mm of the high and low height positions of the head 120 selected depending upon the height of the electronic component to be picked up is maintained at the image taking position, the distance between the lower surface of the electronic component and the high-speed camera 562 may vary by a maximum of 6 mm, and the image of the electronic component taken by the camera tends to be deteriorated. To avoid this drawback, the width or vertical dimension of the third wide portion 511 of the cam groove 506 of the cam 504 is determined to be equal to a sum of the diameter of the roller 502 and 3 mm, namely, to be smaller than that of the first wide portion 508 by 3 mm, so as to reduce the amount of variation of the distance between the electronic component and the high-speed camera 562 for thereby minimizing the deterioration of the image taken by the camera 562.

The selection of the height position of each head 120 is effected between the component mounting and sucking positions, more specifically, when the height position changing valve 532 corresponding to the head 120 whose height should be changed passes the tenth angular position of FIG. 18. The movement to the tenth angular position of the valve 532 of the head 120 whose height should be changed can be detected on the basis of the amount of operation of the main drive servomotor 402. Further, the current high or low height position of the head 120 with respect to the rotary plate 392, and the high or low height position of that head 120 that should be selected at the component sucking and mounting positions, can be determined according to the component sucking and mounting programs. Based on these information, the height position changing valve 532 of each rotary plate 392 is switched by the third valve switching device 538 at the tenth angular position to activate the corresponding air cylinder 90 to change the height position of the corresponding head 120, if the currently selected height position is different from the height position that should be selected for the next electronic component. If the thin component having a height up to 2 mm is to be mounted, the high height position is selected. If the thick component having a height of 2 mm–6 mm is to be mounted, the low height position is selected. The rollers 540, 542 of the third valve switching device 538 are normally placed in their non-operating positions, and one of these rollers 540, 542 is moved to the operating position to switch the height changing valve 532, as described above with respect to the first and second valve switching devices 534, 536.

The switching of the height position changing valves 532 to select or change the height position of the heads 120 is effected while the cam follower roller 502 is moved through the horizontal first narrow portion 510 of the cam groove 506, which is located upstream of the first wide portion 508 as viewed in the rotating direction of the rotary plate 392, as indicated in FIG. 17. In this arrangement, the roller 502 is prevented from being moved in the first narrow portion 510 in the vertical direction even when the direction in which the roller 502 is biased by the air cylinder 520 is changed upon switching of the valve 532, whereby the cam follower roller 502 is smoothly moved through the first narrow portion 510 upon activation of the air cylinder 520 by the height position changing valve 532. When the roller 502 is biased upwards against the upper side surface 526, the head 120 is located at its high height position at the component sucking, image taking and component mounting positions. When the roller 502 is biased downwards against the lower side surface 528, the head 120 is located at its low height position at the component sucking, image taking and component mounting positions.

Where the thick electronic component 164 is to be mounted, the head 120 at the component sucking position is placed in the high height position in which the distance between the suction tube 162 and the upper surface of the component holder tape is 10 mm, so that the stroke of the vertical movement of the head 120 by the elevating and lowering device 260 at the component sucking position is equal to 10 mm plus an expected possible vertical positioning error of the apparatus 380 due to some manufacturing error of associated elements or devices such as those of the electronic component supply device 14. Where the thin electronic component 164 is to be mounted, the head 120 at the component sucking position is placed in the low height position in which the above-indicated distance is 4 mm, so that the vertical stroke of the head 120 is equal to 4 mm plus the expected possible vertical positioning error of the apparatus 380. To obtain these vertical strokes of the head 120, the position of the pivoting axis of the lever 276 of the head elevating and lowering device 260 is changed by the head stroke adjusting servomotor 296, to change the vertical stroke of the vertically movable member 266.

Where the head 120 located at the component sucking position is placed in its low height position for picking up the thin component 164, the cam follower roller 502 is moved in the cam groove 506 while it is forced downwards against the lower side surface 528. In this case, the head 120 is raised by 3 mm when the roller 502 is moved from the first wide portion 508 into the third wide portion 511, as is apparent from FIG. 17. That is, the height position of the head 120 when the roller 502 is located in the third wide portion 511 or when the head 120 passes the image taking position or the high-speed camera 562 is 3 mm higher than that when the roller 502 is located in the first wide portion 508 or when the head 120 is located at the component sucking position. Where the head 120 located at the component sucking position is placed in its high height position for picking up the thick component 164, the roller 502 is moved in the cam groove 506 while it is forced upwards against the upper side surface 528. In this case, the head 120 located at the image taking position has the same height as that at the component sucking position. Thus, the height difference of the head 120 between the high and low height positions at the image taking position is reduced to 3 mm from the height difference of 6 mm at the component sucking position, so that the tendency of deterioration of the image quality obtained by the high-speed camera 562 is reduced.

The cam follower roller 502 is then moved into the second wide portion 509 through the second narrow portion 514, and the head 120 reaches the component mounting position. Where the high height position of the head 120 is selected for the component mounting position, the roller 502 is moved in rolling contact with the upper side surface 526, so that the head 120 is stopped at the component mounting position such that the lower end face of the suction tube 162 is spaced 14 mm apart from the upper surface of the printed-circuit board 38, as shown at right in FIG. 24. Where the low height position of the head 120 is selected, the head 120 is stopped at the component mounting position such that the lower end face of the suction tube 162 is spaced 10 mm apart from the upper surface of the board 38, as shown at left in FIG. 24. Thus, there exists a height difference of 4 mm in these two cases. When the thick component 164 is mounted on the board 38, the vertical stroke of the head 120 is equal to S1 plus an expected possible vertical positioning error of the apparatus 380 due to some manufacturing error of associated elements or devices such as those of the device for positioning the board 38. The value S1 is the distance of 14 mm between the lower end face of the suction tube 162 and the upper surface of the board 38, minus the height of the component 164. When the thin component 164 is mounted on the board 38, the vertical stroke of the head 120 is equal to S2 plus the vertical positioning error. The value S2 is the distance of 10 mm minus the height of the component 164. To obtain these vertical strokes S1, S2, the position of the pivoting axis of the lever 276 of the head elevating and lowering device 260 is adjusted to change the vertical stroke of the vertically movable member 266.

As described above, the height position of the head 120 at the component mounting position is increased for the thick component 164, and is decreased for the thin component 164. The high and low height positions for the thick and thin components are determined so as to avoid an interference of the electronic component held by the head 120, with the electronic components already mounted on the printed-circuit board 38. Further, the present arrangement is effective to reduce the required vertical stroke of the head 120 when the thin components are mounted.

It will be understood from the above explanation that the height position of the heads 120 at the component sucking, image taking and component mounting positions can be changed in two steps by the height position changing air cylinders 520 provided for the twelve component holder heads 120, respectively, and the cam groove 506 which has the first, second and third wide portions 508, 509, 511 corresponding to the respective component sucking, component mounting and image taking positions. These elements 520, 508, 509, 511 constitute a major portion of a height position changing device, which is one form of a device for changing the movement path of the component holder heads 120 during rotary movements thereof. At the component sucking and mounting positions, the height position of the heads 120 stopped at those sucking and mounting positions is changed. The height position changing air cylinders 520 and the first and second wide portions 508, 509 constitute a stop position height changing device for changing the height of the heads 120 at the component sucking and mounting positions at which the heads 120 are stopped.

Referring next to FIGS. 25–31, there will be described an electronic component mounting system equipped with an electronic component transferring and mounting apparatus 600 constructed according to a third embodiment of the present invention.

The electronic component transferring and mounting apparatus 600 includes four concave globoidal cams 602a–602d similar to the concave globoidal cams 90a–90d provided in the transferring and mounting apparatus 12 of the first embodiment. In the present apparatus 600, however, fifteen rotary plates 604 are rotated by the four concave globoidal cams 602a–602d.

Figure 25:
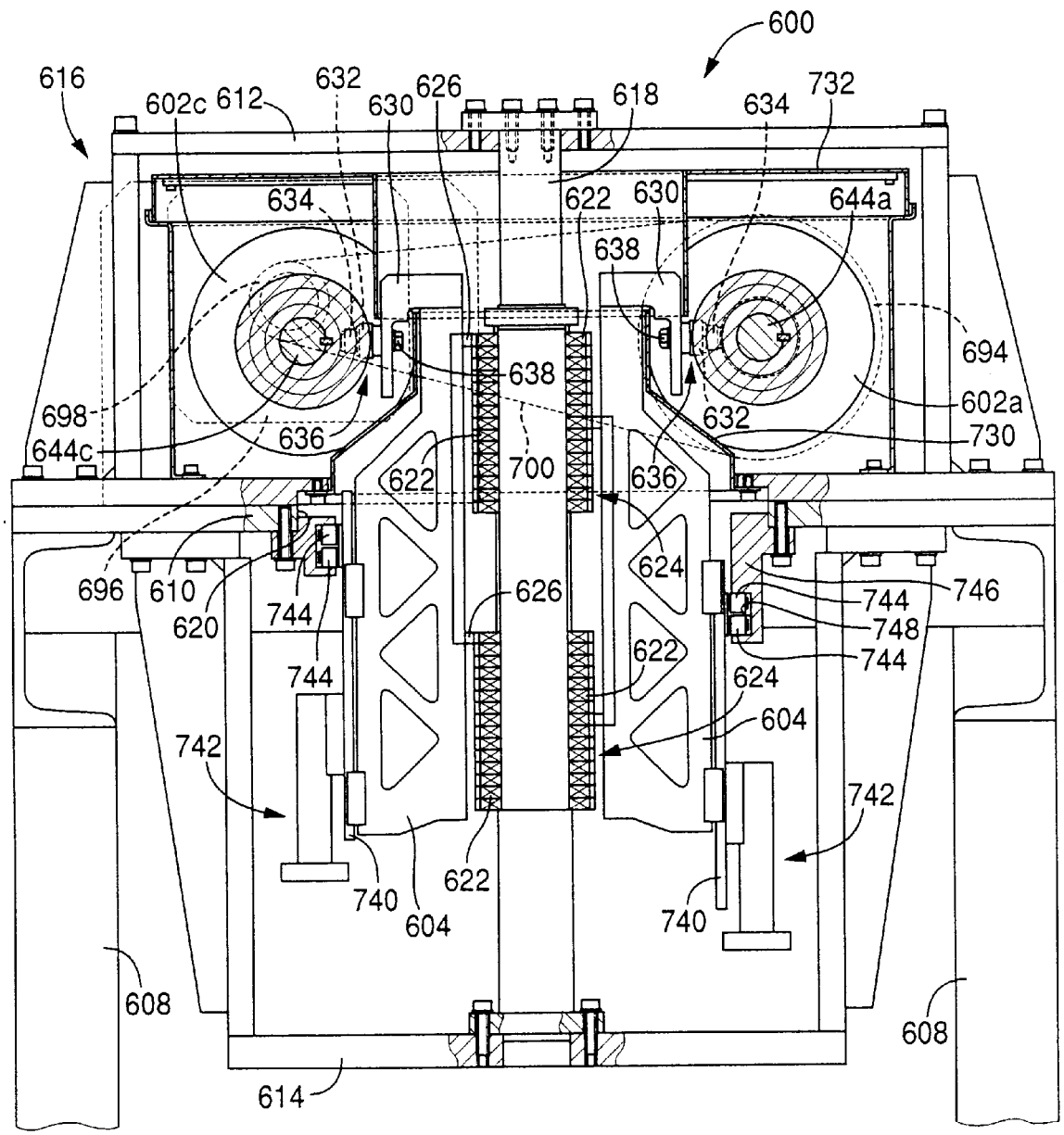
FIG. 25 is a front elevational view in cross section showing a transferring and mounting apparatus in an electronic component mounting system constructed according to a further embodiment of this invention.
Figure 26:
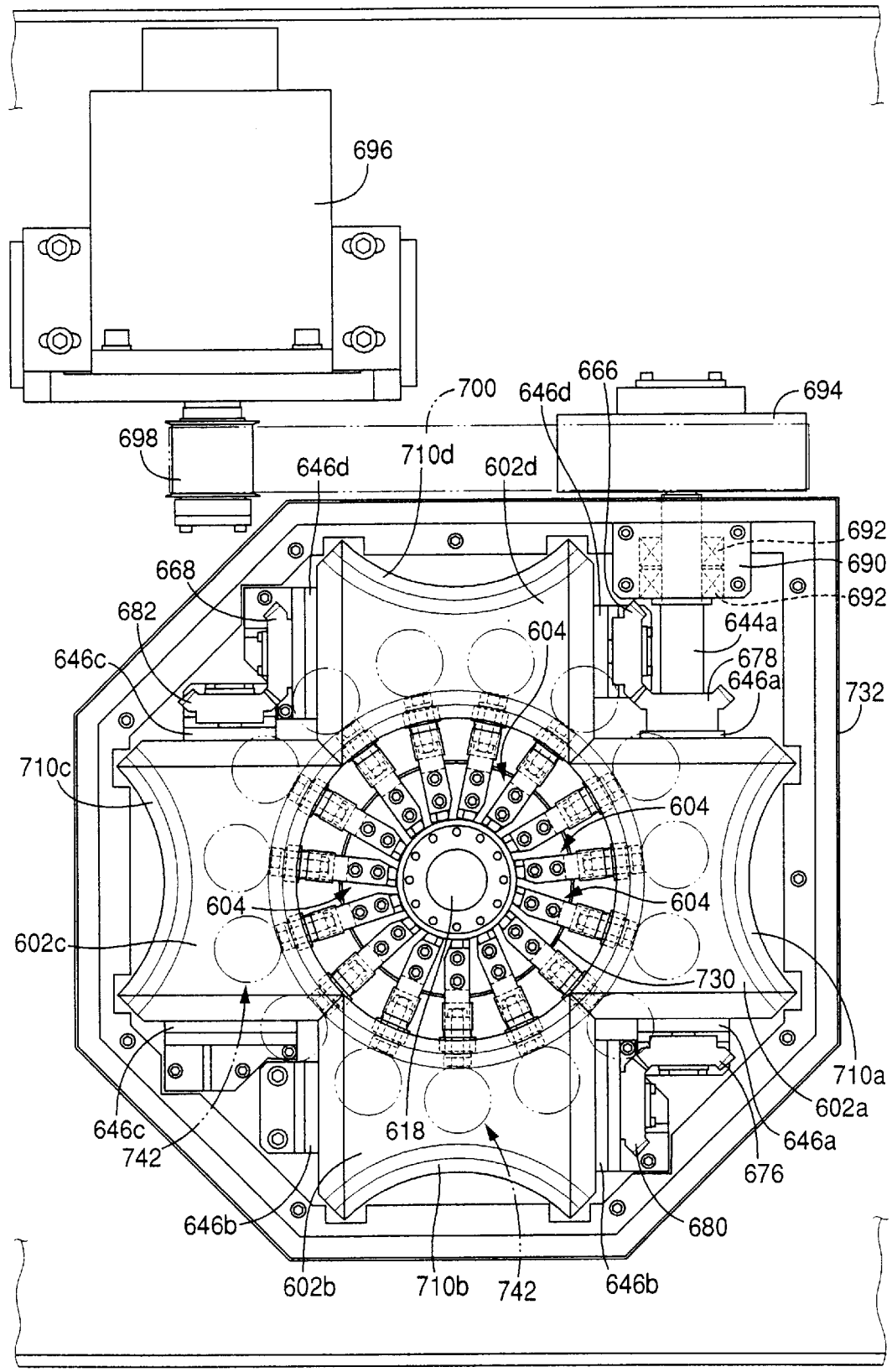
FIG. 26 is a plan view showing the transferring and mounting apparatus of FIG. 25.

As shown in FIG. 25, a base plate 610 is fixed in a horizontal posture, to top surfaces of a plurality of columns 608 extending upright from a base (not shown). Upper and lower support members 612, 614 are fixed to the upper and lower surfaces of the base plate 610. The upper and lower support members 612, 614 cooperate with the columns 608 and the base plate 610 to constitute a frame 616 of the present electronic component transferring and mounting apparatus 600. The upper and lower support members 612, 614 support a support shaft in the form of a stationary shaft 618 at their upper and lower ends. The stationary shaft 618 extends in the vertical direction through an opening 620 formed through the base plate 610. On two axial portions of the stationary shaft 618 which are spaced apart from each other in the vertical direction, there are disposed two arrays 624 of bearings 622. Each array 624 consists of fifteen bearings 624. Each of fifteen rotary plates 604 is supported through a pair of support arms 626 by the corresponding pair of bearings 622 one of which belongs to the upper array 624 and the other of which belongs to the lower array 624. Thus, the fifteen rotary plates 604 are supported by the bearings 622 rotatably about a common axis, which is the axis of the stationary shaft 618. In FIG. 26, the fifteen rotary plates 604 are shown as being equi-angularly spaced from each other about the stationary shaft 618.

The fifteen rotary plates 604 extend through the opening 620 formed through the base plate 610 such that the upper portion of each rotary plate 604 projects upwards from the base plate 610. Each rotary plate 604 has a bracket 630 fixed to its upper end, and carries a large-diameter roller 632 and a small-diameter roller 634 attached to its upper end through the bracket 630 such that the rollers 632, 634 are rotatable about a horizontal axis which extends in the radial direction of the stationary shaft 318. These rollers 632, 634 cooperate to constitute a cam follower 636. A support shaft 638 is fixed to the bracket 630. The large-diameter roller 632 is rotatably mounted through a bearing (not shown) on a fixed end portion of the support shaft 638 which is adjacent to the bracket 630, while the small-diameter roller 634 having a smaller diameter than the large-diameter roller 632 is rotatably mounted through another bearing on a free end portion of the support shaft 638 which is remote from the bracket 630.

Figure 27:
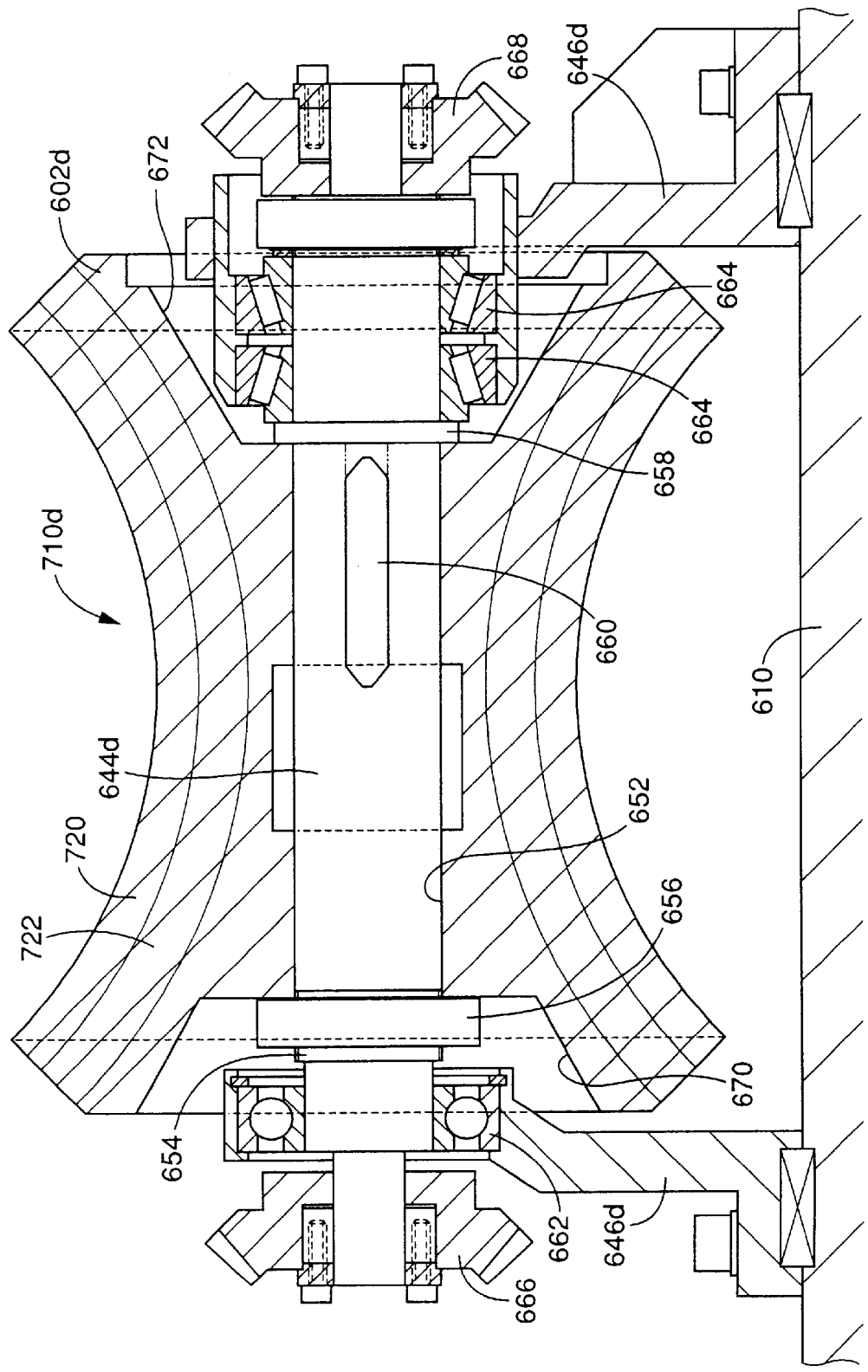
FIG. 27 is a front elevational view in cross section showing one of concave globoidal cams in the transferring and mounting apparatus of FIG. 25.

As shown in FIG. 26, the four concave globoidal cams 602a–602d are disposed symmetrically with respect to the axis of the stationary shaft 618 such that lines of intersection of the outer circumferential surfaces of the concave globoidal cams 602 with a plane including axes of all of the concave globoidal cams 602 cooperate to define a substantially continuous circle which has a center at the axis of the stationary shaft 618. The concave globoidal cams 602a–602d are coaxially mounted on respective rotary shafts 644a–644d, as shown in FIGS. 25–27, such that the cams 602 are rotated with the rotary shafts 644 and are not axially immovable relative to the rotary shafts 644. The rotary shaft 644b of the cam 602b is not shown in these figures. The four rotary shafts 644a–644d are rotatably supported by respective pairs of brackets 646a–646d through respective bearings.

The concave globoidal cam 602d will be described in detail by reference to FIG. 27, by way of example. The rotary shaft 644d is inserted through a bore 652 formed through the concave globoidal cam 602d, and has an externally threaded portion 654 at one end thereof, a nut 656 screwed on the externally threaded portion 654, and a flange 658 formed at the other end portion. The nut 656 and the flange 658 cooperate to hold the concave globoidal cam 602d at the opposite ends of the bore 652, so that the concave globoidal cam 602d and the rotary shaft 644d are not axially movable relative to each other. A rotary motion of the rotary shaft 618 is transmitted to the concave globoidal cam 602d through a key 660.

The rotary shaft 644d is rotatably supported at its opposite ends by the brackets 646d through respective bearings 662, 664. The rotary shaft 644d is provided with two bevel gears 666, 668 fixed to its opposite end portions extending from the bearings 662, 664. Portions of the brackets 646d and bearings 662, 664 are accommodated in tapered recesses 670, 672 formed in the opposite end portions of the concave globoidal cam 602d. For the bevel gears 666, 668 of the rotary shaft 644d to mesh with the adjacent bevel gears of the rotary shafts 644a and 644c, the bevel gears 666, 668 are required to be located outwardly of the bearings 662, 664 as viewed in the axial direction of the rotary shaft 644d. If the bearings 662, 664 were located axially outwardly of the bevel gear 666, 668, it would be difficult to have the bevel gears 666, 668 mesh the adjacent bevel gears while avoiding an interference between the bearings 662, 664 and the bearings of the rotary shafts 644a, 644c.

Like the concave globoidal cam 602d, the rotary shaft 644a of the concave globoidal cam 602a has bevel gears 676, 678. The bevel gear 678 on the side of the cam 602d meshes with the bevel gear 666. Unlike the rotary shafts 644a, 644d, each of the rotary shafts 644b, 644c of the cams 602b, 602c has a bevel gear 680, 682 at only one of its ends. The bevel gear 680 of the rotary shaft 644b meshes with the bevel gear 676 of the rotary shaft 644a, while the bevel gear 682 of the rotary shaft 644c meshes with the bevel gear 668 of the rotary shaft 644d.

The rotary shaft 644a of the concave globoidal cam 602a has an extension which extends further from the bevel gear 678 and at which the rotary shaft 644a is rotatably supported by a bracket 690 through a bearing 692. The bracket 690 is fixed to the base plate 610. This extension of the rotary shaft 644a has a timing pulley 694 fixed thereto. A rotary motion of a drive source in the form of a main drive servomotor 696 is transmitted to the timing pulley 694 through a timing pulley 698 and a timing belt 700, so that the concave globoidal cam 602a is rotated, whereby the four concave globoidal cams 602a–602d are contemporaneously rotated in synchronization with each other through meshing engagement of the bevel gears 666, 668, 676, 678, 680, 682 with each other. Thus, the rotary shaft 644a functions as an input shaft which receives the rotary motion of the servomotor 696 to rotate the four concave globoidal cams 602a–602d.

Figure 28:
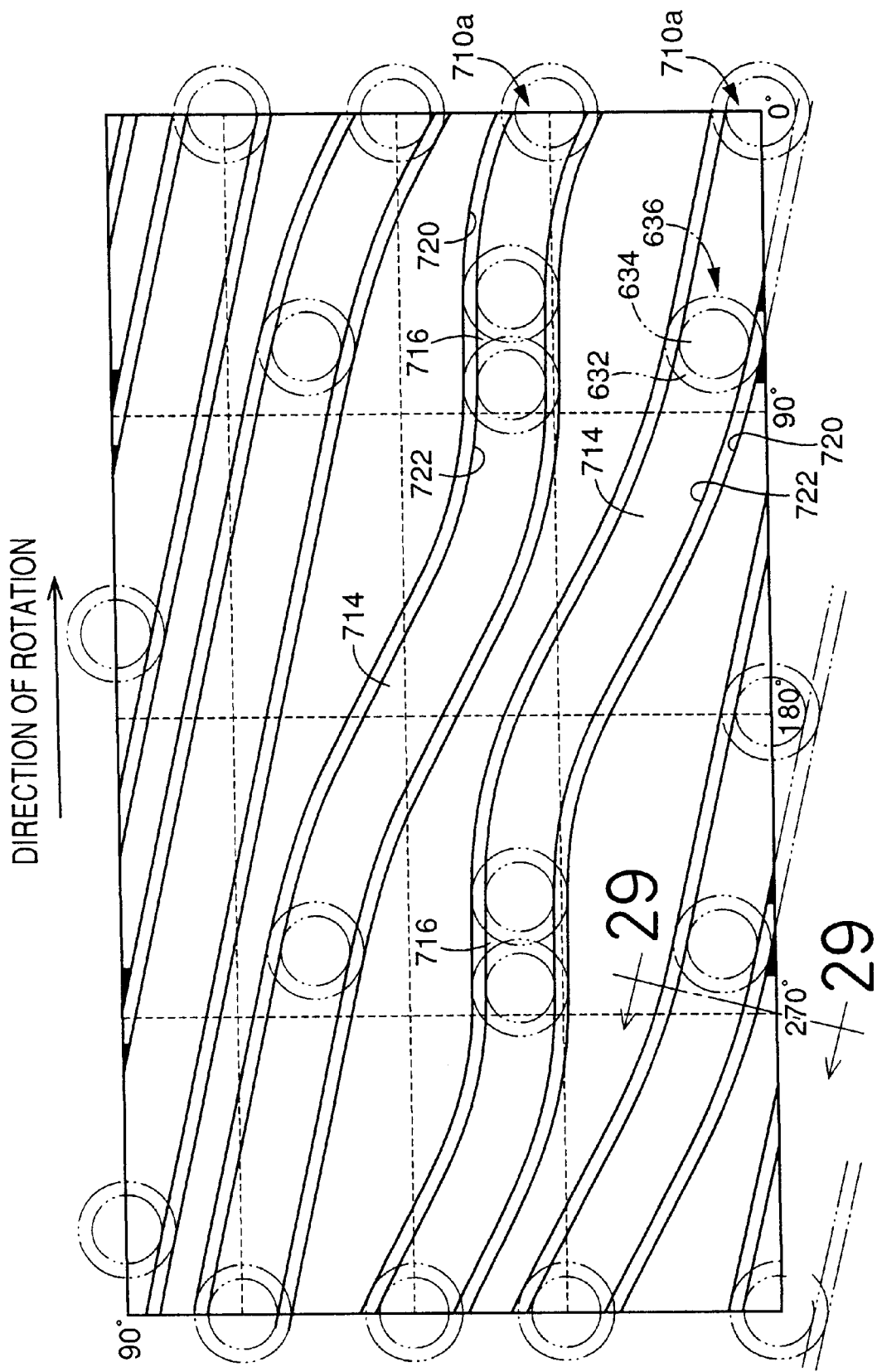
FIG. 28 is a view showing cam grooves of the concave globoidal cam of FIG. 27, in a developed state.

The concave globoidal cams 602a–602d have respective cam grooves 710a–710d. Described more specifically, each of the cams 602 has two identically shaped cam grooves 710 formed in the outer circumferential surface. The cam grooves 710a of the cam 602a are illustrated in FIG. 28, by way of example. The two cam grooves 710a are formed with an angular phase difference of 180°, and receive cam followers 636 of the two adjacent rotary plates 604.

The concave globoidal cam 602a is disposed at a position of the base plate 610 corresponding to the image taking position. Each cam groove 710a has an inclined portion 714 having a lead angle with respect to a plane perpendicular to the axis of the rotary shaft 744a, and a non-lead portion 716 which does not have such a lead angle and which is perpendicular to the axis of the rotary shaft 644a. When the rotary plate 604 is stopped, the inclined portion 714 functions to initially accelerate the rotary plate 604 (which has been rotated at a constant angular velocity) for rotating it over a relatively large angular distance per unit time, and then decelerating the rotary plate 604 to be stopped at the stop position (i.e., image taking position). When the rotary motion of the rotary plate 604 is resumed after a predetermined time of stopping at the stop position, the inclined portion 714 functions to initially accelerate the rotary plate 604, and then decelerating it down to the constant angular velocity. The function of the inclined portion 714 is the same as that of the inclined portion of the concave globoidal cams 62, 410 of the first and second embodiments. The cam grooves 710d, 710b of the cams 602d, 602b disposed at respective positions of the base plate 610 corresponding to the component sucking and mounting positions have the same inclined and non-lead portions as those of the cam grooves 710a. The cam grooves 710c of the cam 602c have only an inclined portion, so that the rotary plate 604 rotated by this cam 602c is not stopped, and is rotated at the constant angular velocity.

The cam grooves 710a, 710b, 710c of the concave globoidal cams 602a, 602b, 602c are formed such that the appropriate three rotary plates 604 reach the image taking and component mounting and sucking positions at respective different times, more specifically, such that the points of time at which the three rotary plates 604 reach those three stop positions differ from each other by a time length substantially equal to one third of the time interval at which the fifteen rotary plates 604 reach each of those three stop positions. This time interval is the required time of rotary movement of each rotary plate corresponding to the angular spacing pitch of the rotary plates 604. In the present embodiment in which the three stop positions are provided, the above-indicated time difference of the points of time at which the three rotary plates 604 reach the three stop positions is determined to be equal to one third of the above-indicated time interval. The inclined portions 714 of the cam grooves 710a, 710b, 170c have the same angle of inclination at their curved and straight sections, so that the three cams 602a, 602b, 602c cause the rotary plates 604 to have the same velocity of the constant velocity movement, the same acceleration and the deceleration. However, the straight sections of the inclined portions 714 of the cam grooves grooves 610a, 710b, 710b have different lengths, so that the angular distance between the component sucking position and the image taking position is different from the distance between the image taking position and the component mounting position. This arrangement causes the appropriate three rotary plates 604 to reach the image taking and component sucking and mounting positions at times different from each other by a time substantially equal to one third of the time interval corresponding to the angular spacing pitch of the rotary plates 604. The cam groove 710c of the cam 602c is formed such that the angle of inclination of the inclined portion 714 is the same as that of the straight sections of the inclined portions 714 of the cam grooves 710a, 710b, 710d, so that the rotary plates 604 are rotated by the cam 602c at the same velocity as that when the rotary plates are rotated by the cams 602a, 602b, 602d.

Figure 29:
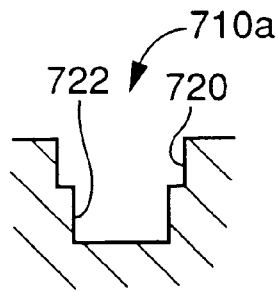
FIG. 29 is a cross sectional view taken along line 29—29 of FIG. 28, showing the cam groove of the concave globoidal cam.

Referring to FIG. 29, there is shown the cam groove 710a by way of example. Each of the cam grooves 710a–710d is a two-step groove having a wide portion 720 having a relatively large width, and a narrow portion 722 which is formed in the bottom surface of the wide portion 720 and which has a smaller width than the wide portion 720. The large-diameter roller 632 and the small-diameter roller 634 are held in rolling engagement with the wide portion 710 and the narrow portion 722, respectively.

Figure 30:
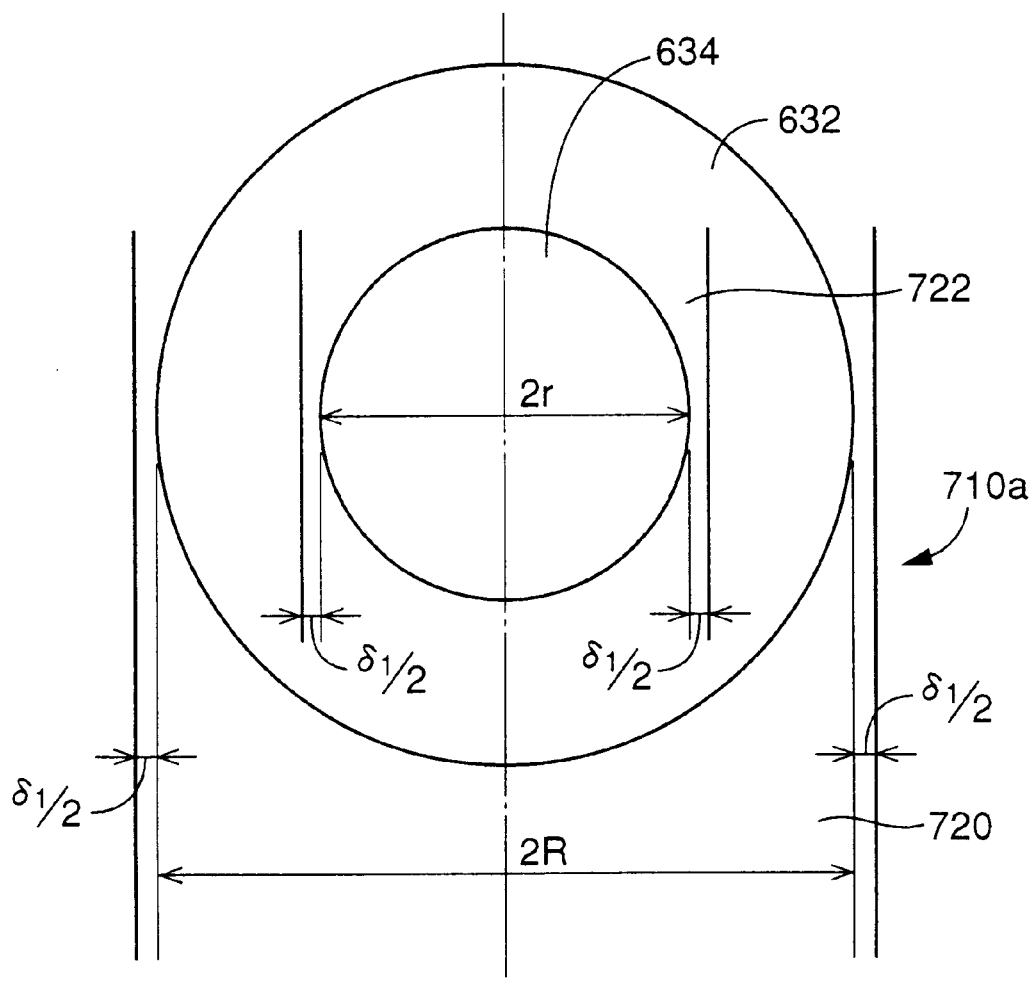
FIG. 30 is a view for explaining an offset of center lines of wide and narrow portions of the cam groove of the concave globoidal cam of FIG. 27.

As shown in FIG. 30, the width of the wide portion 720 is equal to a diameter 2R of the large-diameter roller 632 plus $\delta_1$, while the width of the narrow portion 722 is equal to a diameter 2r of the small-diameter roller 634 plus $\delta_1$. The wide and narrow portions 720, 722 have center lines which are offset from each other by a small distance. The wide and narrow portions 720, 722 are formed such that the center lines of the wide and narrow portions 720, 722 are offset from each other by a distance of $\delta_1+\delta_2$. That is, the center lines of the wide and narrow portions 720, 722 are shifted or offset in the opposite directions perpendicular to the direction of length of the cam groove 710, by a distance of $(\delta_1 2+\delta_2/2)$, from the state of FIG. 30 in which one-dot chain line indicates the path of movement of the axes of rotation of the rollers 632, 634 and in which there exist clearances of $\delta_1/2$ between the rollers 632, 634 and the opposite side surfaces of the wide and narrow portions 720, 722 of the cam groove 710. The value $\delta_2$ indicates an expected total amount of elastic deformation of the rollers 632, 634, support shaft 638 and side surfaces of the cam grooves 710a. Therefore, the offset distance of the center lines of the wide and narrow portions 720, 722 is equal to $(\delta_1+\delta_2)$. The large-diameter roller 632 is held in pressing rolling contact with one of the opposite side surfaces of the wide portion 720, while the small-diameter roller 634 is held in pressing rolling contact with the side surface of the narrow portion 722 which is opposite to the above-indicated one side surface of the wide portion 720.

The end sections of the cam groove 710a of the cam 602a constitute a part of the inclined portion 714, and are inclined with respect to a plane perpendicular to the axis of rotation of the cam 602a. One of the opposite side wall portions of these end sections which define the width of the cam groove 710a has a comparatively small wall thickness and a comparatively low strength. This fact is true for both of the wide and narrow portions 720, 722 of the cam groove 710a. The side wall portion having the small strength, particularly, of the narrow portion 722, is removed by cutting, as indicated by solid black areas in FIG. 28, since these end sections have a small width and a low strength and may deform due to a load applied by a cutting tool during cutting of the groove 710 or a load applied from the large-diameter and small-diameter rollers 632, 634 during movements thereof in the wide and narrow portions 720, 722. The above-indicated side wall portion of the end sections of the cam groove 710a, if left on the cam 602a, may distrub the rotation of the cams 602. The removed side wall portions of the wide and narrow portions 720, 722 are spaced apart from each other in the circumferential direction of the cam 602a.

As shown in FIG. 25, the concave globoidal cams 602a–602d are covered by covers 730, 732 fixed to the base plate 610. The cover 730 covers an inner part of the assembly of the cams 602, while the cover 732 covers inner, outer and upper parts of the assembly of the cams 602.

As in the first and second embodiments, each of the fifteen rotary plates 604 has a vertical slide 740 vertically movably attached thereto. The vertical slide 740 carries a component holder head 742, as schematically shown in FIG. 25 in which the suction nozzle and other elements are not shown. The selection of the suction nozzles and the operation to remove the angular positioning error of the electronic component are effected by using the same servomotor as a drive source, as in the previous embodiments.

When the rotary plate 604 is rotated, two cam follower rollers 744 fixed to the vertical slide 740 are moved in rolling engagement with a cam groove 748 formed in a stationary cylindrical cam 746, whereby the vertical slide 740 is vertically moved. The two rollers 744 are rotatably fixed on the vertical slide 740 such that the two rollers 744 are spaced apart from each other in the axial direction of the stationary shaft 618. The upper and lower rollers 744 are held in pressing rolling contact at its circumferential surface swith the upper and lower side surfaces of the cam groove 748, with a small gap between the upper and lower rollers 744. This arrangment assures smmoth vertical movements of the vertical slide 740 without vibration as the vertical slide 740 is rotated relative to the stationary cylindrical cam 746. As in the first embodiment of FIGS. 1–12, head elevating and lowering devices similar to the device 260 are provided at positions corresponding to the component sucking and mounting positions, and a device for taking an image of the electronic component carried by the head 742 is provided at a position corresponding to the image taking position.

When the electronic component is mounted in the present electronic component transferring and mounting apparatus 600, the main drive servomotor 696 is started to rotate the four concave globoidal cams 602a–602d simultaneously in synchronization with each other. As a result, the fifteen rotary plates 604 are rotated, and stopped at the component sucking position to pick up the electronic component, at the image taking position to obtain the image of the electronic component, and at the component mounting position to mount the electronic component on the printed-circuit board 38.

As indicated in the time chart of FIG. 31, the points of time at which the appropriate three rotary plates 604 stop at the component sucking, image taking and component mounting positions differ from each other by one third of the required time of rotary movement of each rotary plate 604 corresponding to the angular spacing pitch of the rotary plates 604. This arrangement is effective to smooth the load torque of the main drive servomotor 696, or reduce a variation in the load torque. In the present third embodiment in which the fifteen rotary plates 604 are used, the angular spacing pitch is equal to T/15, where T repesents the required time of one full rotation of the rotary plate 604 about the axis of the main shaft 316. In the time chart, the time is taken along the abscissa, while the angle of rotation about the axis of the stationary shaft 618 is taken along the ordinate. In the present embodiment, thirteen stations are evenly spaced from each other about the axis of the stationary shaft 618. The thirteen stations include three stations which correspond to the component sucking and mounting positions and the image taking position. The rotary plates 604 are not stopped at the other ten stations.

Figure 32A:
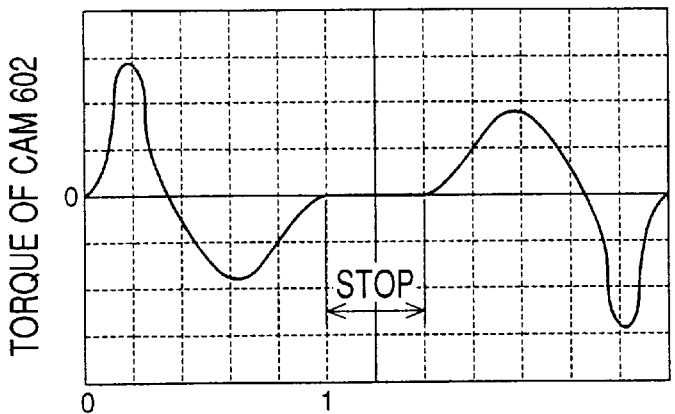
FIGS. 32A–32D are graphs showing changes in the torque of the concave globoidal cam at the stop position and its vicinity of the rotary plate in the apparatus of FIG. 25.

FIG. 32A indicates a variation in the load torque of a given concave globoidal cam 710 when the corresponding rotary plate 604 comes to a stop and resumes a rotary motion. The cam 710 is rotated a half turn (through 180°) during a rotary movement corresponding to the angular spacing pitch of the rotary plates 604. During the half turn of the cam 710, the corresponding rotary plate 604 is accelerated and decelerated and is held stopped at the stop position for a half of the predetermined stop time. During the next half turn, the rotary plate 604 is held stopped for the remainder of the stop time, and is accelerated and decelerated to move at a predetermined constant velocity. FIG. 32A shows the load torque of the cam 710 during one full turn thereof corresponding to the rotary motions of the two successive rotary plates 604 by the cam 710, that is, corresponding to the angular spacing pitch of the rotary plates 604 multiplied by two. The displacement, speed and acceleration of the rotary plates 604 during this time period change as indicated in FIGS. 11A-1, 11A-2 and 11A-3, respectively.

Prior to stopping of the rotary plate 604, the acceleration of the rotary plate 604 from the predetermined constant velocity causes a positive load torque to act on the concave globoidal cam 602 since the rotary plate 604 tends to rotate at the constant velocity. The subsequent deceleration of the rotary plate 604 to be stopped at the stop position causes a negative load torque to act on the cam 602 since the rotary plate 604 tends to rotate at the constant velocity. Following the stopping of the rotary plate 604, too, the acceleration and deceleration cause a positive and a negative torque to act on the cam, respectively.

Figure 32B:
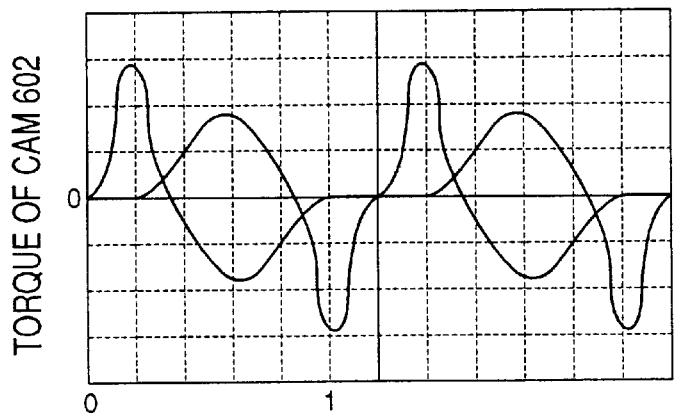
Figure 32C:
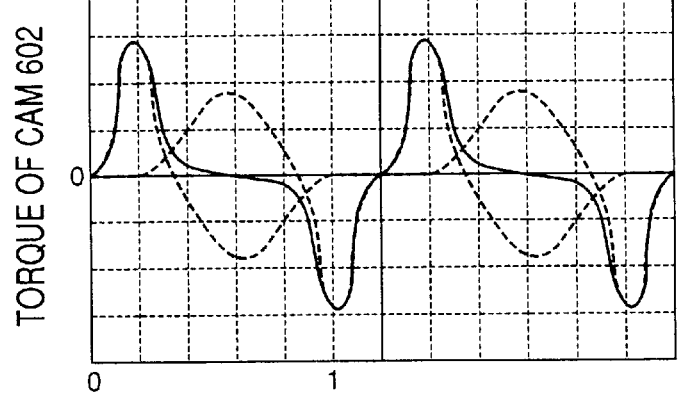

Since the two cam grooves 710 are formed in each of the cams 602a–602d, one cam follower roller 636 comes into engagement with one of the two cam grooves 710 each time the cam 602 is rotated by a half turn. Namely, the cam follower rollers 636 of the two successive rotary plates 604 alternately come into engagement with one and the other of the two cam grooves 710 one after another, during one full turn of the cam 602. As shown in FIG. 32B, therefore, the phases of two torque variation curves of the same pattern of the cam 602 corresponding to the two successive rotary plates 604 are offset from each other by 180°. In FIG. 32C, two broken lines indicate these two torque variation curves of the 180°-offset phases, while a solid line indicates a variation in the total torque of the cam 602, which is a sum of the load torque values represented by the load torque variation curves indicated by the broken lines. As indicated in FIG. 32A, the negative and positive load torque values of the cam 602 before and after the stopping of the rotary plate 604 symmetrically change with respect to the abscissa. Accordingly, the torque values of the cam 602 which correspond to the successive rotary plates 604 and which are represented by the broken lines are partially offset by each other, as indicated by the solid line in FIG. 32C, since the rotary motions of the two successive rotary plates 604 have a phase difference of 180°.

Figure 32D:
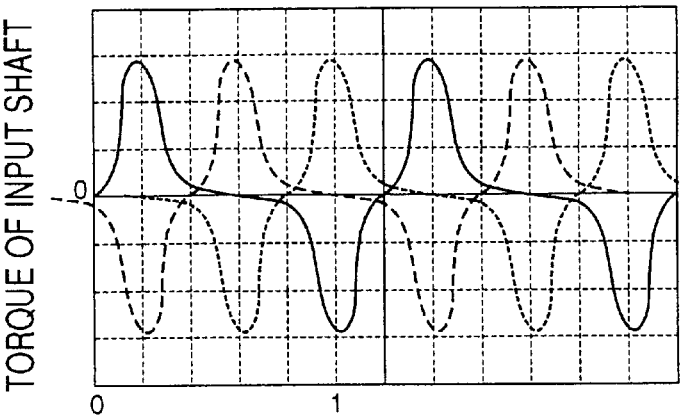
Figure 33:
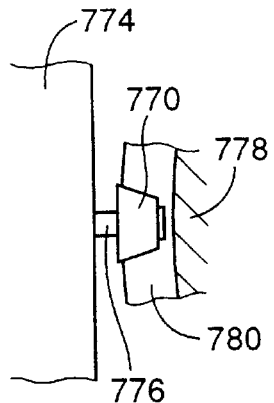
FIG. 33 is a plan view schematically showing means for preventing releasing of a cam follower in an electronic component transferring apparatus according to a still further embodiment of the invention.

As described above, the points of time at which the rotary plates 604 stop at the three stop positions during simultaneous rotations of the four cams 602*a*–602*d* by the common main drive servomotor 686 differ from each other by a time substantially equal to one third of the required time of movement of each rotary plate 604 corresponding to the angular spacing pitch of the rotary plates 604. Therefore, the load torque variation curves of the three cams 602*a*, 602*b*, 602*d* are offset from each other by the time substantially equal to one third of the movement time corresponding to the angular spacing pitch, as indicated in FIG. 32D, whereby the positive and negative load torque values of the three cams 602*a*, 602*b*, 602*d* are almost completely offset by each other, so that the variation in the load torque of the main drive servomotor 696 is effectively reduced.

Since the center lines of the wide and narrow portions 720, 722 of each cam groove 710*a*–710*d* are offset from each other, the large-diameter and small-diameter rollers 632, 634 are held in pressing contact with the opposite side surfaces of the wide and narrow portions 720, 722, as described above. Accordingly, the rollers 632, 634 can smoothly roll in the wide and narrow portions 720, 722 of the cam groove 710, without causing vibrations and noises of the rotary cam 604.

The present apparatus 600 also permits smooth transition of the cam followers 636 from the cam groove of one of the cams 602 to the cam groove of the adjacent cam 602, without vibrations and shocks. The opposite end sections of each cam groove 710 are part of the inclined portion 714, which is inclined with respect to the axis of the cam 602. A straight line connecting the points of contact of the large-diameter and small-diameter rollers 632, 634 with the side surfaces of the wide and narrow portions 620, 722 of the cam groove 710 is inclined with respect to a straight line connecting the open ends of the wide and narrow portions 720, 722 which are open in the end faces of the cam 602.

Accordingly, the large-diameter and small-diameter rollers 632, 634 reach the ends of the wide and narrow portions 720, 722 at different times. Namely, when the cam follower 636 is moved from the cam groove of the two adjacent cams 602 into the cam groove of the other cam 602, the large-diameter roller 632 first reaches the joint or interface between the cam grooves of the adjacent cams 602. Since there exist some gaps between the adjacent cam grooves, in particular, due to cutting of the end sections of the wide portion 720, the large-diameter roller 632 located at the joint is placed in a released state in which the roller 634 is not interposed between the opposite side surfaces of the wide portion 720. At this time, that is, when the large-diameter roller 632 is located at the joint of the two cam grooves 710, the small-diameter roller 634 has not reached the joint, and is still interposed between the opposite side surfaces of the narrow portion 722. Since the small-diameter roller 634 is thus supported by the narrow portion 722, the large-diameter roller 632 can smoothly transit from from one of the two adjacent cam grooves 710 into the other cam groove, without vibration. When the small-diameter roller 634 reaches the joint of the two cam grooves 710, the large-diameter roller 632 has already been interposed between the opposite side surfaces of the wide portion 720 of the above-indicated other cam groove 710, whereby the small-diameter roller 634 can smoothly transit into this other cam groove, without vibration.

It is noted, in particular, that the cam grooves 710*a*–710*d* are formed such that the rotary plates 604 are moved at the predetermined constant velocity while the cam followers 636 are located in the opposite end portions of the cams 602*a*–602*d*. This arrangement assures reduced vibration and shock of the cam followers 636 upon transition thereof between the adjacent cams 602, than in the case where the rotary plates 604 are accelerated or decelerated while the cam followers 636 are located in the opposite end portions of the cams.

As described above, the large-diameter roller 632 and the small-diameter roller 634 are placed in the released state in which the rollers 632, 634 are not interposed between the opposite side surfaces of the wide and narrow portions 720, 722 of the cam grooves 710 of the adjacent cams 602 when the rollers 632, 634 are moved from one of the cam grooves to the other. Since one of the rollers 632, 634 is interposed between the opposite side surfaces of one of the adjacent cam grooves, the cam follower 636 can be smoothly moved between the adjacent cam grooves, without shock and vibration.

While each of the cam followers 636 engaging the cam grooves 710*a*–710*d* of the concave globoidal cams 602*a*–602*d* used in the third embodiment of this invention consists of the large-diameter roller 632 and the small-diameter roller 634, the cam follower 636 may be a tapered roller 770 whose diameter continuously decreases in the direction toward the bottom of a cam groove 780 of a concave globoidal cam 778. The tapered roller 770 is rotatably supported through a bearing (not shown) by a support shaft 776 fixed to a rotary plate 774. In this case, the cam groove 780 is a generally V-shaped groove having a trapezoid shape in transverse cross section.

When the tapered roller 770 is moved from one of the cam grooves 780 of the adjacent cams 778 into the other cam grooves, the portion of the tapered roller 770 having a relatively large diameter first reaches the joint between the two cam grooves, but at this time the portion of the tapered roller 770 having a relatively small diameter does not reach the joint and is still interposed between the opposite side surfaces of the above-indicated one cam groove 780, so that the large-diameter portion of the tapered roller 770 can be smoothly moved through the joint. When the small-diameter portion of the tapered roller 770 reaches the joint, the large-diameter portion has been already interposed between the opposite side surfaces of the above-indicated other cam groove 780, the small-diameter portion can be smoothly moved into this other cam groove.

Figure 34:
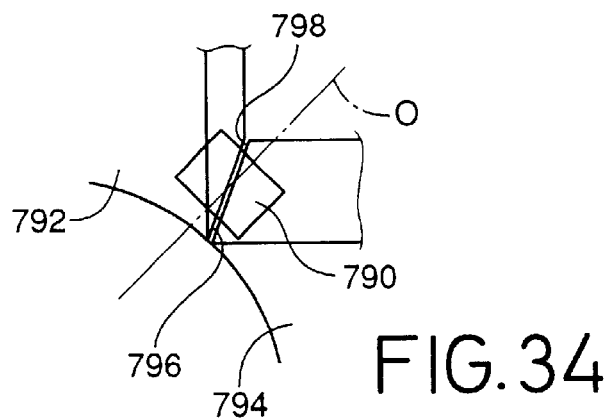
FIG. 34 is a plan view schematically showing means for preventing the releasing of the cam follower in an electronic component transferring apparatus according to a yet further embodiment of this invention.

The cam follower may be a cylindrical roller having a constant diameter, as indicated at 790 in FIG. 34. In this case, the radially outer portions of the opposite end faces of adjacent concave globoidal cams 792, 794 have tapered surfaces 796, 798 which are parallel and adjacent to each other in a plane including the axes of rotation of the cams 792, 794. The generators of the tapered surfaces 796, 798 in the above-indicated plane are inclined in this plane, at selected points on the generators, with respect to a normal line perpendicular to the common axis about which the rotary plates are rotated. The roller 790 has an axis of rotation which is perpendicular to the above-indicated common axis and parallel to the above-indicated normal line. When the tapered roller 790 is moved through the joint of the adjacent cam grooves, the circumferential surface portions of different axial portions of the roller 790 reach the joint at different times. When a given portion of the roller 790 reaches the joint, the other portion is still interposed between the opposite side surfaces of one of the adjacent cam grooves, so that the roller 790 is not placed in a released state at the joint of the two cam grooves, whereby the roller 790 can be smoothly moved into the other cam groove.

Figure 35:
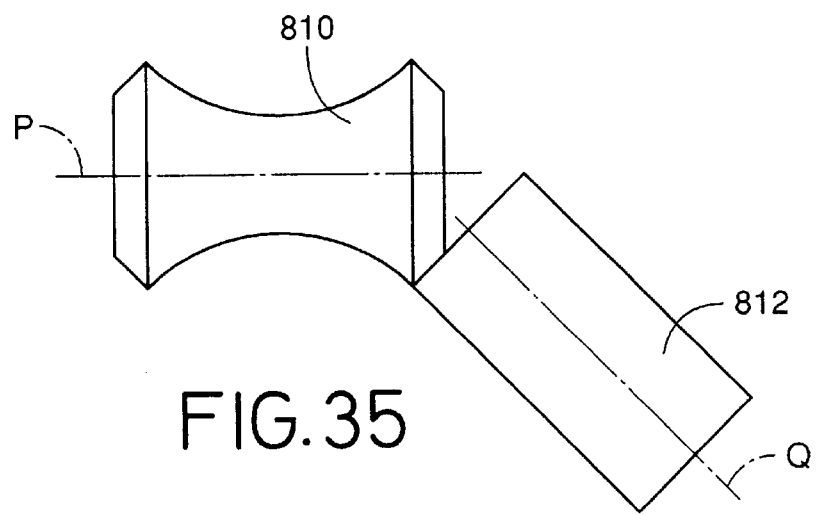
FIG. 35 is a view schematically showing an example of cam follower releasing preventing means provided in an apparatus in which a concave globoidal cam is used in combination with a cylindrical cam.

Movable members may be moved by a combination of a concave globoidal cam 810 and a cylindrical cam 812, as shown in FIG. 35. In this case, too, suitable means may be provided for preventing a cam follower from being placed in the released state at the joint of adjacent cam grooves. The movable members are rotated by rotation of the concave globoidal cam 810, about an axis which is perpendicular to a plane including axes of rotation P, Q of the cams 810 and 812 and which passes a center of a circular arc which is defined by a line of intersection between the above-indicated plane and the circumferential surface of the globoidal cam 810. Then, the movable members are linearly moved by rotation of the cylindrical cam 812 in a direction parallel to the axis of rotation Q of the cylindrical cam 812. In this arrangement, such means as provided in the illustrated embodiments may be used for preventing the releasing of the cam follower at the joint of the adjacent cam grooves. For instance, the means may include the provision of two-step cam grooves having a wide portion and a narrow portion, and the provision of cam followers each including a large-diameter portion and a small-diameter portion. The combination of cams need not be a combination of a single concave globoidal cam and a single cylindrical cam. Namely, the combination may consist of at least one concave globoidal cam and at least one cylindrical cam, which cooperate to move movable members along a desired path such as a path like a track defined by two opposite parallel straight lines and two circular arcs connecting the ends of the parallel straight lines.

While the presently preferred embodiments of the present invention have been described above in detail, it is to be understood that the invention is not limited to the details of the illustrated embodiments, but may be otherwise embodied.

In the illustrated embodiments, the component holder heads 120, 742 fixedly provided on the vertical slides 124, 740 are vertically moved together with the vertical slide 124, 740, by the vertically movable members 266 provided in the stationary cylindrical cam 128, 504, 746, at two positions corresponding to the component sucking and mounting positions (stop positions). However, members for vertically moving the heads 120, 740 need not be a part of the stationary cam. For instance, the component holder heads may be fixed to the vertical slide while the vertical slide is vertically moved by the stationary cam, and may be vertically moved relative to the vertical slide to vertically move the heads at the component sucking and mounting positions, at which the locking of the heads to the vertical slide is released.

Like the apparatus 380 of FIGS. 13–24, the apparatus 12 of FIGS. 1–12 and the apparatus 600 of FIGS. 25–32 may be adapted such that each of the component sucking and mounting positions is selectable from two or more sucking or mounting positions. In addition, or alternatively, the apparatus 12, 600 may be adapted such that the height position of the heads 120, 742 at each of the component sucking, image taking and component mounting positions is selectable from two or more height positions.

Further, the apparatus 12 of FIGS. 1–12 and the apparatus 600 of FIGS. 25–32 may be adapted such that the images of the electronic components 164 held by the suction nozzles 158 under suction are obtained without stopping the rotary movements of the rotary plates 70, 604, as in the apparatus 380 of FIGS. 13–24. In this case, a high-speed camera with a stroboscope or a device including for example a line sensor capable of obtaining images of the electronic components 164 in motion is provided at the image taking position, and the cam groove 92d, 710a of the concave globoidal cams 90d, 602a disposed at the image taking position are formed so that the rotary plates 70, 604 are rotated continuously, without stopping at the image taking position. The height position of the head 120 while the head 120 passes the image taking position may be changed in at least two steps, or may not be changed (may be held constant).

In the second embodiment of FIGS. 13–24, the stop position changing air cylinders 490 and the height position changing air cylinders 520 are controlled by mechanically switching the stop position changing valves 530 and the height position changing valves 532. However, these valves 530, 532 may be replaced by solenoid-operated valves, which may be switched on the basis of output signals of sensors which detect the passage of each rotary plate 392. Alternatively, the position of each rotary plate 392 may be determined on the basis of the amount of rotation of the main drive servomotor 402 or the angular position of the main shaft 388, and the solenoid-operated valves may be switched when the determined position of the rotary plate 392 coincides with the predetermined positions, more precisely, at the positions at which the stop positions of the component sucking, image taking and component mounting positions should be changed, and at the positions at which the height positions at those three angular positions should be changed.

Further, the air cylinders 544, 546 used for the first, second and third valve switching devices 534, 536, 538 may be replaced by solenoids adapted to move the rollers 540, 542 for switching the stop position changing valves 530 and the height position changing valves 532.

In the second embodiment of FIGS. 13–24, the high height positions of the heads 120 are selected at the component sucking, image taking and component mounting positions, when the electronic component 164 has a relatively large height, and vice versa. However, the high and low height positions of the heads 120 may be selected when the electronic components 164 have relatively small and large heights, respectively. In this case, for example, all of the relatively thick electronic components are first mounted on the printed-circuit board in a predetermined order, from one end of the board in the X-axis direction, and then the relatively thin electronic components are mounted at random. The mounting of the relatively thick electronic components does not cause any interference between the components to be mounted and the components already mounted on the board, since the relatively thick components are all mounted first in the predetermined order in one direction. Therefore, the height position of the heads 120 can be reduced during mounting of the relatively thick components.

During the mounting of the relatively thin components, on the other hand, the height position of the heads 120 is made high enough to avoid an interference between the components to be mounted and the already mounted components. The height position of the heads 120 may be made comparatively low for all the electronic components, if the components are all mounted in the predetermined order from one end of the printed-circuit board in the predetermined one direction.

In the embodiment of FIGS. 13–24, only one switching device 538 for switching the height position changing valves 532 is provided at the tenth angular position of FIG. 18 corresponding to the first narrow portion 510 between the component mounting and sucking positions. In this arrangement, if the high height position of the heads 120 is selected for the component sucking position, for example, the high height position is also selected for the image taking and component mounting positions. However, another switching device for switching the height position changing valves 532 may be provided at a suitable position, for instance between the component sucking and image taking positions. In this case, the cam groove 506 of the stationary cylindrical cam 504 has a third narrow portion between the first and third wide portions 508, 509. According to this arrangement, the low height position of the heads 120 may be selected at the image taking and component mounting positions even if the high height position is selected at the component sucking position.

The illustrated embodiments are adapted such that the twelve or fifteen rotary plates 70, 392, 604 are stopped at three or two stop positions. However, the number of the rotary members and the number of the stop positions (and the nature of the stop positions) may be suitably determined.

In the illustrated embodiments, the rotary members in the form of the rotary plates are equi-angularly spaced from each other at a predetermined angular interval about the axis of the stationary shaft 66 or main shaft 388, 618. However, it is possible that some of the rotary members are spaced from each other at a first angular interval, while the other rotary members are spaced from each other at a second angular interval different from the first angular interval.

The rotary plates 70, 392, 604 have a relatively smaller thickness at their inner end portions as viewed in the radial direction of the stationary or main shaft 66, 388, 618, in order to avoid an interference between the adjacent rotary plates. However, the interference may be avoided by increasing the radial distance between the inner ends of the rotary plates and the axis of the stationary or main shaft.

The illustrated electronic component transferring and mounting apparatus and electronic component mounting system are adapted to transfer and mount various electronic components whose heights are not larger than 6 mm, the principle of the present invention is equally applicable to such apparatus and system capable of transferring and mounting electronic components whose heights are larger than 6 mm.

The component holder heads 120, 742 in the illustrated embodiments may be provided with a positioning device for locking the nozzle holder 154 after one of the six suction nozzles 158 is placed in its operating position. In this case, the positioning device may include a positioning pin engageable with a selected one of six positioning holes corresponding to the six suction nozzles 158. The positioning holes may be tapered holes which are formed in one of the nozzle holder 154 and the stationary support shaft 152 rotatably supporting the nozzle holder 154, such that the tapered holes are equi-angularly spaced from each other in the circumferential direction of the nozzle holder 154 or support shaft 152. In this instance, the positioning pin is provided on the other of the nozzle holder 154 and the stationary support shaft 152, and is biased by suitable biasing means toward a position for engagement with the selected positioning hole. When one of the six suction nozzles 158 is selected, the positioning pin is disengaged from the positioning hole against the biasing force of the biasing means, to permit the rotation of the nozzle holder 154 relative to the stationary support shaft 152. A plurality of positioning pins may be provided so that a selected one of these pins is engageable with a single positioning hole.

In the third embodiment of FIGS. 25–32, the center lines of the wide and narrow portions 720, 722 of the cam groove 710 are offset from each other. This offset arrangement is not essential. Namely, the center lines of these wide and narrow portions 720, 722 may be aligned with each other.

Where the rotary plates are rotated by only the concave globoidal cams as in the first and third embodiments of FIGS. 1–12 and FIGS. 25–32, the number of the concave globoidal cams is not limited to four. That is, three or smaller or five or more concave globoidal cams may be used.

In the illustrated embodiments, the application of the vacuum pressure to the suction nozzles 158 is electrically controlled by switching devices including solenoid-operated directional control valves. However, the application of the vacuum pressure may be mechanically controlled. For instance, each of the rotary members (rotary plates) is provided with a switching valve having a switching member operable between a vacuum supply position and a vacuum cut position. When the switching member is placed in the vacuum supply position, the pressure in the suction nozzle is changed from the atmospheric or higher pressure to a reduced pressure, so that an electronic component is sucked up to the suction nozzle. When the switching member is placed in the vacuum cut position, the pressure in the suction nozzle is changed from the reduced pressure to the atmospheric or higher pressure, so that the electronic component held by the suction nozzle is released. In the second embodiment of FIGS. 24–32, the switching valves may be provided on the constant-velocity rotary disc 460. The switching member of each switching valve is moved to the vacuum supply position by a suitable actuator device which is disposed at a position corresponding to the component sucking position. The actuator device is activated to move the switching member to the vacuum supply position, in synchronization with the downward movement of the component holder head by the head elevating and lowering device 260. Another actuator device is disposed at a position corresponding to the component mounting position. This actuator device is actuated to move the switching member to the vacuum cut position, in synchronization with the downward movement of the head by the head elevating and lower device 260. The switching member is arranged to be held in the vacuum supply or cut position once this position is established.

Where the application of the vacuum pressure to the suction nozzles is mechanically controlled, too, the vertical stroke of the vertically movable member of each head elevating and lowering device 260 is reduced to the minimum value in the event of a failure of the suction nozzles to normally pick up the electronic component. This arrangement prevents a contact of the electronic component or suction tube with the printed-circuit board, and a movement of the switching member of the switching valve to the vacuum cut position by the actuator device disposed at the position corresponding to the component mounting position, whereby the electronic component erroneously picked up by the suction nozzle is not mounted on the printed-circuit board. A further actuator device is provided at a position corresponding to the component discarding area, so that the switching member of the switching valve is moved to the vacuum cut position to release the electronic component from the suction nozzle when the switching valve has reached the position of the actuator device in the component discarding area. The switching member of the switching valve is also moved to the vacuum cut position when the component holder head fails to pick up the electronic component.

The illustrated embodiments are adapted such that the downward movement of the component holder head is initiated before the corresponding rotary plate is stopped at the component sucking and mounting positions, and such that the rotary movement of the rotary plate is initiated before the head reaches its upper stroke end after the sucking or mounting of the electronic component. Thus, the rotary movement and the vertical movement of the head take place contemporaneously, whereby the required time of movement of each head corresponding to the angular spacing pitch of the heads can be reduced, with a result of improving the component mounting efficiency. However, the contemporaneous rotary and vertical movements of the head is not essential. Namely, the head may be moved down only after the rotary plate has been brought to the component sucking and mounting positions, and the rotary plate may be rotated only after the head has been moved to its upper stroke end.

In the third embodiment of FIGS. 25–32, each rotary plate is stopped at three stop positions, and the points of time at which the three rotary plates corresponding to the three stop positions are stopped at these three stop positions differ from each other by a time lenqth equal to one third of the required time of movement of the rotary plates corresponding to the angular spacing pitch of the rotary plates, so that the posivive and negative values of the load torque of the three concave globoidal cams are at least partially offset by each other. In the third embodiment in which each rotary plate is stopped at the three position, the above-indicated time length (time difference of the above-indicated points of time) is determined to be equal to one third of the required time of rotary movement of each rotary plate corresponding to the angular spacing pitch of the rotary plates. However, the above-indicated time length (time difference) may be equal to one fourth of the required time of rotary movement corresponding to the angular spacing pitch of the rotary plates, if each rotary plate is stopped at four stop position. Namely, the time difference decreases with an increase in the number of the stop positions. As the time difference decreases, the effect of offset of the positive and negative load torque values of the concave globoidal cams or main drive servomotor is increased.

In the first embodiment of FIGS. 1–12, the rotary plates 70 are supported by the stationary shaft 66 which is not rotated. However, the stationary shaft 66 may be replaced by a rotary shaft which is rotated with the rotary plates 70. In this case, the rotary shaft is rotated by the main drive servomotor provided for rotating the concave globoidal cams. The rotary shaft has a vacuum passage which is connected to the vacuum source through a conduit and a rotary joint, and is connected through hoses to vacuum switching devices corresponding to the rotary plates.

In the first embodiment, the rotary valve provided on the stationary shaft 66 for connecting the vacuum passage in the stationary shaft 66 to the switching devices 178 is driven by an exclusive drive source. However, the rotary valve may be rotated with one of the rotary plates.

For avoiding an interference between the adjacent rotary plastes, it is possible to reduce the thickness of the inner end portions of the rotary plates as viewed in the radial direction of the stationary shaft 66.

In the illustrated embodiments, the vacuum switching devices for applying the vacuum pressure to the suction nozzles of the component holder heads are rotated with the component holder heads. However, the switching devices may be provided on a stationary member. The switching devices are connected to the suction nozzles of the respective component holder heads through suitable passages, rotary valve and hoses, as described above.

The device for obtaining the image of the electronic component held by the component holder head during continuous movement of the component from the component sucking position to the component mounting position as described above may be provided in an electronic component mounting system including an electronic component transferring apparatus as disclosed in the publications JP-A-6-77693 and JP-A-6-45787 referred to above in the Discussion of the Related Art. In the electronic component transferring apparatus of this system, a plurality of component holder heads are disposed at a predetermined angular interval on a rotary table which is continuously rotated at a constant velocity, and the heads that should be stopped at the predetermined stop positions such as the component sucking and mounting positions are rotated about the axis of the rotary table at the same velocity in the direction opposite to the direction of rotation of the rotary table, so that those heads are virtually stopped at the stop positions. The image taking device indicated above is effective to reduce the required number of the stop positions of the heads.

It is further noted that the present invention is not limited to an electronic component mounting system adapted to transfer electronic components and mount them on a workpiece such as printed-circuit boards, and that the principle of the present invention is also applicable to an electronic component transferring apparatus adapted to simply transfer electronic components from a given device to another device.

It is also noted that the present invention may be embodied with various other combinations of the elements in the illustrated embodiments.

It is to be understood that the present invention may be embodied with various other changes, modifications and improvements, which may occur to those skilled in the art, in the light of the foregoing teachings, without departing from the scope of the invention defined in the following claims.

What is claimed is:

1. An electronic component transferring device for transferring electronic components, comprising:

a plurality of rotary members all of which are rotatable about a common axis independently of each other such that each one of said rotary members does not take, at any timing, a same angular phase as an angular phase being taken by any other rotary member of said rotary members;

a rotary motion generating device for generating rotary motions of said rotary members about said common axis over a full 360° angular range such that each of said rotary members is stopped at each of at least one predetermined stop position during one full rotation thereof over said full 360° angular range and such that said rotary members sequentially reach said each stop position at a predetermined time interval; and a plurality of component holder heads which are carried by said rotary members, respectively, and which hold the respective electronic components, said rotary motion generating device comprising a drive source, a plurality of cam followers corresponding to said plurality of rotary members, respectively, at least one rotary cam each of which is rotated by said drive source to sequentially engage, and move, said plurality of cam followers and thereby rotate said rotary members about said common axis, said each rotary cam including at least one rotating portion which engages and moves the cam follower corresponding to said each rotary member and thereby rotates said each rotary member, and at least one stopping portion which engages the cam follower corresponding to said each rotary member and thereby stops said each rotary member at said each stop position.

2. An electronic component transferring device according to claim 1, wherein said rotary motion generating device includes:

a constant-velocity rotor rotated at a constant velocity about said common axis; and an engaging device including an engaging member which is provided on one of said constant-velocity rotor and said each rotary member and which is engageable with an other of said constant-velocity rotor and said each rotary member.

3. An electronic component transferring device according to claim 2, wherein said at least one rotary cam includes at least one concave globoidal cam each having an outer circumferential surface which is defined by a locus which is described by a circular arc having a center at said common axis when said circular arc is rotated about an axis which is perpendicular to said common axis and which is positioned relative to said circular arc and said common axis such that said circular arc is interposed between said axis and said common axis.

4. An electronic component transferring device according to claim 2, wherein said engaging member of said engaging device comprises a plurality of engaging pins provided on said constant-velocity rotor such that said engaging pins are movable in a direction parallel to said common axis, said engaging pins being engageable with said rotary members, respectively, said rotary motion generating device further including:

a stationary engaging cam having a cylindrical surface whose circumference has a center at said common axis, said cylindrical surface having a cam portion whose position in a direction parallel to said common axis gradually varies; and a plurality of engaging cam followers which engage said cam groove of said stationary engaging cam and which are movable with said plurality of engaging pins, respectively, between a first position in which each of said engaging cam followers is in engagement with a corresponding one of said rotary members, and a second position in which said each engaging cam follower is disengaged from said corresponding rotary member.

5. An electronic component transferring device according to claim 1, wherein said at least one predetermined stop position consists of a plurality of predetermined stop positions, said at least one rotary cam being formed such that the rotary members corresponding to said plurality of predetermined stop positions are stopped at said predetermined stop positions at different times.

6. An electronic component transferring device according to claim 4, wherein said at least one rotary cam is formed so as to cause a time difference of said different times, which difference at least partially offset positive and negative values of a load torque which acts on each of said at least one rotary cam due to deceleration and acceleration of said rotary members before and after each of said predetermined stop positions.

7. An electronic component transferring device according to claim 6, wherein said at least one rotary cam is formed such that said time difference permits said positive and negative values of said load torque of said each rotary cam to be offset to a maximum extent.

8. An electronic component transferring device according to claim 6, wherein said at least one rotary cam consists of a plurality of rotary cams rotated by said single drive source, said plurality of rotary cams causing each of said rotary members to stop at said plurality of predetermined stop positions, respectively, said rotary cams being formed such that said different times at which said rotary members are stopped at said stop positions differ from each other by a predetermined time length which is determined to at least partially offset said positive and negative values of said load torque of said plurality of rotary cams due to the deceleration and acceleration of said rotary members before and after said stop positions.

9. An electronic component transferring device according to claim 1, wherein said at least one rotary cam includes at least one concave globoidal cam each having an outer circumferential surface which is defined by a locus which is described by a circular arc having a center at said common axis when said circular arc is rotated about an axis which is perpendicular to said common axis and which is positioned relative to said circular arc and said common axis such that said circular arc is interposed between said axis and said common axis.

10. An electronic component transferring device according to claim 9, wherein said at least one concave globoidal cam consists of at least two concave globoidal cams which are disposed around said common axis such that lines of intersection of the outer circumferential surfaces of said at least two concave globoidal cams with a plane including axes of said at least two concave globoidal cams and perpendicular to said common axis cooperate to define a substantially continuous circular arc which has a center at said common axis, said at least two concave globoidal cams having respective cam grooves formed in said outer circumferential surfaces such that said cam grooves are connected to each other, each of said cam grooves having opposite side surfaces, said rotary motion generating device further including preventing means for preventing said cam followers from being placed in a released state at each joint of said cam grooves, in which released state said cam followers are not interposed between said two side surfaces of said cam grooves.

11. An electronic component transferring device according to claim 10, wherein each of said cam grooves has a wide portion and a narrow portion which is formed in a bottom surface of said wide portion and which has a smaller width, each of said cam followers including a large-diameter roller and a small-diameter roller which engage said wide and narrow portions of the cam groove corresponding to said each cam follower, said large-diameter and small-diameter rollers being rotatable coaxially with and independently of each other, said preventing means comprising said wide and narrow portions of said each cam groove, and said large-diameter and small-diameter rollers of said each cam follower.

12. An electronic component transferring device according to claim 11, wherein said wide and narrow portions of said each cam groove have center lines which are offset from each other by a predetermined distance.

13. An electronic component transferring device according to claim 10, wherein each of said cam grooves is a generally V-shaped groove having a trapezoid shape in transverse cross section, and each of said cam followers consists of a tapered roller which is tapered for engagement with said generally V-shaped groove, said preventing means comprising an arrangement that said each cam groove is said generally V-shaped groove and an arrangement that said each cam follower consists of said tapered roller.

14. An electronic component transferring device according to claim 10, wherein radially outer portions of opposite end faces of each of adjacent concave globoidal cams of said at least two concave globoidal cams have tapered surfaces which are parallel and adjacent to each other in a plane including axes of rotation of said adjacent concave globoidal cams, said tapered surfaces having generators in said plane including said axes of rotation, which generators are inclined in said plane including said axes of rotation, at selected points of said generators, with respect to a normal line perpendicular to said common axis about which said rotary members are rotated, said preventing means comprising an arrangement that said generators are inclined with respect to said normal line.

15. An electronic component transferring device according to claim 9, wherein said at least one concave globoidal cam consists of a plurality of concave globoidal cams which are disposed symmetrically with respect to said common axis such that lines of intersection of the outer circumferential surfaces of said concave globoidal cams with a plane including axes of all of said concave globoidal cams cooperate to define a substantially continuous circle which has a center at said common axis.

16. An electronic component transferring device according to claim 9, wherein said at least one concave globoidal cam consists of a plurality of concave globoidal cams each having two coaxially formed bevel gears at axially opposite ends thereof, said bevel gears of adjacent ones of said concave globoidal cams engaging each other.

17. An electronic component transferring device according to claim 1, further comprising:
    a support shaft coaxial with said common axis; and
    two arrays of bearings which are disposed on said support shaft such that said two arrays are spaced apart from each other in an axial direction of said support shaft, the bearings of each of said two arrays being arranged in said axial direction and corresponding to said plurality of rotary members,
and wherein said rotary members are provided with respective pairs of support arms supported by respective pairs of bearings each consisting of two bearings belonging to said two arrays, respectively, all of said pairs of bearings for said plurality of rotary members having a same distance in said axial direction.

18. An electronic component transferring device according to claim 1, further comprising means for holding said plurality of component holder heads on said plurality of rotary members, respectively, such that said component holder heads are given the same path of movement as said rotary members are rotated about said common axis.

19. An electronic component transferring device according to claim 18, wherein said means for holding said component holder heads on said rotary members, respectively, comprises:
    means for holding said component holder heads movably relative to said respective rotary members in a direction parallel to said common axis;
    a stationary cylindrical cam having a cylindrical surface whose circumference has a center at said common axis, said cylindrical surface having a cam groove whose position in said direction parallel to said common axis gradually varies; and
    a cam follower which is provided for each of said component holder heads and which engages said cam groove.

20. An electronic component transferring device according to claim 18, wherein said means for holding said component holder heads on said rotary members, respectively, comprises fixing means for fixing said component holder heads to said respective rotary members such that each of said component holder heads and a corresponding one of said rotary members have a predetermined relative position in which said each component holder head is rotated about said common axis when said corresponding rotary member is rotated about said common axis.

21. An electronic component transferring device according to claim 1, further comprising a head moving device for moving said component holder heads carried by said rotary members, relative to said rotary members in a direction parallel to said common axis.

22. An electronic component transferring device according to claim 21, wherein a portion of said stationary cylindrical cam which corresponds to each of said at least one predetermined stop position is constituted by a movable portion which is movable in said direction parallel to said common axis relative to the other portion of said stationary cylindrical cam, said head moving device comprising said movable portion, and a device for moving said movable portion in said direction parallel to said common axis.

23. An electronic component transferring device according to claim 22, wherein said device for moving said movable portion comprises a stroke changing device for changing a stroke of said movable portion in said direction parallel to said common axis.

24. An electronic component transferring device according to claim 1, wherein said common axis extends in a vertical direction, said electronic component transferring device further comprising a height position changing device for changing, in at least two steps, a height of each of said component holder heads at each of at least one of said at least one predetermined stop position.

25. An electronic component transferring device according to claim 24, wherein said height position changing device comprises a stationary cylindrical cam having a cylindrical surface whose circumference has a center at said common axis, and a cam follower which is provided for each of said component holder heads and which engages said stationary cylindrical cam, said cylindrical surface having a cam groove whose position in a direction parallel to said common axis gradually varies, said cam groove having opposite side surfaces defining a width thereof in said direction parallel to said common axis, said cam groove having a narrow portion, a wide portion having a larger width than said narrow portion, and a width varying portion which connect said narrow and wide portions and whose width smoothly varies from a width of said narrow portion to the width of said wide portion, said each rotary member being stopped at said at least one predetermined stop position when said cam follower is in said wide portion, said height position changing device including height position changing biasing means for biasing said cam follower selectively toward one of said opposite side surfaces of said cam groove.

26. An electronic component transferring device according to claim 25, wherein said height position changing biasing means comprises an air cylinder having a cylinder housing and a piston rod which is pneumatically movable relative to said cylinder housing between a first position for biasing said cam follower toward said one of said opposite side surfaces of said cam groove, and a second position for biasing said cam follower toward the other of said opposite side surfaces.

27. An electronic component transferring device according to claim 25, further comprising a head moving device for moving said component holder heads carried by said rotary members, relative to said rotary members in said direction parallel to said common axis, and wherein at least a part of a portion of said stationary cylindrical cam which defines said wide portion of said cam groove is constituted by a movable portion which is movable in said direction parallel to said common axis relative to the other portion of said stationary cylindrical cam, said head moving device comprising said movable portion, and a device for moving said movable portion in said direction parallel to said common axis.

28. An electronic component transferring device according to claim 1, wherein said rotary motion generating device includes a stop position changing device for changing each of at least one of said at least one predetermined stop position by selecting one of at least two positions which are spaced from each other in a direction of rotation of said rotary members about said common axis.

29. An electronic component transferring device according to claim 28, wherein said at least one rotary cam includes at least one concave globoidal cam each having an outer circumferential surface which is defined by a locus which is described by a circular arc having a center at said common axis when said circular arc is rotated about an axis which is perpendicular to said common axis and which is positioned relative to said circular arc and said common axis such that said circular arc is interposed between said axis and said common axis, each of said at least one concave globoidal cam having a cam groove formed in said outer circumferential surface, said cam groove having opposite side surfaces defining a width thereof as measured in a direction of rotation of said rotary members about said common axis, said cam groove having an inclined portion having a lead angle with respect to a plane perpendicular to an axis of said each concave globoidal cam, and a non-lead portion which does not have said lead angle, said inclined portion including a narrow portion, while said non-lead portion providing a wide portion having a larger width than said narrow portion, said cam groove further having a width varying portion which connects said narrow and wide portions and whose width smoothly varies from a width of said narrow portion to the width of the wide portion, and wherein said stop position changing device includes:
said wide portion of said cam groove of said each concave globoidal cam;
a constant-velocity rotor which is rotated at a constant velocity about said common axis;
stop position changing biasing means provided between said constant-velocity rotor and each of said rotary members, for biasing said cam follower toward one of said opposite side surfaces of said cam groove.

30. An electronic component transferring device according to claim 29, wherein said stop position changing biasing means comprises an air cylinder having a cylinder housing and a piston rod which is pneumatically movable relative to said cylinder housing between a first position for biasing said cam follower toward said one of said opposite side surfaces of said cam groove, and a second position for biasing said cam follower toward the other of said opposite side surfaces.

31. An electronic component mounting system comprising:

an electronic component transferring device comprising:
a plurality of rotary members all of which are rotatable about a common axis independently of each other such that each one of said rotary members does not take, at any timing, a same angular phase as an angular phase being taken by any other rotary member of said rotary members,
a rotary motion generating device for generating rotary motions of said rotary members about said common axis over 360° angular range such that each of said rotary members is stopped at each of at least two predetermined stop positions during one full rotation thereof over said full 360° angular range and such that said rotary members sequentially reach said each stop position at a predetermined time interval, and
a plurality of component holder heads which are carried by said rotary members, respectively, and which hold the respective electronic components,
said rotary motion generating device comprising
a drive source,
a plurality of cam followers corresponding to said plurality of rotary members, respectively,
at least one rotary cam each of which is rotated by said drive source to sequentially engage, and move, said plurality of cam followers and thereby rotate said rotary members about said common axis, said each rotary cam including at least one rotating portion which engages and moves the cam follower corresponding to said each rotary member and thereby rotates said each rotary member, and at least one stopping portion which engages the cam follower corresponding to said each rotary member and thereby stops said each rotary member at said each stop position;
an electronic component supply device disposed at one of said at least two stop positions, for supplying said component holder heads with said electronic components; and
a workpiece supporting and positioning device disposed at another of said at least two stop positions, for supporting and positioning a workpiece on which said electronic components are mounted by said component holder heads.

32. An electronic component mounting system according to claim 31, further comprising an image taking device disposed between said electronic component supply device and said workpiece supporting and positioning device, as viewed in a direction of movement of said component holder heads, said image taking device being operated to take an image of each of said electronic components between said electronic component supply device and said workpiece supporting and positioning device.

33. An electronic component mounting system according to claim 32, wherein said image taking device includes a high-speed camera provided with a stroboscope.

34. An electronic component transferring device according to claim 32, wherein said image taking device includes a line sensor having an array of image taking elements arranged in a radial direction of a circle which has a center at said common axis.

35. A method of transferring electronic components, comprising:

holding said electronic components on respective component holder heads which are carried by a plurality of rotary members, respectively; and rotating at least one rotary cam to sequentially engage, and move, a plurality of cam followers corresponding to said plurality of rotary members, respectively, and thereby rotate said rotary members about a common axis over a full 360° angular range such that each one of said rotary members does not take, at any timing, a same angular phase as an angular phase being taken by any other rotary member of said rotary members, such that each of said rotary members is stopped at each of at least one predetermined stop position during one full rotation thereof over said full 360° angular range and such that said rotary members sequentially reach said each stop position at a predetermined time interval, each of said at least one rotary cam including at least one rotating portion which engages and moves the cam follower corresponding to said each rotary member and thereby rotates said each rotary member, and at least one stopping portion which engages the cam follower corresponding to said each rotary member and thereby stops said each rotary member at said each stop position.

36. A method according to claim 35, wherein said rotating at least one rotary cam comprises activating a single drive source to rotate said at least one rotary cam which is formed such that the rotary members corresponding to a plurality of predetermined stop positions as said at least one predetermined stop position are stopped at said predetermined stop positions at different times.

37. A method according to claim 36, wherein said different times at which said rotary members are stopped at said predetermined stop positions differ from each other by a predetermined time length which is determined to at least partially offset positive and negative values of a load torque which act on each of said at least one rotary cam due to the deceleration and acceleration of said rotary members before and after each of said predetermined stop positions.

38. A method according to claim 37, wherein said predetermined time length is determined such that a maximum value of the load torque of the drive source is smaller than a maximum value of the load torque due to deceleration and acceleration of each rotary member before and after each stop position.

39. A method according to claim 35, wherein said at least one rotary cam includes at least one concave globoidal cam each having an outer circumferential surface which is defined by a locus which is described by a circular arc having a center at said common axis when said circular arc is rotated about an axis which is perpendicular to said common axis and which is positioned relative to said circular arc and said common axis such that said circular arc is interposed between said axis and said common axis.

40. A method according to claim 39, wherein said rotating at least one rotary cam is effected by using at least two concave globoidal cams which are disposed around said common axis such that lines of intersection of the outer circumferential surfaces of said at least two concave globoidal cams with a plane including said common axis cooperate to define a substantially continuous circular arc which has a center at said common axis, said at least two concave globoidal cams having respective cam grooves formed in said outer circumferential surfaces such that said cam grooves are connected to each other, said method further comprising preventing said cam followers from being placed in a released state at each joint of said cam grooves, in which released state said cam followers are not interposed between opposite side surfaces of said cam grooves.

41. A method according to claim 35, further comprising controlling a position of each of said component holder heads in a direction parallel to said common axis as said rotary members are rotated about said common axis.

42. A method according to claim 35, wherein said component holder heads and said electronic components held by said component holder heads are moved in a direction parallel to said common axis while said rotary members are rotated about said common axis.

43. A method according to claim 35, wherein at least one of said at least one predetermined stop position is changed in at least two steps during transfer of said electronic components.

44. A method according to claim 35, wherein a position of said component holder heads in a direction parallel to said common axis at each of at least one of said at least one predetermined stop position is changed in at least two steps during transfer of said electronic components.

45. A method of mounting electronic components on a workpiece, comprising:

supplying said electronic components to respective component holder heads carried by a plurality of rotary members, respectively, at a component supply position;

holding said electronic components on said component holder heads, respectively;

rotating at least one rotary cam to sequentially engage, and move, a plurality of cam followers corresponding to said plurality of rotary members, respectively, and thereby rotate said rotary members about a common axis over a full 360° angular range such that each one of said rotary members does not take, at any timing, a same angular phase as an angular phase being taken by any other rotary member of said rotary members, such that each of said rotary members is stopped at each of at least two predetermined stop positions during one full rotation thereof over said full 360° angular range and such that said rotary members sequentially reach said each stop position at a predetermined time interval, and such that at least one of said component holder heads and at least one of said electronic components which is held by said at least one of the component holder heads are in the process of rotation about said common axis while another of said component holder heads and the electronic component held thereby are stopped at one of said at least two predetermined stop positions, said at least two predetermined stop positions including said component supply position and a component mounting position at which said electronic components are mounted by said component holder heads, each of said at least one rotary cam including at least one rotating portion which engages and moves the cam follower corresponding to said each rotary member and thereby rotates said each rotary member, and at least one stopping portion which engages the cam follower corresponding to said each rotary member and thereby stops said each rotary member at said each stop position;

supporting and positioning said workpiece such that said electronic components are mounted by said component holder heads; and mounting said electronic components on said workpiece at said component mounting position.

46. A method according to claim 45, further comprising:

obtaining an image of each of said electronic components while the corresponding component holder head is on the way from said component supply position to said component mounting position.

47. A method according to claim 46, wherein said obtaining an image is effected while said corresponding component holder head is continuously rotated between said component supply and mounting positions.

48. A method according to claim 46, wherein said obtaining an image is effected while said corresponding component holder head is stopped at an image taking position between said component supply and mounting positions.

49. An electronic component transferring device for transferring electronic components, comprising:

a support shaft;

a plurality of rotary members which are directly supported by said support shaft such that all of said rotary members are rotatable about said support shaft independently of each other such that each one of said rotary members does not take, at any timing, a same angular phase as an angular phase being taken by any other rotary member of said rotary members;

a rotary motion generating device for generating rotary motions of said rotary members about said support shaft over 360° angular range such that each of said rotary members is stopped at each of at least one predetermined stop position during one full rotation thereof over said full 360° angular range and such that said rotary members sequentially reach said each stop position at a predetermined time interval; and a plurality of component holder heads which are carried by said rotary members, respectively, and which hold the respective electronic components.

50. An electronic component transferring device according to claim 49, wherein said plurality of rotary members directly supported by said support shaft comprise:

two arrays of bearings which are disposed on said support shaft such that said two arrays are spaced apart from each other in an axial direction of said support shaft, the bearings of each of said two arrays being arranged in said axial direction; and respective pairs of support arms which are supported by respective pairs of bearings each consisting of two bearings belonging to said two arrays, respectively, all of said pairs of support arms having a same distance in said axial direction, each of said rotary members comprising a corresponding one pair of support arms of said respective pairs of support arms and a corresponding pair of bearings of said respective pairs of bearings.

51. An electronic component mounting system comprising:

an electronic component transferring device comprising:

a support shaft, a plurality of rotary members which are directly supported by said support shaft such that all of said rotary members are rotatable about said support shaft independently of each other such that each one of said rotary members does not take, at any timing, a same angular phase as an angular phase being taken by any other rotary member of said rotary members, a rotary motion generating device for generating rotary motions of said rotary members about said support shaft over 360° angular range such that each of said rotary members is stopped at each of at least two predetermined stop positions during one full rotation thereof over said full 360° angular range and such that said rotary members sequentially reach said each stop position at a predetermined time interval, and a plurality of component holder heads which are carried by said rotary members, respectively, and which hold the respective electronic components;

an electronic component supply device disposed at one of said at least two stop positions, for supplying said component holder heads with said electronic components; and a workpiece supporting and positioning device disposed at another of said at least two stop positions, for supporting and positioning a workpiece on which said electronic components are mounted by said component holder heads.

52. An electronic component mounting system according to claim 51, wherein said plurality of rotary members directly supported by said support shaft comprise:

two arrays of bearings which are disposed on said support shaft such that said two arrays are spaced part from each other in an axial direction of said support shaft, the bearings of each of said two arrays being arranged in said axial direction; and respective pairs of support arms which are supported by respective pairs of bearings each consisting of two bearings belonging to said two arrays, respectively, all of said pairs of support arms having a same distance in said axial direction, each of said rotary members comprising a corresponding one pair of support arms of said respective pairs of support arms and a corresponding pair of bearings of said respective pairs of bearings.

* * * * *